(12) United States Patent
Pflumm et al.

(10) Patent No.: US 9,434,877 B2
(45) Date of Patent: Sep. 6, 2016

(54) ORGANIC ELECTROLUMINESCENT DEVICE

(75) Inventors: Christof Pflumm, Darmstadt (DE); Frank Voges, Bad Duerkheim (DE); Rémi Manouk Anémian, Seoul (KR)

(73) Assignee: Merck Patent GmbH, Darmstadt (DE)

( * ) Notice: Subject to any disclaimer, the term of this patent is extended or adjusted under 35 U.S.C. 154(b) by 983 days.

(21) Appl. No.: 13/582,572

(22) PCT Filed: Feb. 3, 2011

(86) PCT No.: PCT/EP2011/000500
§ 371 (c)(1),
(2), (4) Date: Sep. 4, 2012

(87) PCT Pub. No.: WO2011/110262
PCT Pub. Date: Sep. 15, 2011

(65) Prior Publication Data
US 2012/0326141 A1    Dec. 27, 2012

(30) Foreign Application Priority Data

Mar. 6, 2010   (DE) .......................... 10 2010 010 481

(51) Int. Cl.
| | |
|---|---|
| *H01L 51/50* | (2006.01) |
| *C09K 11/06* | (2006.01) |
| *H05B 33/22* | (2006.01) |
| *C09B 57/00* | (2006.01) |
| *C09B 57/10* | (2006.01) |
| *H01L 51/00* | (2006.01) |

(52) U.S. Cl.
CPC .............. *C09K 11/06* (2013.01); *C09B 57/00* (2013.01); *C09B 57/007* (2013.01); *C09B 57/008* (2013.01); *C09B 57/10* (2013.01); *H01L 51/5004* (2013.01); *H01L 51/5052* (2013.01); *H05B 33/22* (2013.01); *H01L 51/0059* (2013.01)

(58) Field of Classification Search
None
See application file for complete search history.

(56) References Cited

U.S. PATENT DOCUMENTS

| | | | | |
|---|---|---|---|---|
| 5,804,322 | A * | 9/1998 | Shi et al. ...................... | 428/690 |
| 7,422,799 | B2 | 9/2008 | Mishima et al. | |
| 2002/0086180 | A1 | 7/2002 | Seo et al. | |
| 2004/0170863 | A1* | 9/2004 | Kim et al. .................... | 428/690 |
| 2004/0262614 | A1 | 12/2004 | Hack et al. | |
| 2005/0227110 | A1 | 10/2005 | Lee et al. | |
| 2006/0181202 | A1 | 8/2006 | Liao et al. | |
| 2008/0007164 | A1 | 1/2008 | Suzuki et al. | |

(Continued)

FOREIGN PATENT DOCUMENTS

| | | |
|---|---|---|
| CN | 101101974 A | 1/2008 |
| CN | 101241942 A | 8/2008 |
| CN | 101510586 A | 8/2009 |

(Continued)

OTHER PUBLICATIONS

International Search Report for PCT/EP2011/000500 mailed Jun. 21, 2011.

(Continued)

*Primary Examiner* — Gregory Clark
(74) *Attorney, Agent, or Firm* — Drinker Biddle & Reath LLP

(57) ABSTRACT

The present invention relates to organic electro-luminescent devices which in a hole transport layer have a mixture of two or more materials.

19 Claims, 3 Drawing Sheets

| |
|---|
| 1 |
| 2 |
| 3 |
| 4 |
| 5 |

(56) References Cited

U.S. PATENT DOCUMENTS

2008/0286610 A1    11/2008   Deaton et al.
2009/0200918 A1    8/2009   Seo et al.

FOREIGN PATENT DOCUMENTS

| | | |
|---|---|---|
| EP | 0774883 A2 | 5/1997 |
| EP | 1876658 A2 | 1/2008 |
| EP | 2151878 A1 | 2/2010 |
| JP | 2002313583 A | 10/2002 |
| JP | 2005-294249 A | 10/2005 |
| JP | 2006-032599 A | 2/2006 |
| JP | 2006-278918 A | 10/2006 |
| JP | 2008-263155 A | 10/2008 |
| JP | 2009-516390 A | 4/2009 |
| JP | 2009-218581 A | 9/2009 |
| WO | WO-2007/059024 A1 | 5/2007 |

OTHER PUBLICATIONS

Japanese Office Action dated Jul. 21, 2015 for Japanese Application No. 2012-556394.

* cited by examiner a)

200 µm b)

ORGANIC ELECTROLUMINESCENT DEVICE

CROSS-REFERENCE TO RELATED APPLICATIONS

This application is a national stage application (under 35 U.S.C. §371) of PCT/EP2011/000500, filed Feb. 3, 2011, which claims benefit of German application 10 2010 010 481.7, filed Mar. 6, 2010.

BACKGROUND OF THE INVENTION

The present invention relates to organic electroluminescent devices which comprises a mixture of at least two materials, one of which is a hole-transport material, in at least one hole-transport layer.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. However, there continues to be a need for improvement, in particular with respect to the efficiency and lifetime. A further problem for which there is still a need for improvement is the so-called "roll-off" behaviour. This is taken to mean that the efficiency of an organic electroluminescent device is usually significantly lower at high luminous density than at low luminous density. Thus, very high efficiency is obtained at very low luminous densities, while only low efficiency is obtained at high luminous densities, in particular in the case of phosphorescent OLEDs. The very high efficiency at low luminous density is therefore undesired since this is accompanied by problems in the addressing of the OLED. By contrast, a higher efficiency at high luminous density would result in higher power efficiency and thus in lower energy consumption of the OLED. Further improvements in the roll-off behaviour are therefore desirable.

Furthermore, there is still a need for improvement in the processability of the materials. Thus, there are in some cases problems that the hole-transport materials in particular crystallise, for example on the shadow mask, during application, which makes device production significantly more difficult. This is particularly problematic, in particular, during application of the hole-transport layer, since these layers are usually very thick, meaning that a lot of material is used here. Crystallisation of the materials thus has particularly adverse effects here.

The technical problem on which the present invention is based is therefore the provision of an organic electroluminescent device which exhibits higher power efficiency and/or a longer lifetime and/or an improved roll-off behaviour and/or which has an improvement in the processing of the layers during production.

BRIEF SUMMARY OF THE INVENTION

Surprisingly, it has been found that an organic electroluminescent device which comprises a mixture of at least two materials whose HOMO are at least 0.15 eV apart and at least one of which is a hole-transport material in at least one hole-transport layer exhibits significant improvements with respect to the efficiency and/or lifetime and/or roll-off behaviour and/or processability during device production.

A hole-transport layer in the sense of the present invention is taken to mean a layer which is arranged between the emitting layer or the emitting layers, if a plurality of emitting layers are present, and the anode.

The invention thus relates to an organic electroluminescent device comprising anode, cathode, at least one emitting layer and at least one hole-transport layer, which is arranged between the anode and the emitting layer, where the hole-transport layer comprises a mixture of a material HTM-1 and a material HTM-2, characterised in that the HOMO of HTM-1 is at least 0.15 eV higher than the HOMO of HTM-2.

Neither material HTM-1 nor material HTM-2 here is a metal complex.

A BRIEF DESCRIPTION OF THE FIGURES

A DETAILED DESCRIPTION OF THE INVENTION

Figure 1:
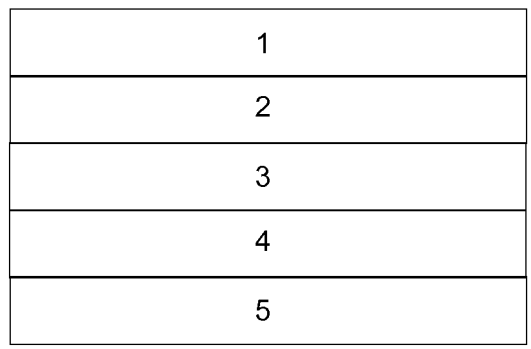
FIG. 1 depicts a hole-transport layer according to the invention is directly adjacent to the emitting layer.

Furthermore, the materials in the emitting layer and in the hole-transport layer according to the invention are not all identical. This means that not all materials in these two layers are identical and are only present in a different mixing ratio and that the emitting layer and the hole-transport layer must differ in at least one material.

The HOMO (highest occupied molecular orbital) is determined here using a general method, as explained in detail below in the example part.

The layer according to the invention is referred to above and below as hole-transport layer. However, it goes without saying that this layer may also have further properties, for example electron-blocking or exciton-blocking properties, or may also be a hole-injection layer. Irrespective of possible further functions, each layer which is arranged between the emitting layer and the anode is referred to as hole-transport layer in the sense of this invention. This layer may be directly adjacent to the emitting layer and/or to the anode, or one or more further hole-transport layers may be located in between.

The organic electroluminescent device according to the invention comprises, as described above, anode, cathode, at least one emitting layer and at least one hole-transport layer, which are arranged between the anode and the cathode. The organic electroluminescent device need not necessarily comprise only layers which are built up from organic or organometallic materials. Thus, it is also possible for anode, cathode and/or one or more layers to comprise inorganic materials or to be built up entirely from inorganic materials.

The emitting layer here may comprise phosphorescent and/or fluorescent compounds.

A phosphorescent compound in the sense of this invention, as may be present in a phosphorescent emitter layer of the electroluminescent device according to the invention, is a compound which exhibits luminescence from an excited state having relatively high spin multiplicity, i.e. a spin state>1, in particular from an excited triplet state, at room temperature. For the purposes of this invention, all luminescent transition-metal complexes and all luminescent lanthanide complexes, in particular all luminescent iridium, platinum and copper compounds, are to be regarded as phosphorescent compounds.

A fluorescent compound in the sense of this invention, as may be present in a fluorescent emitter layer of the electroluminescent device according to the invention, is a compound which exhibits luminescence from an excited singlet state at room temperature. For the purposes of this invention, all luminescent compounds which are built up only from the elements C, H, D, N, O, S, F, B and P are, in particular, to be taken to be fluorescent compounds.

In a preferred embodiment of the invention, the HOMO of HTM-1 is at least 0.25 eV higher than the HOMO of HTM-2. The HOMO of HTM-1 is particularly preferably at least 0.3 eV higher than the HOMO of HTM-2.

In a further preferred embodiment of the invention, the LUMO of HTM-1 and HTM-2 is >−2.6 eV, particularly preferably >−2.5 eV, very particularly preferably >−2.4 eV, in particular >−2.3 eV.

It is also possible for further materials, in particular further hole-transport materials, to be present in the hole-transport layer according to the invention apart from materials HTM-1 and HTM-2. Thus, the hole-transport layer according to the invention may, for example, also consist of a mixture of three, four, five or more different materials. However, it is preferred for the hole-transport layer according to the invention to consist only of the two materials HTM-1 and HTM-2.

The mixing ratio of HTM-1 to HTM-2 can vary over broad ranges and is dependent on the precise structure of the respective materials. The device properties can be optimised through the precise setting of the mixing ratio. In a preferred embodiment of the invention, the mixing ratio of HTM-1 to HTM-2 is between 95:5 and 5:95, in each case based on the volume. The mixing ratio of HTM-1 to HTM-2 is particularly preferably between 90:10 and 20:80, very particularly preferably between 85:15 and 40:60.

In a preferred embodiment of the invention, the hole-transport layer according to the invention is directly adjacent to the emitting layer. It is particularly preferred here for the organic electroluminescent device also to comprise one or more further hole-transport layers, which are arranged on the anode side of the hole-transport layer according to the invention. A structure of this type is depicted diagrammatically in FIG. 1. Layer 1 here stands for the anode, layer 2 stands for one or more hole-transport layers, layer 3 stands for the hole-transport layer according to the invention comprising HTM-1 and HTM-2, layer 4 stands for the emitting layer and layer 5 stands for the cathode.

The layer thickness of the hole-transport layer according to the invention comprising HTM-1 and HTM-2 in this device structure is preferably between 5 and 300 nm, particularly preferably between 7 and 220 nm, very particularly preferably between 10 and 150 nm.

In a further preferred embodiment of the invention, the hole-transport layer according to the invention is not directly adjacent to the emitting layer, but instead is located between two further hole-transport layers. A structure of this type is depicted diagrammatically in FIG. 2. Layer 1 here stands for the anode, layer 2 stands for one or more hole-transport layers, layer 3 stands for the hole-transport layer according to the invention comprising HTM-1 and HTM-2, layer 4 stands for one or more further hole-transport layers, layer 5 stands for the emitting layer and layer 6 stands for the cathode.

The layer thickness of the hole-transport layer according to the invention comprising HTM-1 and HTM-2 in this device structure is preferably between 5 and 300 nm, particularly preferably between 7 and 220 nm, very particularly preferably between 10 and 150 nm.

Figure 2:
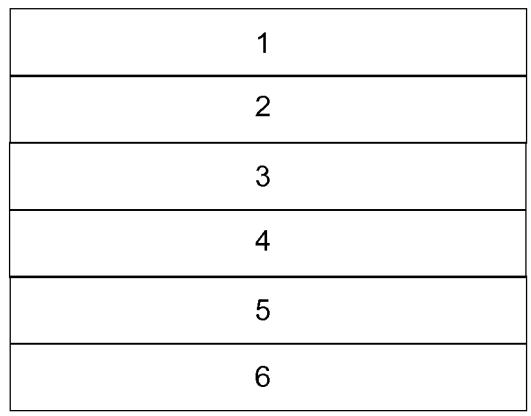
FIG. 2 depicts a hole-transport layer according to the invention is not directly adjacent to the emitting layer, but instead is located between two further hole-transport layers

The electroluminescent devices here, as depicted diagrammatically in FIGS. 1 and 2, may also comprise further layers, which are not depicted here.

It should furthermore be emphasised that the hole-transport layer according to the invention is not a layer in which a hole-transport material is doped with a p-dopant. The effect according to the invention on roll-off behaviour cannot be achieved in this way by a hole-transport layer in which a hole-transport material is doped with a p-dopant. The improvement in the processability is also not achieved to the extent using p-dopants, since these are usually only employed in a dopant concentration of up to about 1%.

A p-dopant is a material which undergoes a redox reaction with the hole-transport material, with the hole-transport material being oxidised and the p-dopant being reduced. In order to act as p-dopant, the LUMO of the p-dopant must thus be lower than the HOMO of the hole-transport material.

In a preferred embodiment of the invention, the LUMO of HTM-2 is therefore higher than the HOMO of HTM-1. The LUMO of HTM-2 is particularly preferably at least 0.1 eV higher than the HOMO of HTM-1.

If the layer according to the invention is directly adjacent to the emitting layer, it is possible for it also to act as electron-blocking layer or as exciton-blocking layer in addition to as hole-transport layer. In particular, the electron-blocking action is preferred for fluorescent and phosphorescent electroluminescent devices. The exciton-blocking action makes particular demands of the materials, in particular for phosphorescent electroluminescent devices.

In order to act as electron-blocking layer, the LUMO both of HTM-1 and also of HTM-2 should be at least 0.2 eV higher than the LUMO of the matrix in the emitting layer. If two or more matrix materials are used in the emitting layer, the LUMO both of HTM-1 and also of HTM-2 should be at least 0.2 eV higher than the LUMO of the matrix components in the emitting layer which has the lowest LUMO.

In order to act as exciton-blocking layer in a phosphorescent electroluminescent device, the triplet level both of HTM-1 and also of HTM-2 should be at most 0.3 eV lower than the triplet level of the emitter in the emitting layer. In a preferred embodiment of the invention, the triplet level of HTM-1 and of HTM-2 is at most 0.2 eV lower than the triplet level of the emitter in the emitting layer, particularly preferably at most 0.1 eV.

The precise structure of materials HTM-1 and HTM-2 is of secondary importance so long as the materials fulfil the above-mentioned conditions with respect to the physical parameters. In general, all materials as are usually used as hole-transport materials can be used.

It is preferred here for HTM-1 to be a material as is usually used as hole-transport material. Other materials which are usually not used as hole-transport materials can also be used for material HTM-2.

In a preferred embodiment of the invention, the HOMO of HTM-1 is preferably >−5.4 eV, particularly preferably >−5.3 eV, very particularly preferably >−5.2 eV. The HOMO of HTM-1 is furthermore preferably <−4.8 eV.

The preferred HOMO of HTM-2 arises correspondingly from the HOMO of HTM-1 and the above-defined difference.

In a preferred embodiment of the invention, material HTM-1 is a triarylamine derivative, a carbazole derivative or a condensed carbazole derivative. A triarylamine derivative in the sense of this application is taken to mean a compound in which three aromatic or heteroaromatic groups are bonded to a nitrogen. It is also possible here for the compound to contain more than one amino group or for the aromatic groups to be connected to one another, for example by carbon bridges or direct bonds. A carbazole derivative in the sense of this application is taken to mean a carbazole or an azacarbazole which preferably contains an aromatic or heteroaromatic group bonded to the nitrogen and which may also be substituted. A condensed carbazole derivative in the sense of this invention is taken to mean a carbazole or azacarbazole onto which at least one further aromatic and/or non-aromatic ring is condensed. Thus, for example, an indolocarbazole or indenocarbazole is formed. It is furthermore possible for an aromatic or heteroaromatic substituent on the nitrogen of the carbazole to be connected to the carbazole skeleton by a single bond or a bridge, for example a carbon bridge.

Preferred triarylamine derivatives are the compounds of the following formulae (1) to (7),

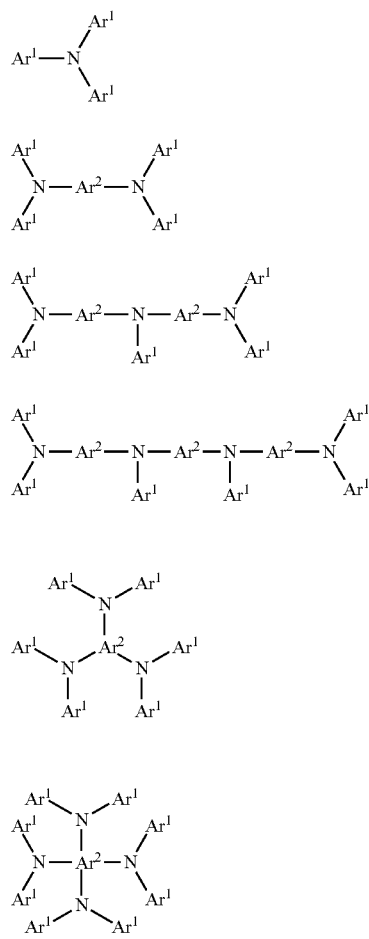

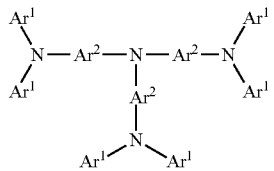

where the following applies to the symbols used:

Ar$^1$ is on each occurrence, identically or differently, a monovalent aromatic or heteroaromatic ring system having 5 to 60 aromatic ring atoms, which may be substituted by one or more radicals R$^1$; two groups Ar$^1$ here which are bonded to the same nitrogen atom, and/or a group Ar$^2$ and a group Ar$^1$ which are bonded to the same nitrogen atom may be linked to one another by a single bond or a bridge selected from the group consisting of B(R$^1$), C(R$^1$)$_2$, Si(R$^1$)$_2$, C=O, C=NR$^1$, C=C(R$^1$)$_2$, O, S, S=O, SO$_2$, N(R$^1$), P(R$^1$) and P(=O)R$^1$;

Ar$^2$ is on each occurrence, identically or differently, a divalent, trivalent or tetravalent aromatic or heteroaromatic ring system having 5 to 60 aromatic ring atoms, which may be substituted by one or more radicals R$^1$;

R$^1$ is on each occurrence, identically or differently, H, D, F, Cl, Br, I, CHO, C(=O)Ar$^3$, P(=O)(Ar$^3$)$_2$, S(=O)Ar$^3$, S(=O)$_2$Ar$^3$, CR$^2$=CR$^2$Ar$^3$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R$^2$, where one or more non-adjacent CH$_2$ groups may be replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by D, F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 60 aromatic ring atoms, which may be substituted by one or more radicals R$^2$, or a combination of these systems; two or more adjacent substituents R$^1$ here may also form a mono- or polycyclic, aliphatic or aromatic ring system with one another;

Ar$^3$ is on each occurrence, identically or differently, an aromatic or heteroaromatic ring system having 5 to 40 aromatic ring atoms, which may be substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents R$^2$ here may also form a mono- or polycyclic, aliphatic or aromatic ring system with one another.

If two groups Ar$^1$ or one group Ar$^2$ and one group Ar$^1$, which are in each case bonded to the same nitrogen atom, are linked to one another by a single bond, a carbazole derivative thereby forms.

Ar$^2$ here is a divalent group in the compounds of the formulae (2), (3), (4) and (7) and a trivalent group in the compounds of the formula (5) and a tetravalent group in the compounds of the formula (6).

Preferred carbazole derivatives are the compounds of the following formulae (8) to (11),

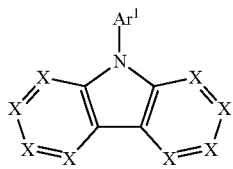
formula (8)

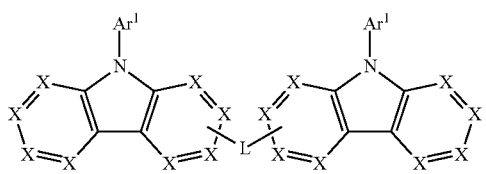
formula (9)

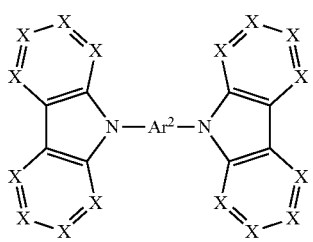
formula (10)

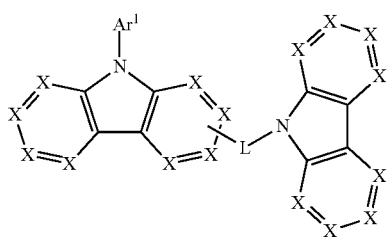
formula (11)

where $Ar^1$, $Ar^2$ and $R^1$ have the meanings mentioned above, and furthermore:

L is a single bond or a divalent group selected from an alkylene group having 1 to 10 C atoms or an alkenylene or alkynylene group having 2 to 10 C atoms, each of which may be substituted by one or more radicals $R^1$, an aromatic or heteroaromatic ring system having 5 to 30 aromatic ring atoms, which may in each case be substituted by one or more radicals $R^1$, C=O, O, S or $NR^1$ or a combination of 2, 3, 4 or 5 of these groups;

X is on each occurrence, identically or differently, $CR^1$ or N, with the proviso that a maximum of two symbols X per ring stand for N and that X stands for C if a group L is bonded to this group X;

two adjacent groups X here may also be replaced by a group of the following formula (12):

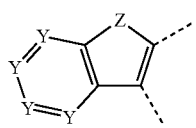
formula (12)

the dashed bonds here indicate the linking of this unit to the carbazole derivative, i.e. the two carbon atoms which are linked to the dashed bonds in formula (12) correspond to the two adjacent groups X of the carbazole; furthermore:

Y is on each occurrence, identically or differently, $CR^1$ or N, with the proviso that a maximum of two symbols Y per ring stand for N;

Z is selected on each occurrence, identically or differently, from the group consisting of $C(R^1)_2$, $N(R^1)$, $N(Ar^1)$, O, S, $B(R^1)$, $Si(R^1)_2$, C=O, C=$NR^1$, C=$C(R^1)_2$, S=O, $SO_2$, $CR^1$—$CR^1$, $P(R^1)$ and P(=O)$R^1$.

The linking of the two carbazole groups in formula (9) preferably takes place via the 2,2'-, the 3,3' or the 2,3'-positions, and the linking of the carbazole group in formula (11) preferably takes place via the 2- or 3-position.

Materials which are furthermore preferred are compounds which contain both at least one arylamino group and also at least one carbazole group or at least one carbazole derivative. These are preferably compounds of the following formulae (13), (14) and (15),

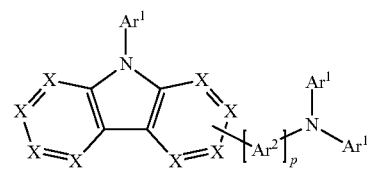
formula (13)

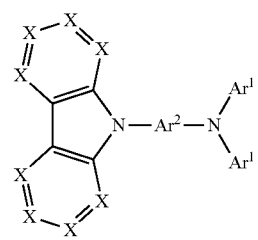
formula (14)

formula (15)
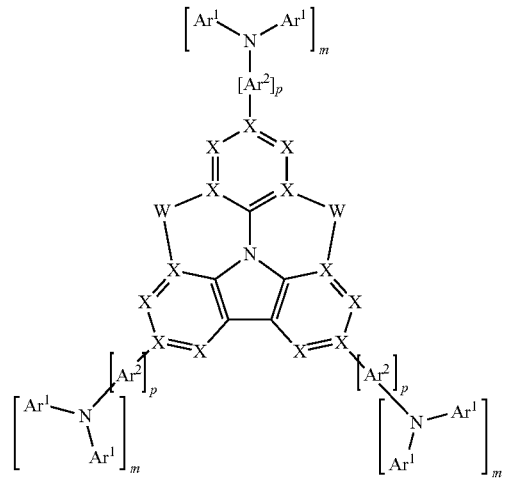

where the symbols used have the meanings mentioned above, and furthermore:

W is, identically or differently on each occurrence, a single bond, $C(R^1)_2$, $NR^1$, O or S, where a maximum of one group W stands for a single bond;

n is, identically or differently on each occurrence, 0 or 1, where at least one index n stands for 1;

m is, identically or differently on each occurrence, 0 or 1, where at least one index m stands for 1;

p is, identically or differently on each occurrence, 0, 1 or 2; furthermore, X stands for C if a group $N(Ar^1)_2$ or a group $Ar^2$ or a group W is bonded to this group X.

The linking of the carbazole group to Ar² in formula (13) preferably takes place via the 2- or 3-position.

An aryl group in the sense of this invention contains at least 6 C atoms; a heteroaryl group in the sense of this invention contains at least 2 C atoms and at least 1 heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which a plurality of aryl or heteroaryl groups may also be interrupted by a short non-aromatic unit (preferably less than 10% of the atoms other than H), such as, for example, a C, N, O or S atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems in the sense of this invention. Likewise, an aromatic or heteroaromatic ring system is taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo-[2.2.2]octyl, 2-(2,6-dimethyl)octyl, 2-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl and cyclooctenyl. A $C_2$- to $C_{40}$-alkynyl group is preferably taken to mean ethynyl, propynyl, butynyl, pentynyl, hexynyl, heptynyl and octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and which may be linked to the aromatic or heteroaromatic group via any desired positions, is taken to mean, in particular, groups derived from benzene, naphthalene, anthracene, phenanthrene, benzanthracene, benzophenanthrene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preferred groups Ar¹ are selected from the group consisting of phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 1- or 2-(4-methylnaphthyl), 1- or 2-(4-phenylnaphthyl), 1- or 2-(4-naphthylnaphthyl), 1-, 2- or 3-(4-naphthylphenyl), indenofluorene, indenocarbazole, indolocarbazole, 2- or 3-thienyl or 2-, 3- or 4-pyridyl and combinations of one or more of these groups. These groups may each also be substituted by one or more radicals R¹.

These substituents are also suitable as substituents on diazasilols and tetraazasilols.

Preferred groups Ar² are selected from the group consisting of o-, m- or p-phenylene, 1,4- or 2,6-naphthylene, 2,2'-, 3,3'- or 4,4'-biphenyl, 2,2"-, 3,3"- or 4,4"-o-terphenyl, 2,2"-, 3,3"- or 4,4"-m-terphenyl, 2,2"-, 3,3"- or 4,4"-p-terphenyl, p-, m,p-, o,p-, m,m-, o,m- or o,o-quaterphenyl, quinquephenyl, sexiphenyl, 2,7-fluorenyl, 2,7- or 2,2'-spiro-9,9'-bifluorenyl or 2,7-(9,10-dihydro)phenanthrenyl, each of which may be substituted by one or more radicals R¹. R¹ here is preferably methyl or phenyl, The groups Ar¹ and Ar² may be substituted by one or more radicals R¹. These radicals R¹ are preferably selected, identically or differently on each occurrence, from the group consisting of H, D, F, a straight-chain alkyl group having 1 to 4 C atoms or a branched or cyclic alkyl group having 3 to 5 C atoms, each of which may be substituted by one or more radicals R², where one or more H atoms may be replaced by D or F, or an aromatic ring system having 6 to 24 aromatic ring atoms, which may be substituted by one or more radicals R², or a combination of these systems; two or more adjacent substituents R¹ here may also form a mono- or polycyclic, aliphatic or aromatic ring system with one another. If the organic electroluminescent device is applied from solution, straight-chain, branched or cyclic alkyl groups having up to 10 C atoms are also preferred as substituents R¹. The radicals R¹ are particularly preferably selected, identically or differently on each occurrence, from the group consisting of H, D or an aromatic ring system having 6 to 24 aromatic ring atoms, which may be substituted by one or more radicals R², but is preferably unsubstituted.

In particular if the group Ar¹ or Ar² contains a fluorene or a corresponding condensed derivative, such as, for example, fluorene, indenofluorene or indenocarbazole, the radical R¹ on the respective bridges C(R¹)₂ preferably stands for an alkyl group having 1 to 10 C atoms or an aromatic or heteroaromatic ring system having 5 to 24 aromatic ring atoms. R¹ here is particularly preferably methyl or phenyl, If the hole-transport layer according to the invention is directly adjacent to a phosphorescent emitting layer, it is preferred for Ar¹, Ar², R¹ and R² to contain no condensed aryl groups having more than 10 aromatic ring atoms, particularly preferably no condensed aryl groups at all.

Examples of suitable materials HTM-1 of the formulae (1) to (11) and (13) to (15) mentioned above are the following structures.

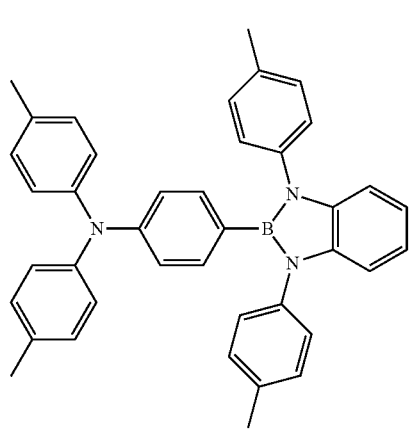

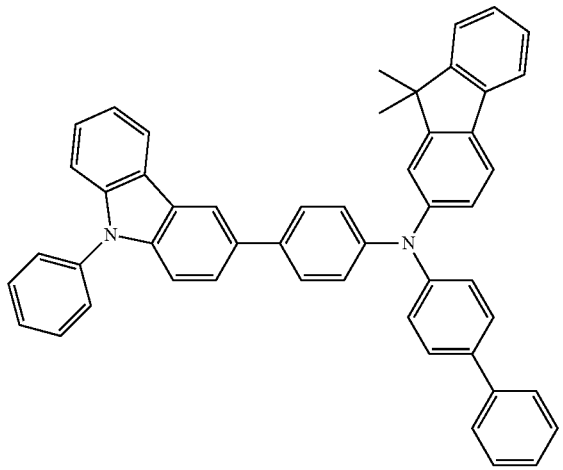

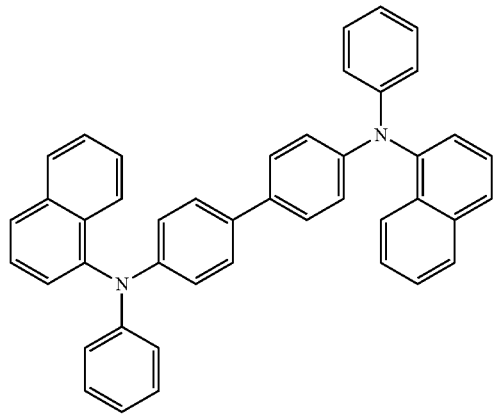

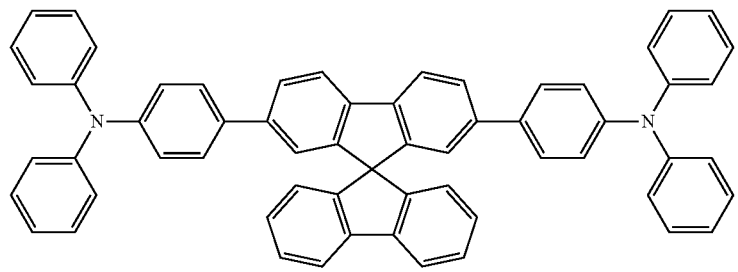

-continued
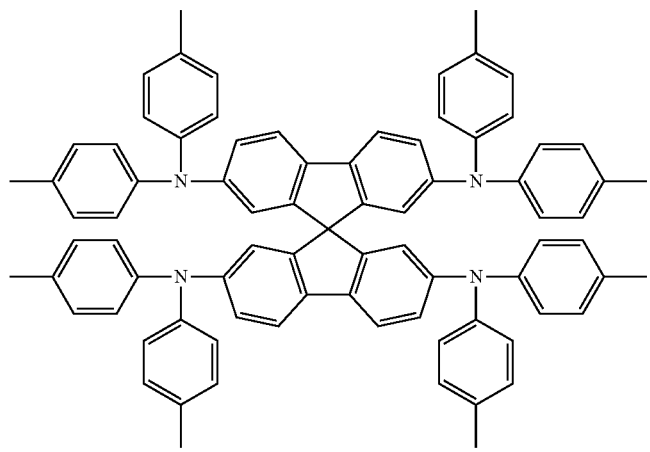
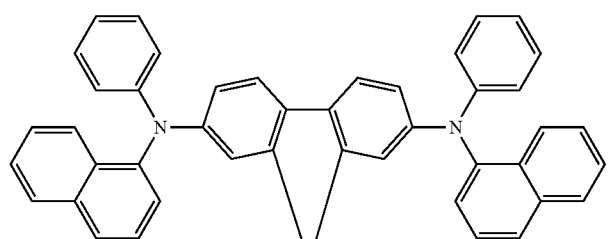
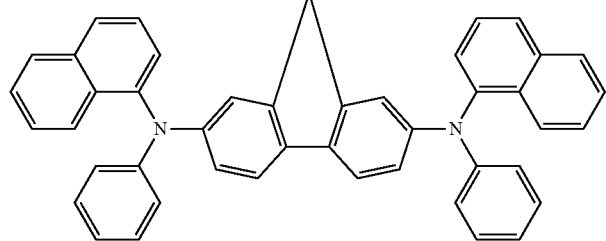
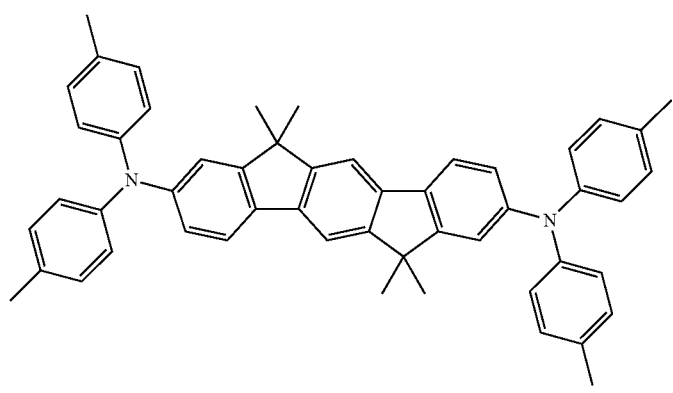
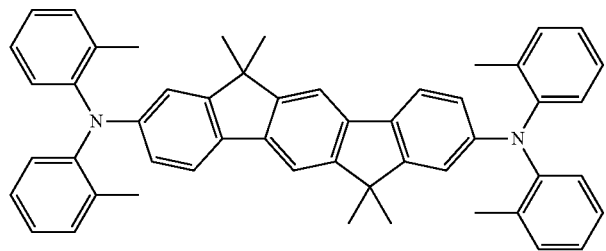

-continued
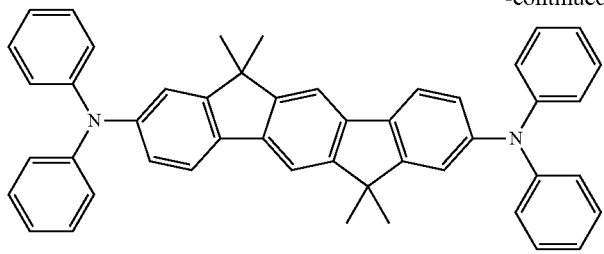
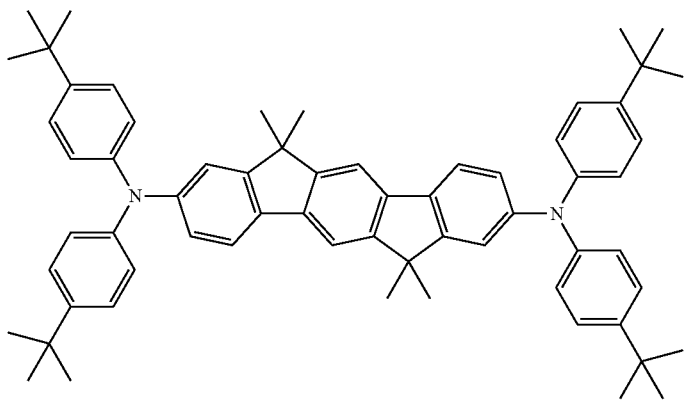
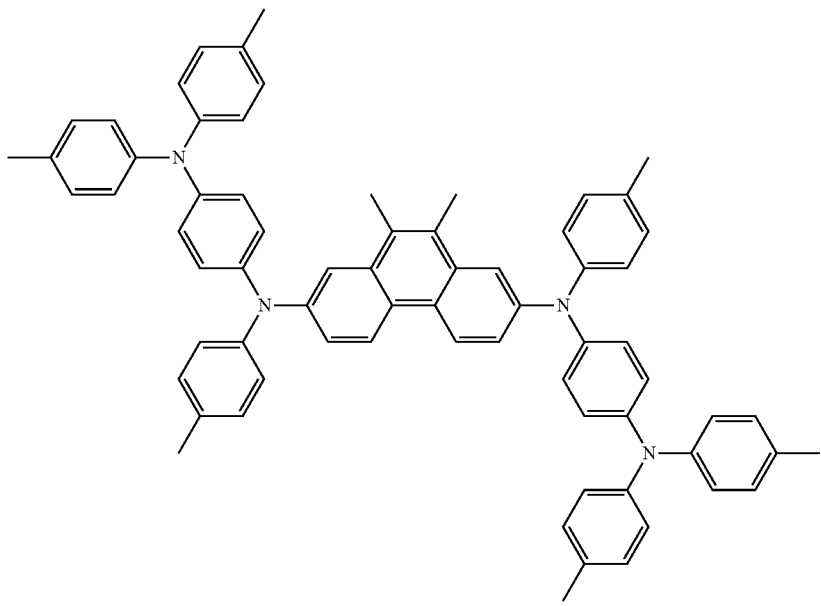
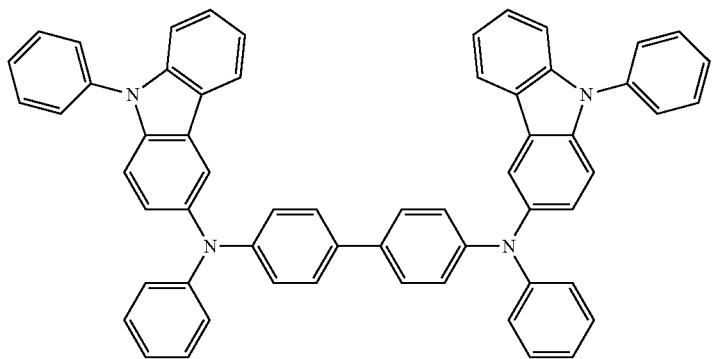

-continued
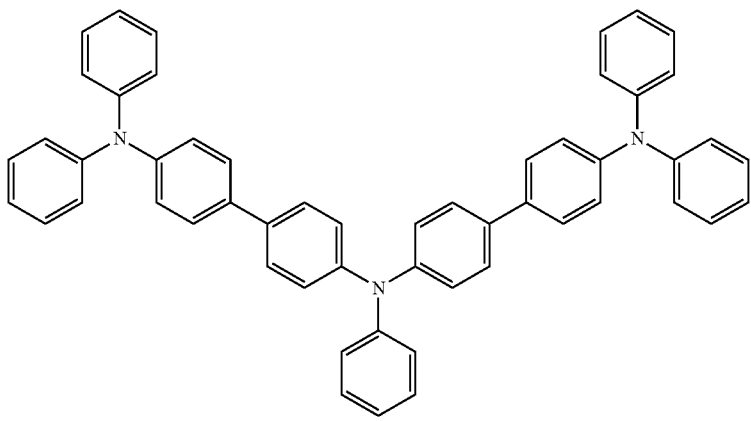
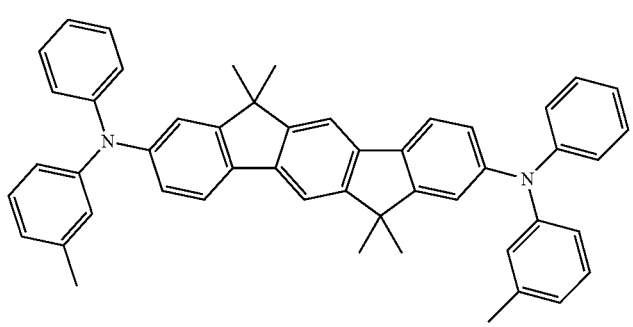
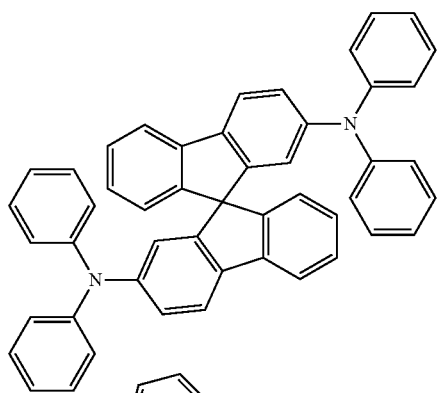
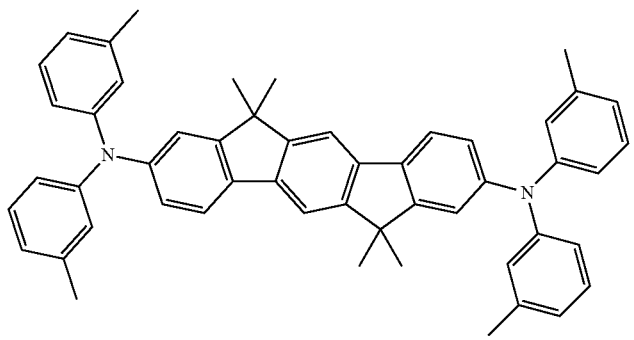
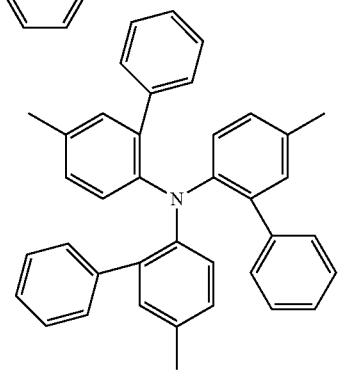
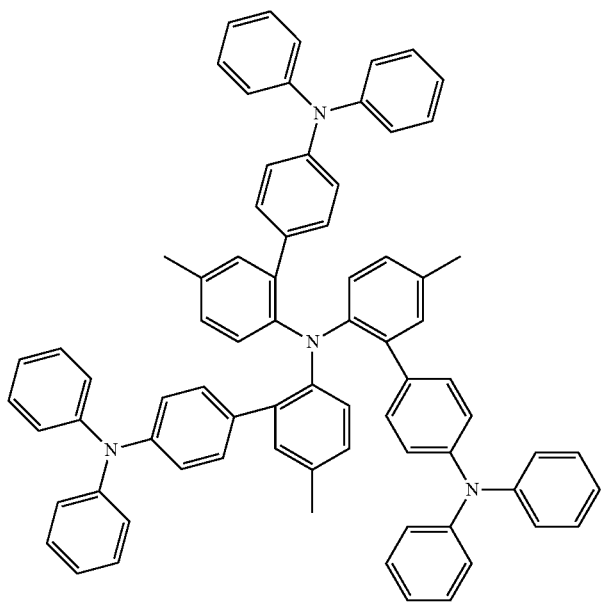

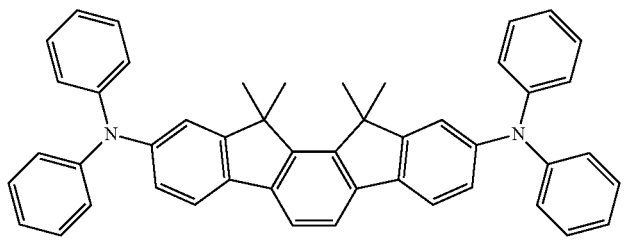
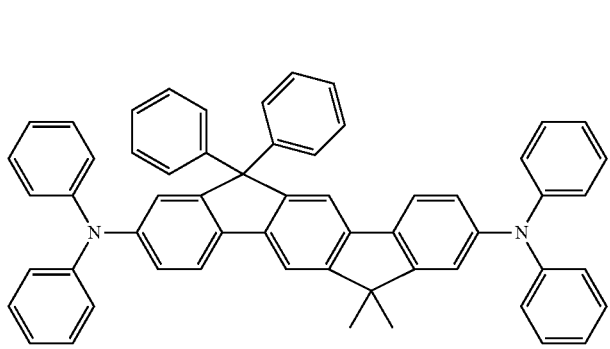
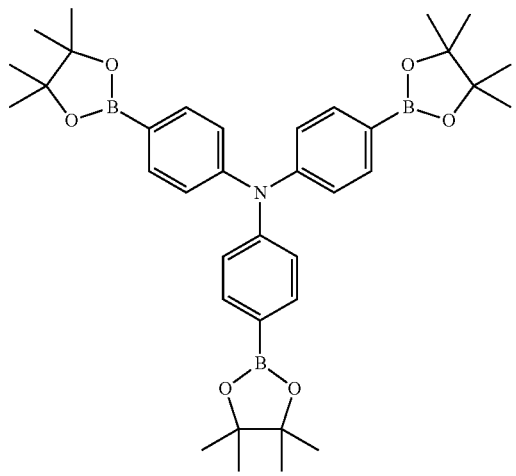
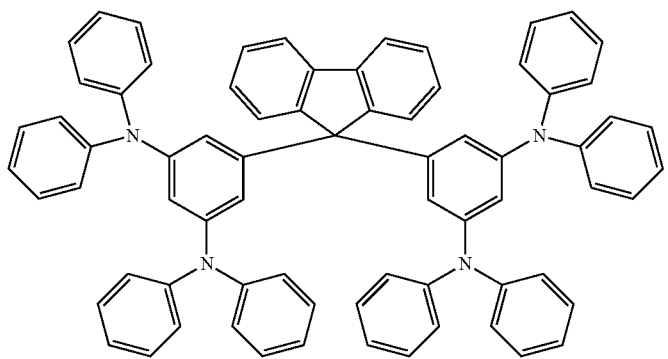
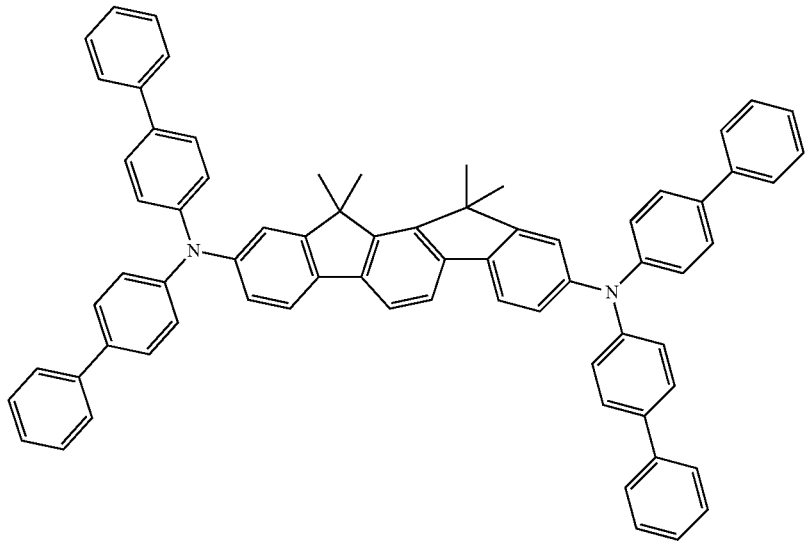

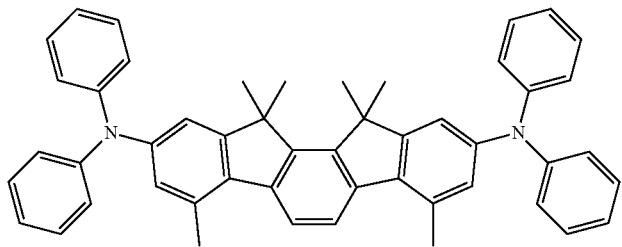
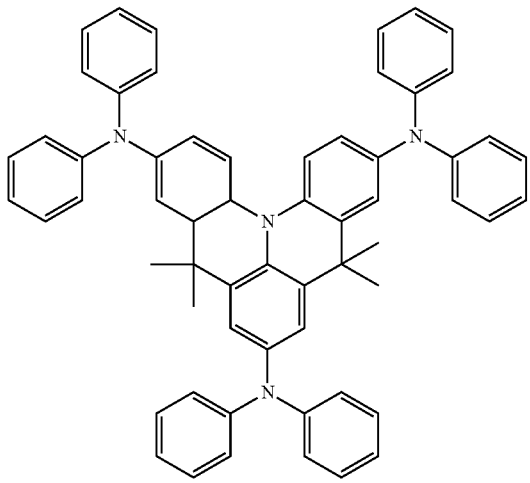
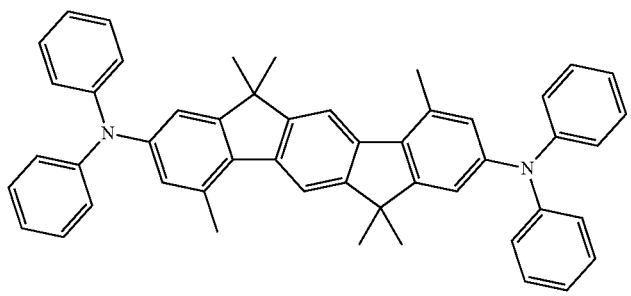
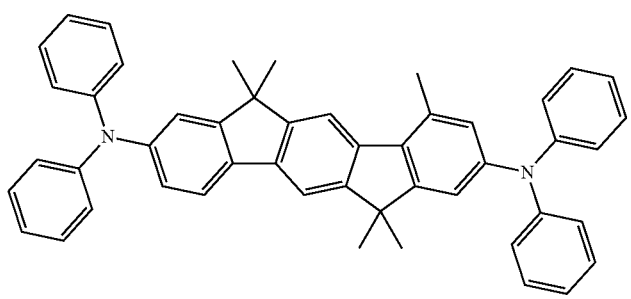
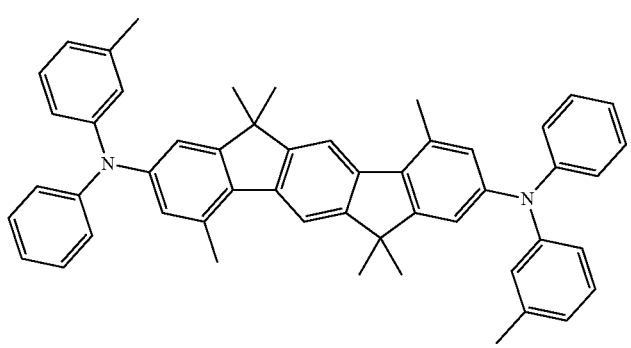

-continued
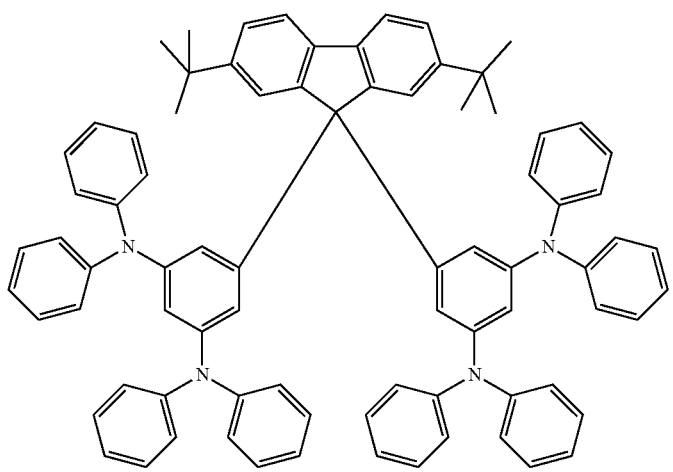
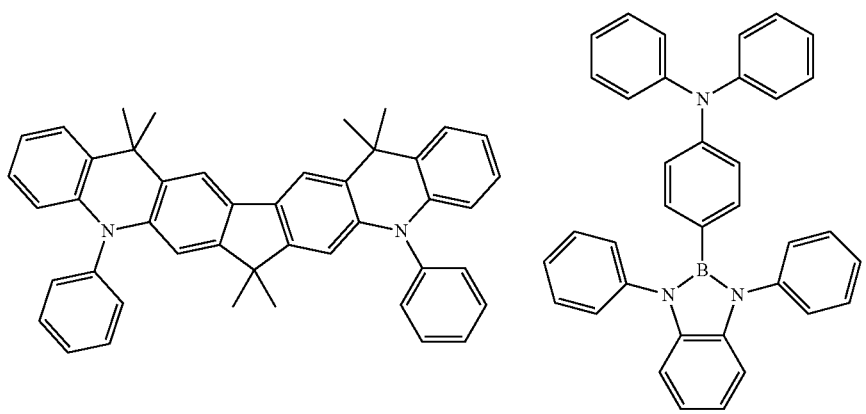
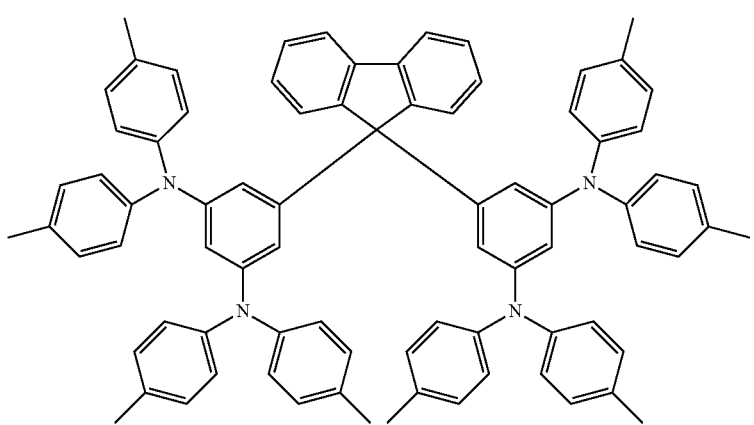
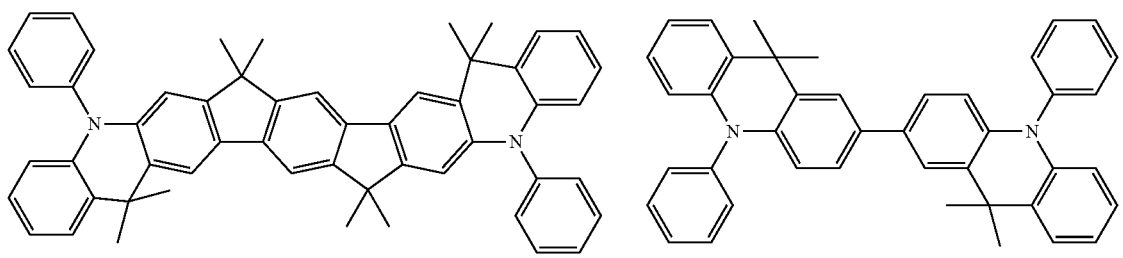

-continued
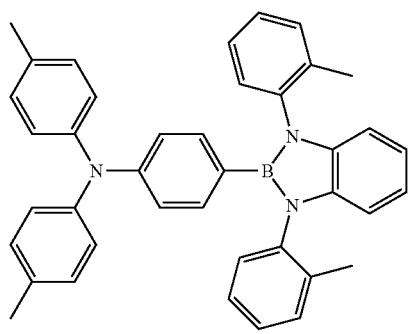
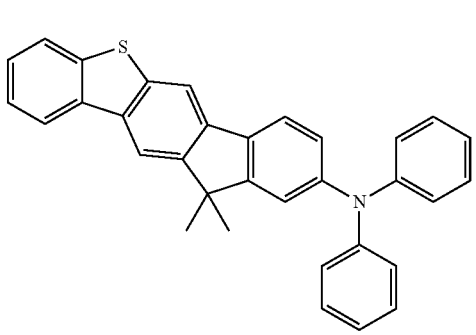
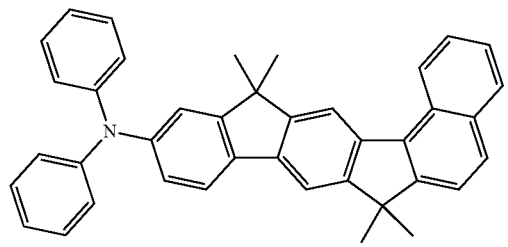
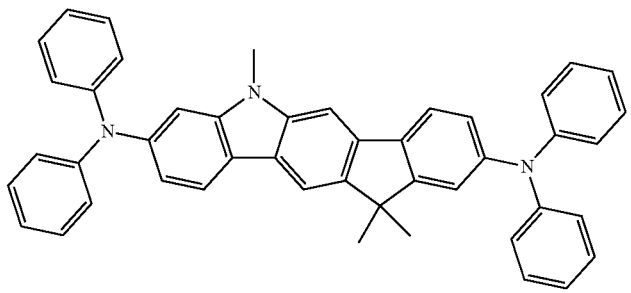
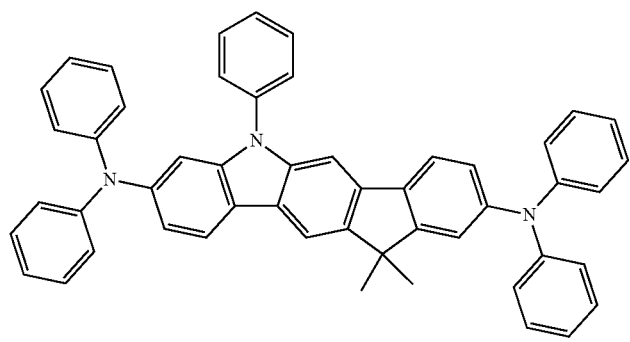
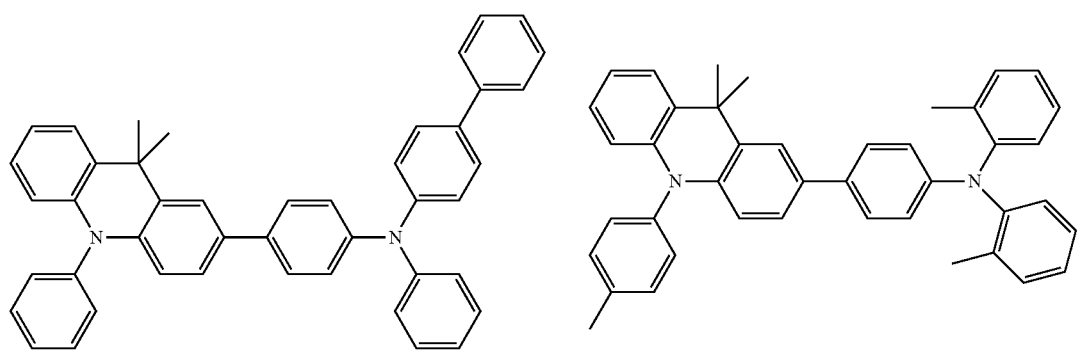
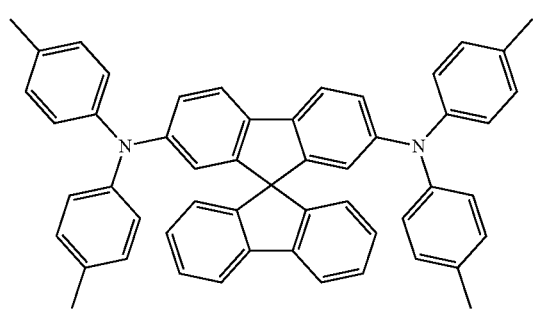

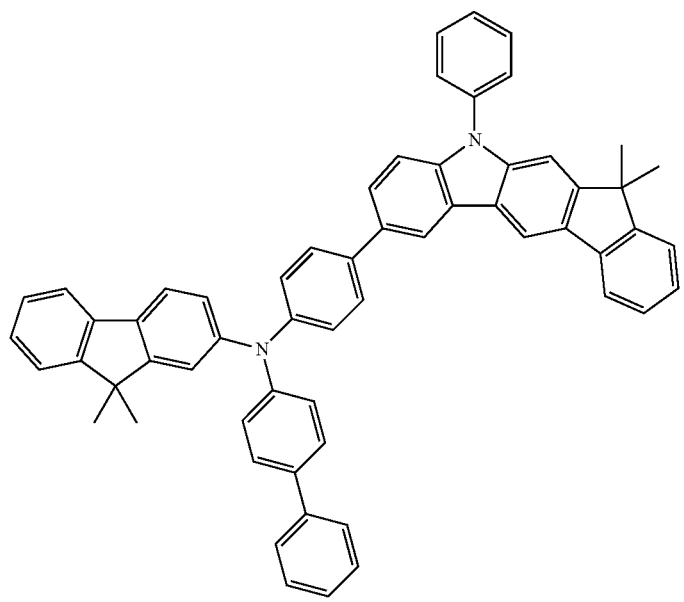
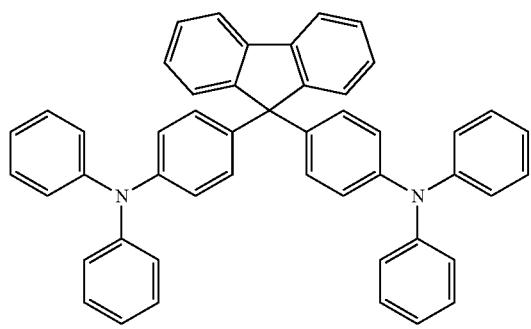
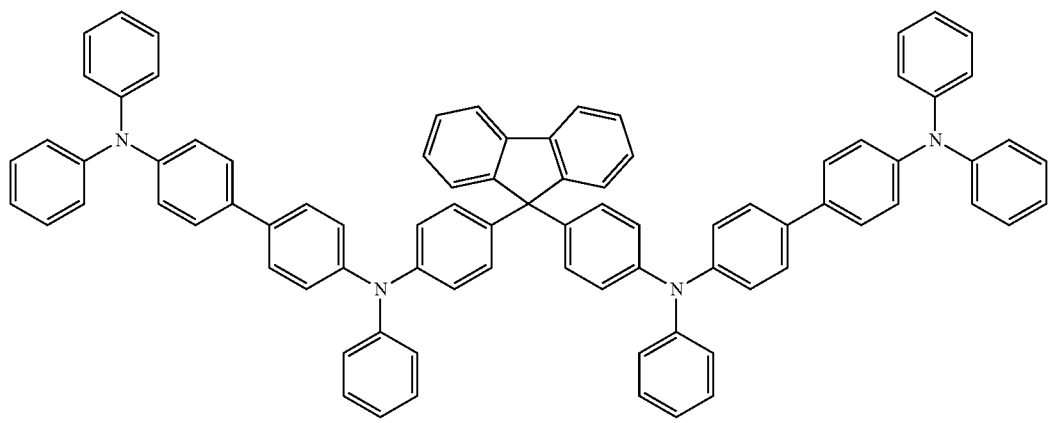

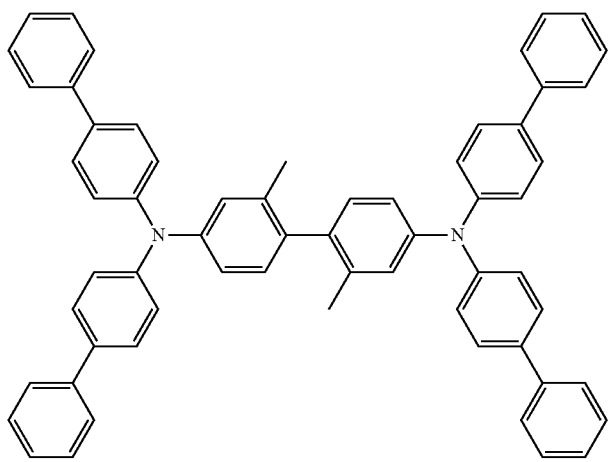
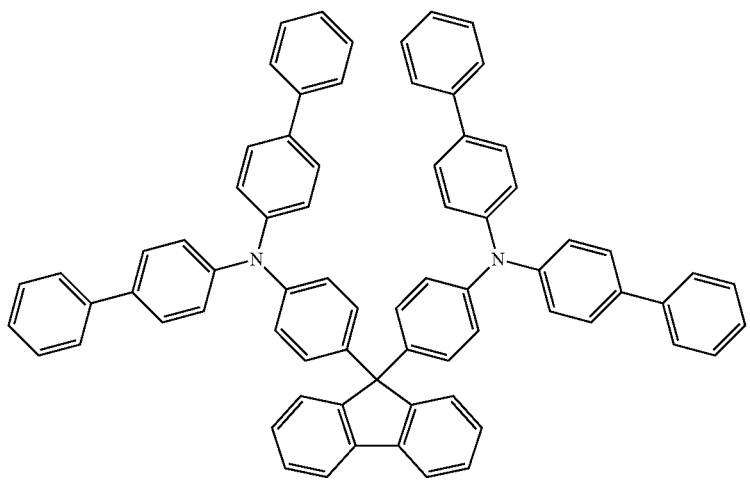
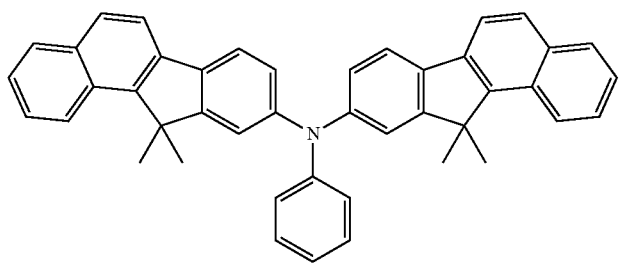
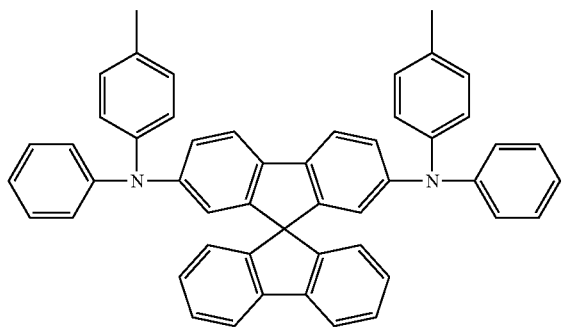

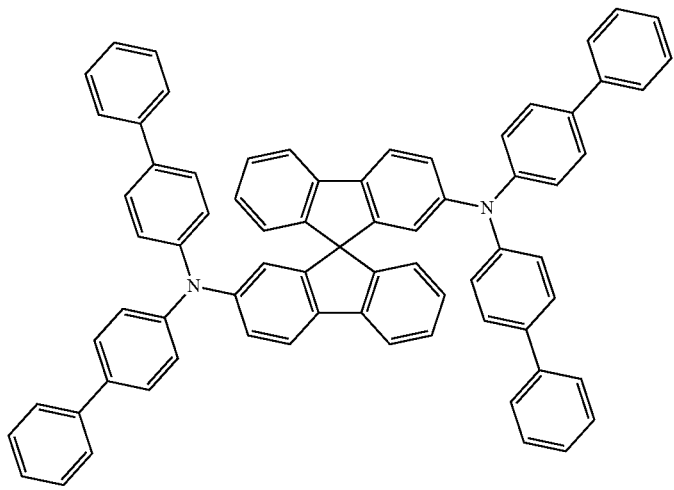
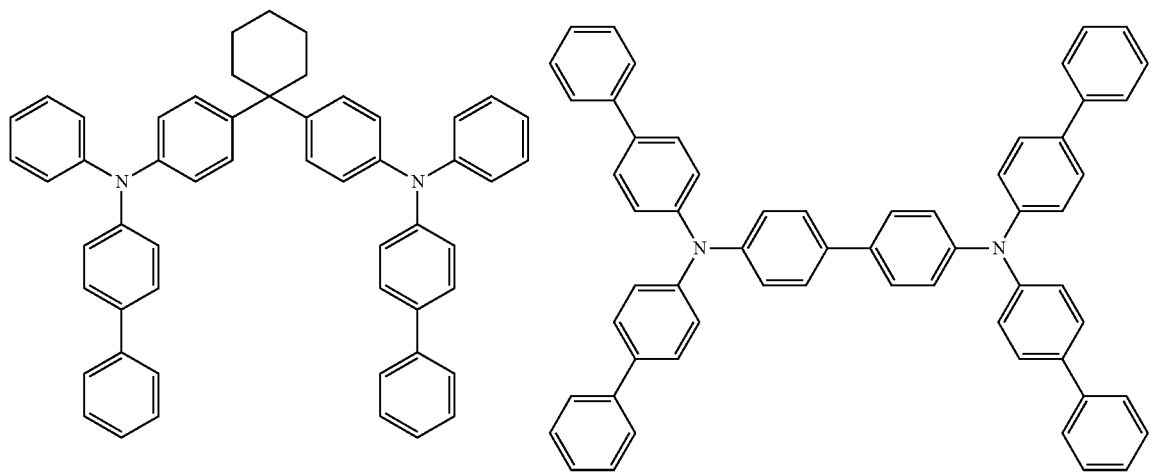
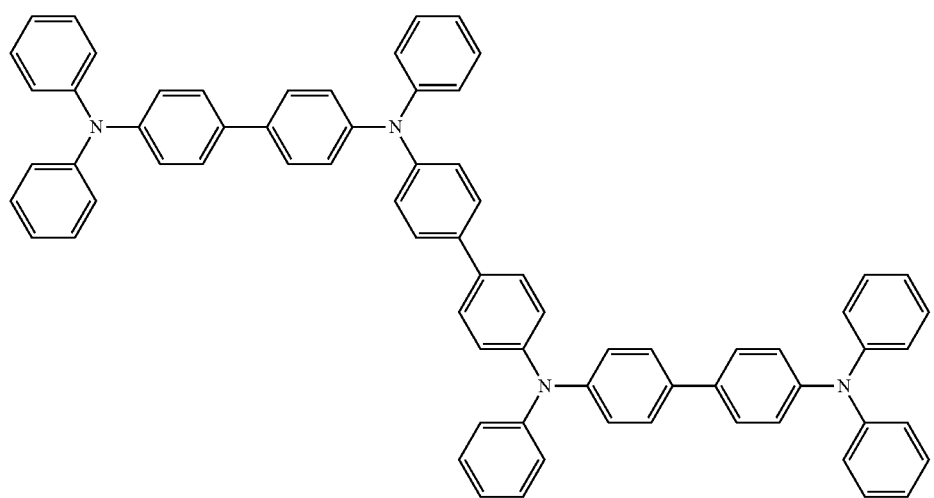

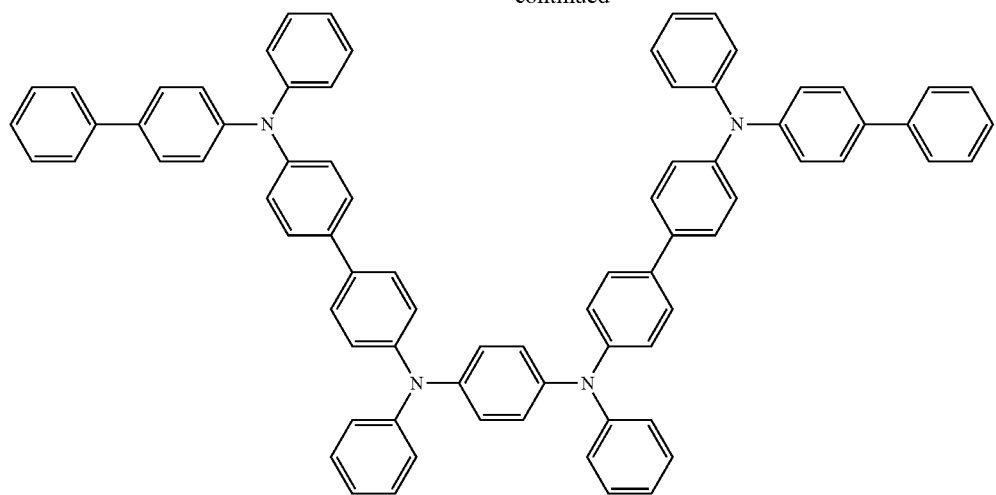
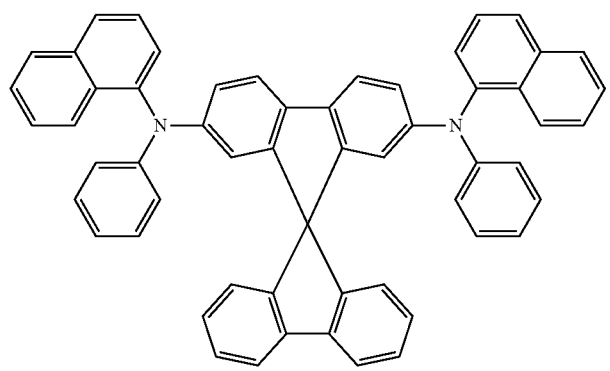
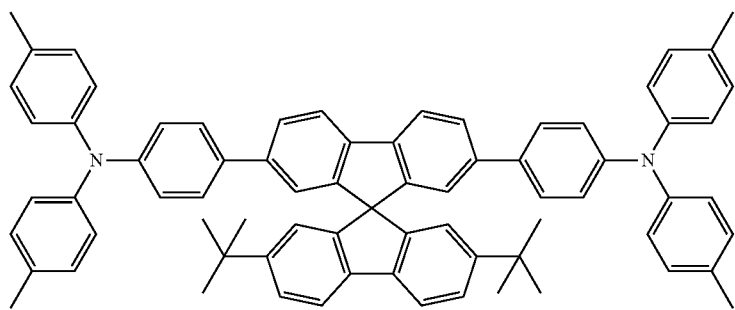
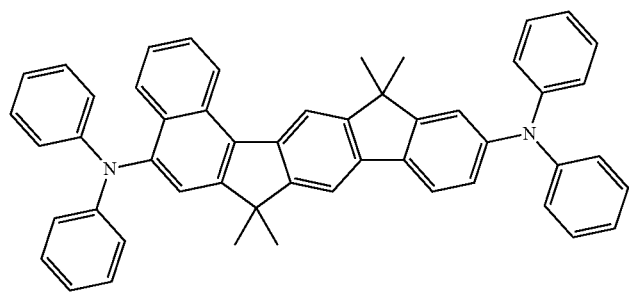

-continued
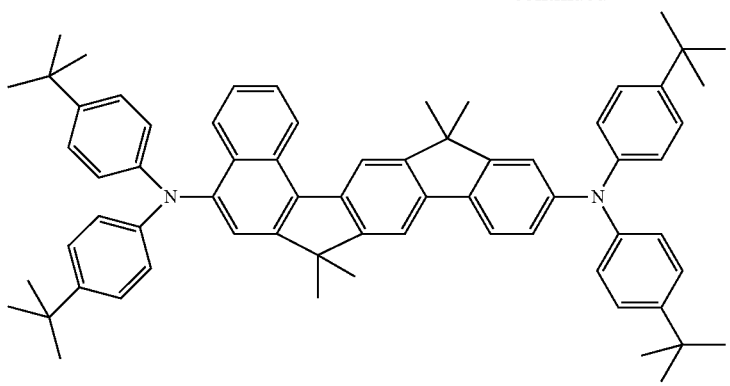
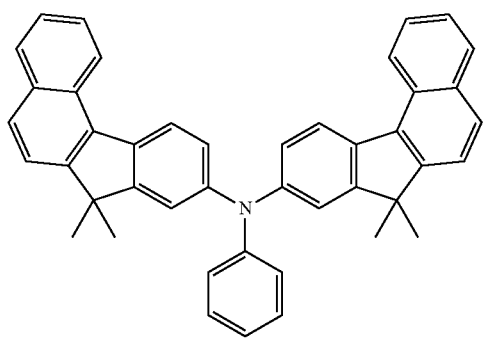
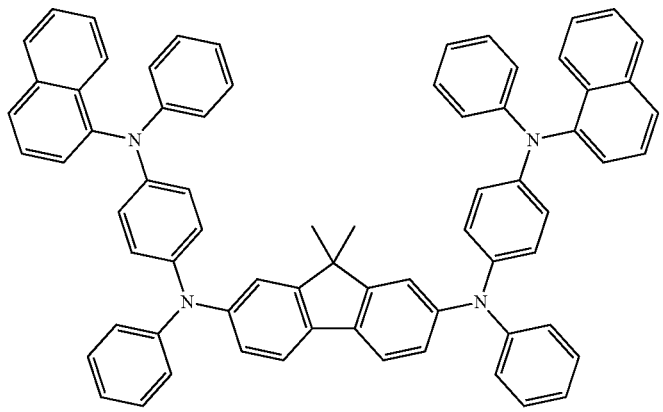
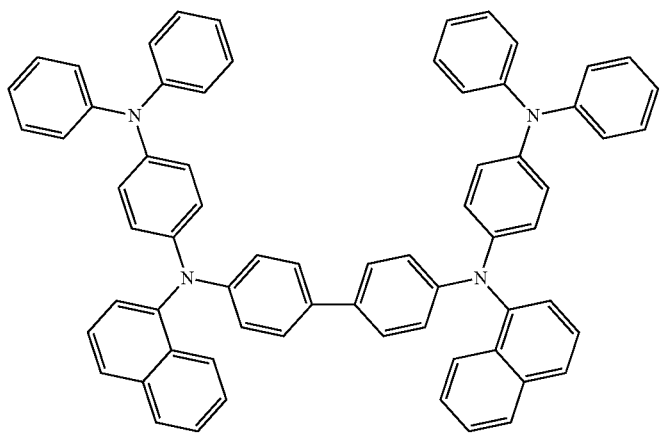

-continued
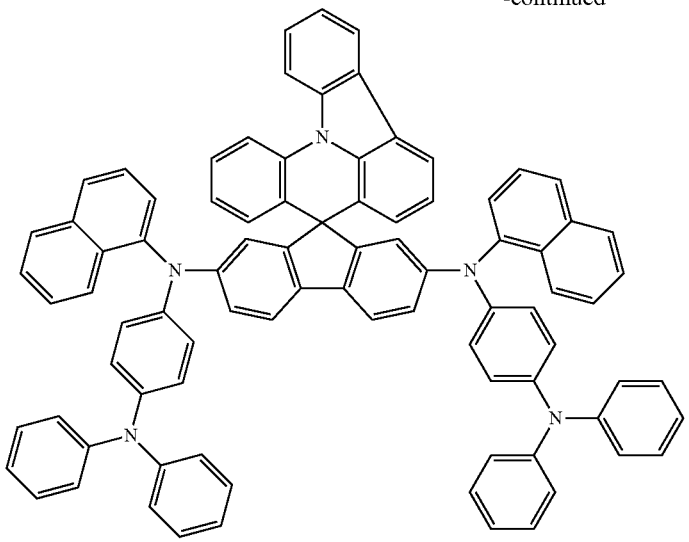
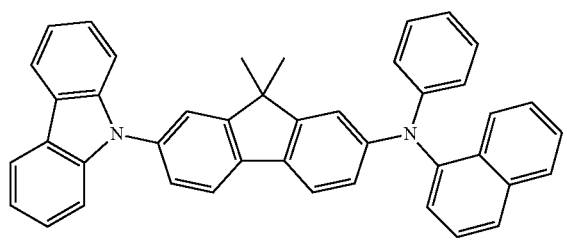
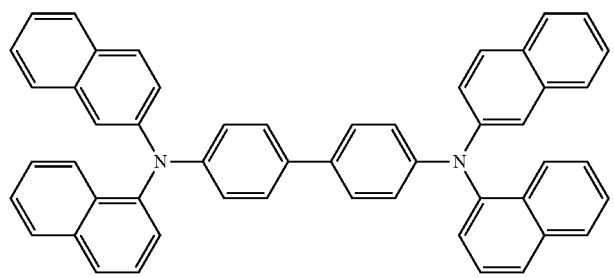
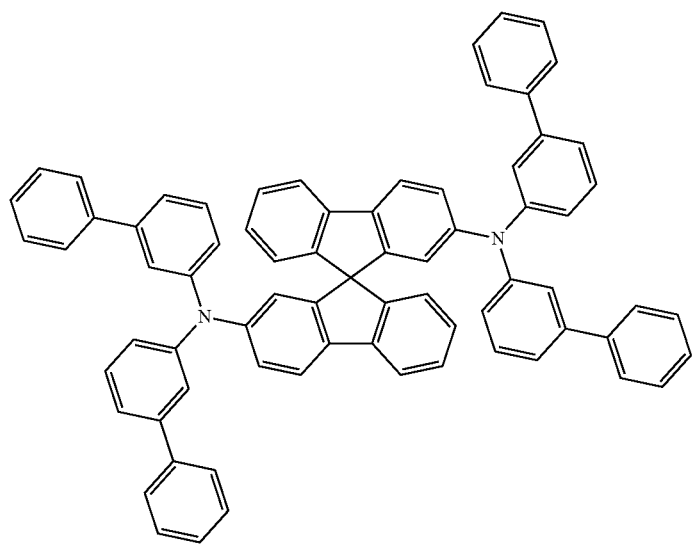

-continued
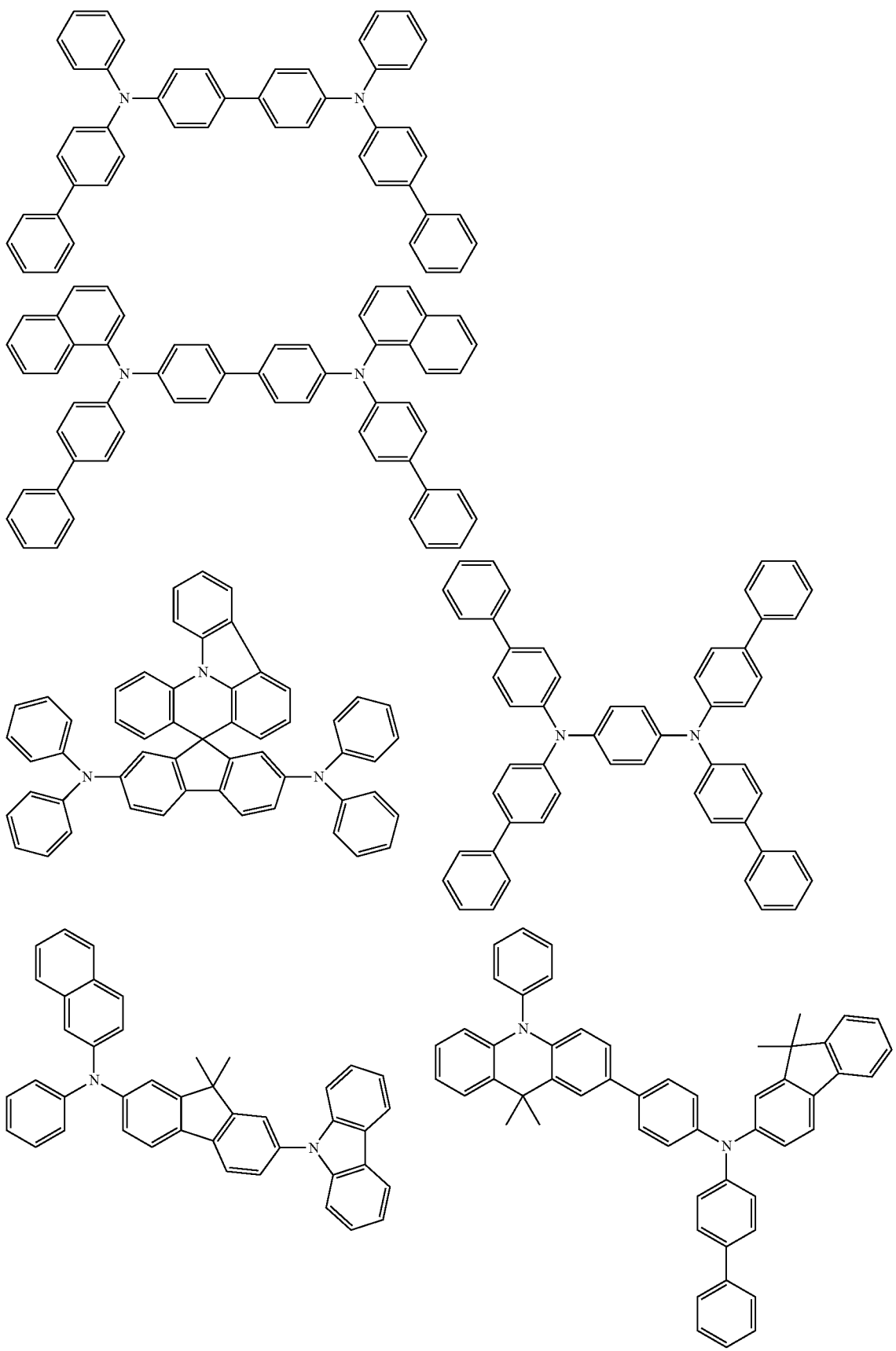

-continued
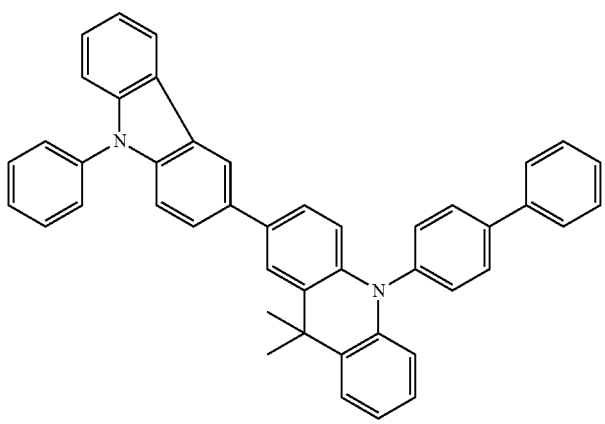
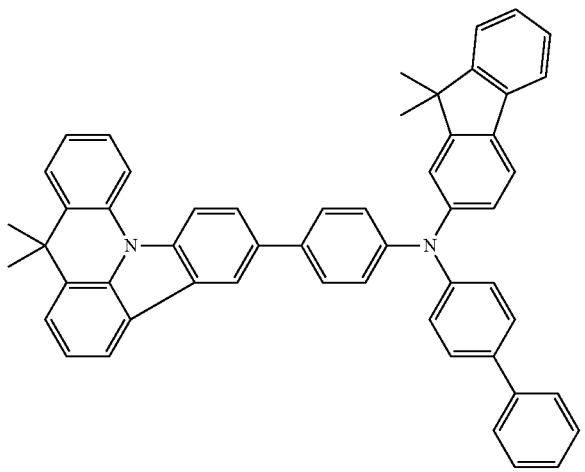
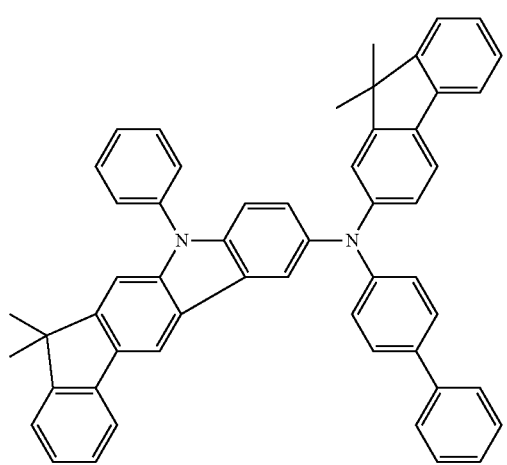
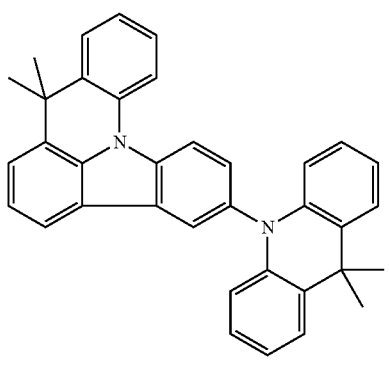
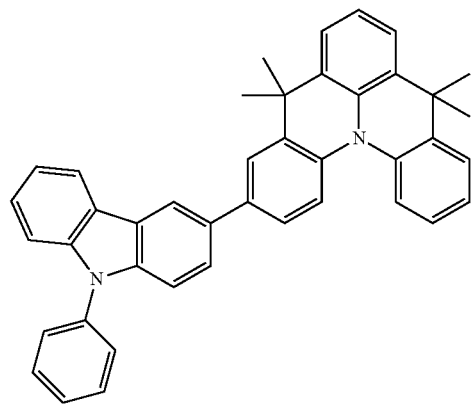
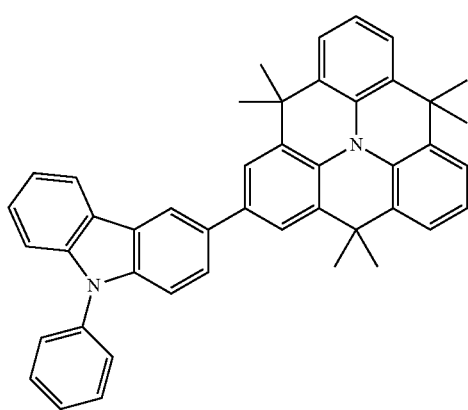
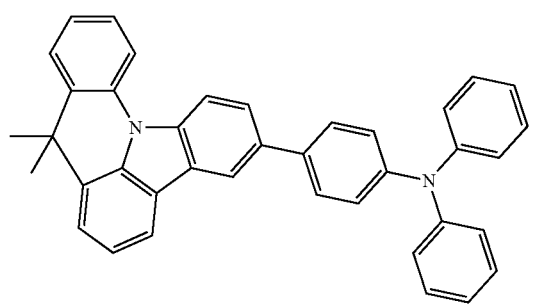

-continued
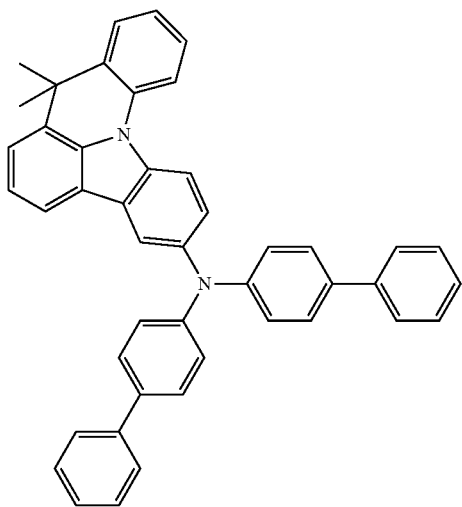
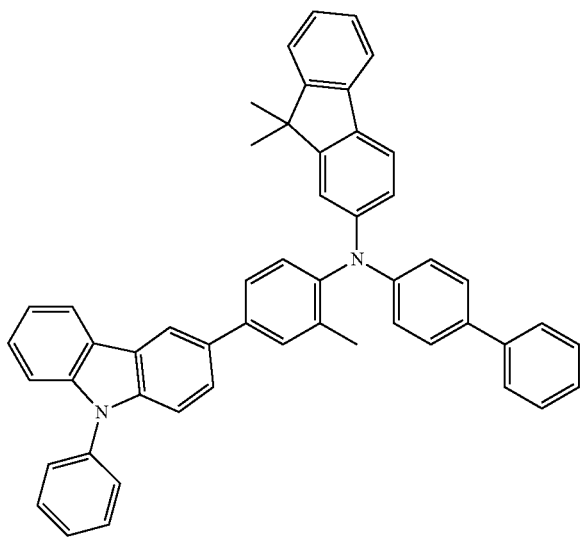
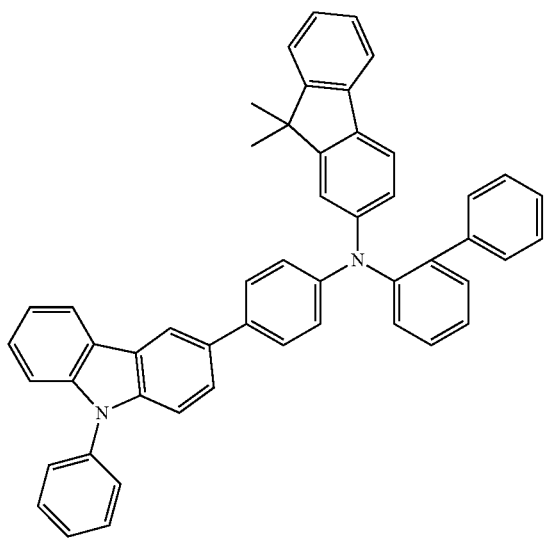
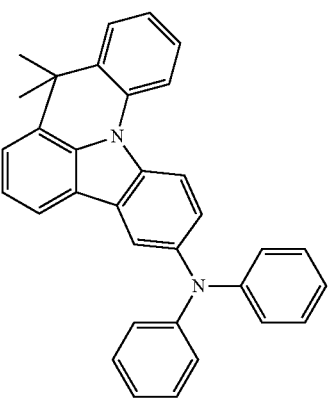
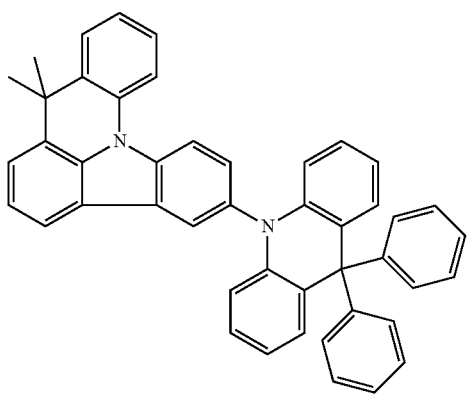
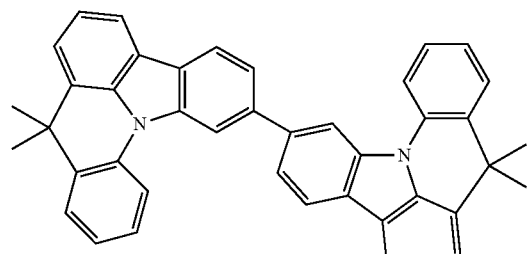

-continued
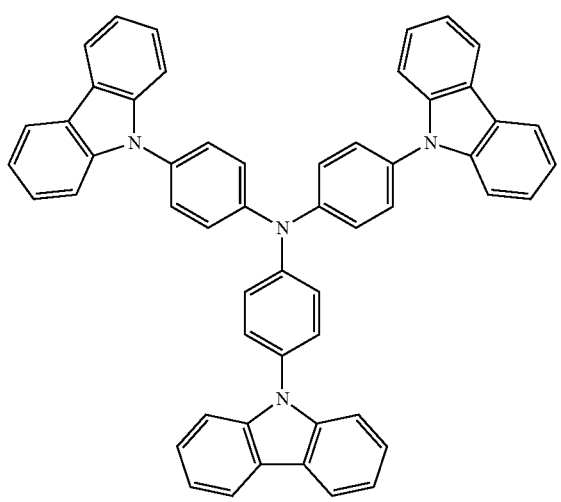
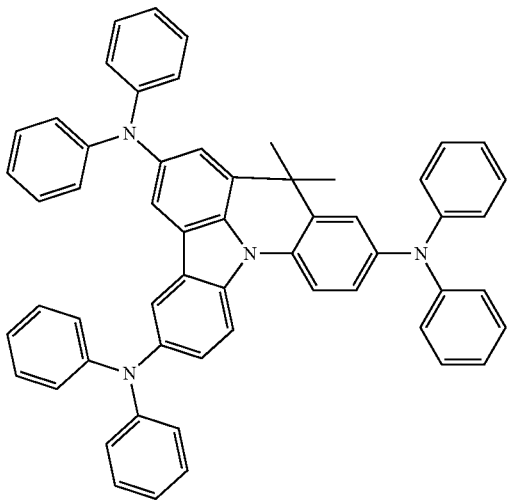
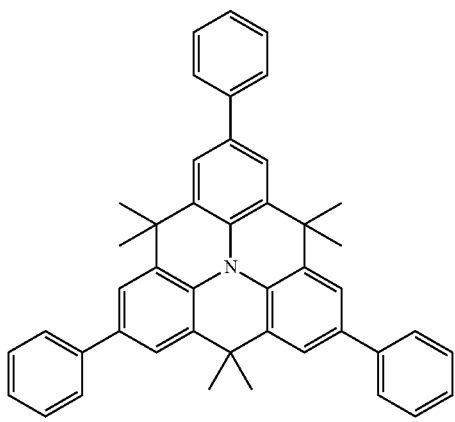
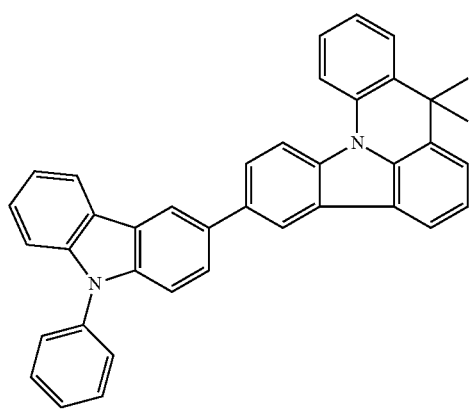
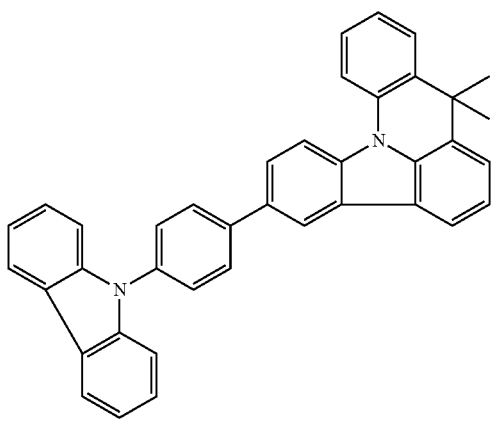
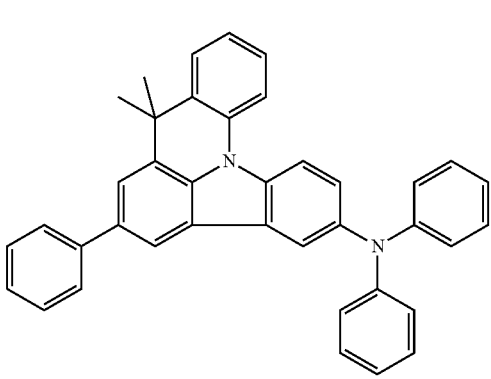

-continued
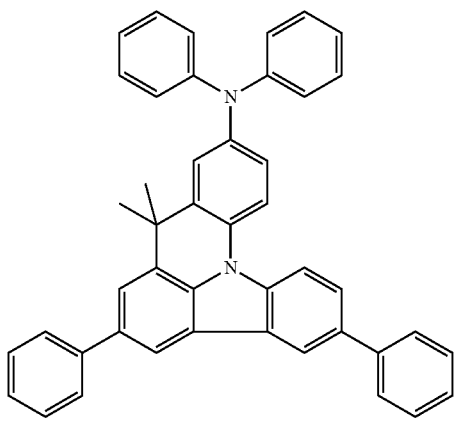
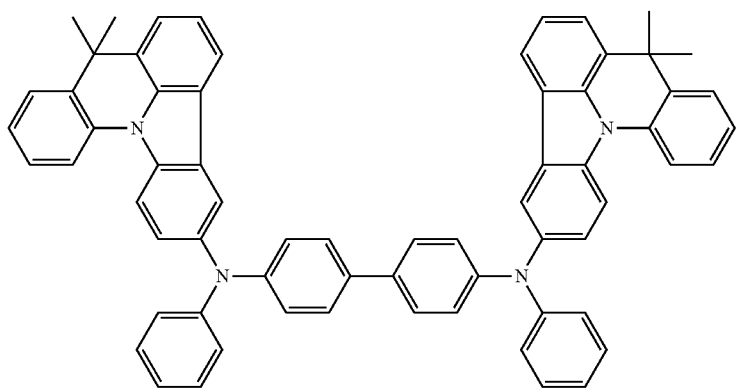
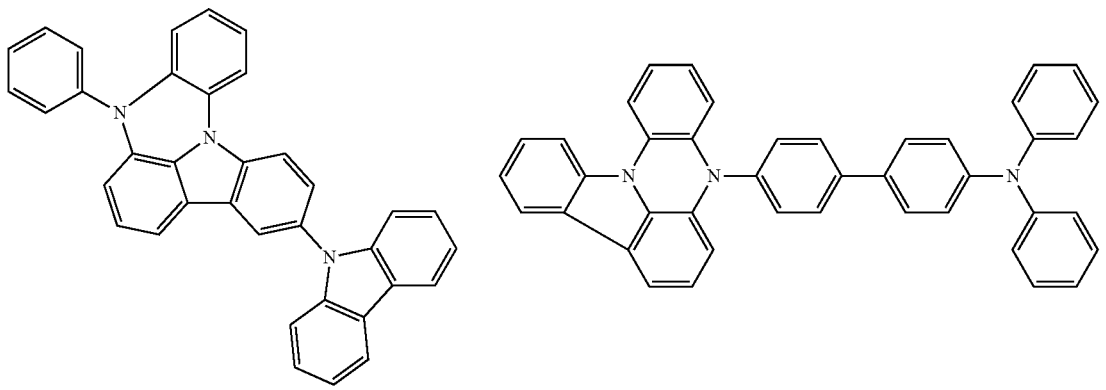
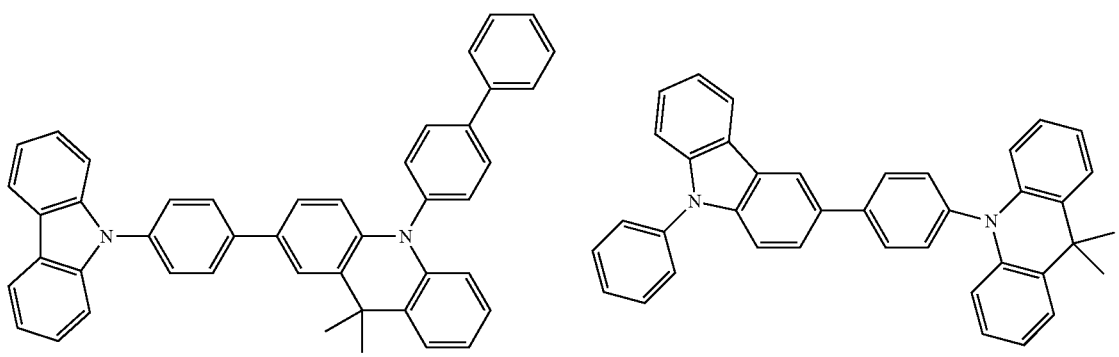

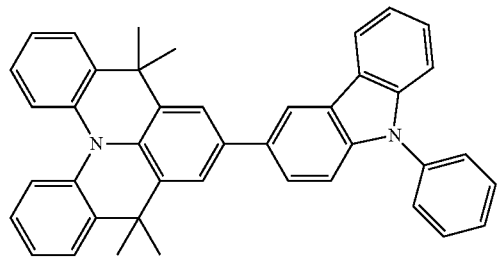
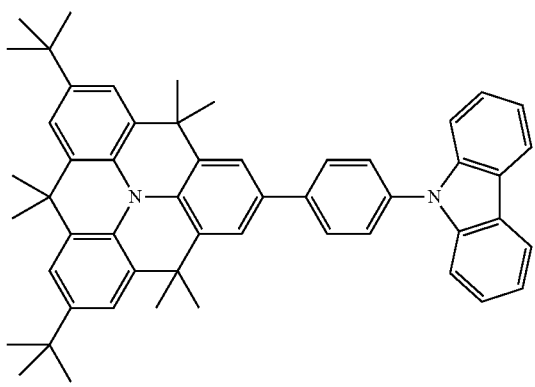
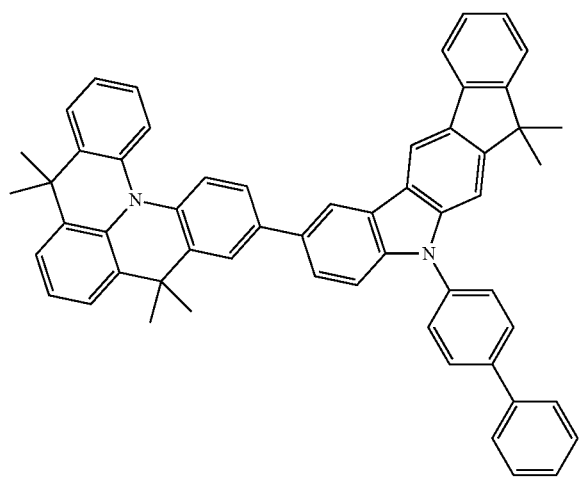
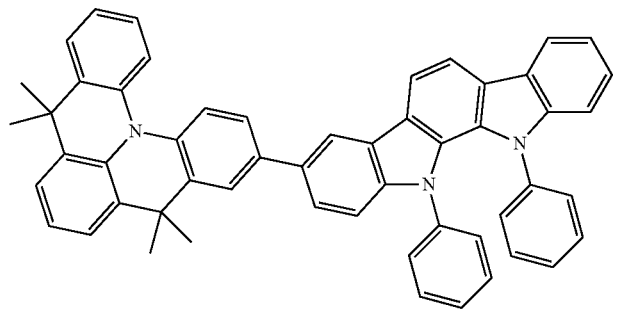
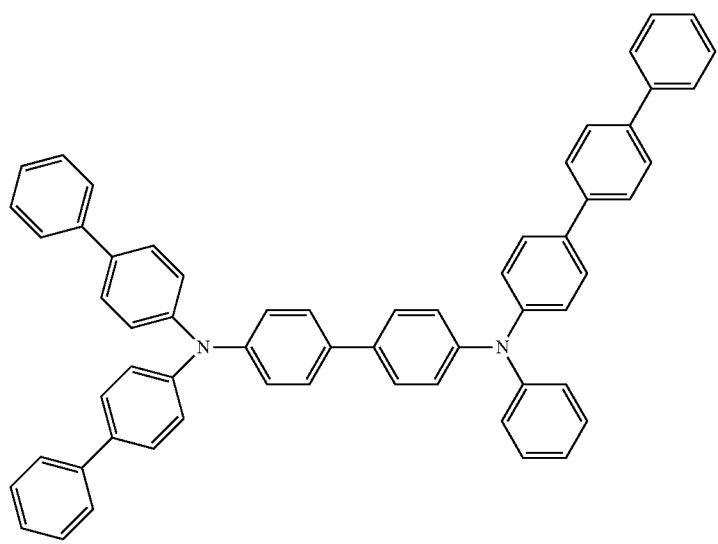

-continued
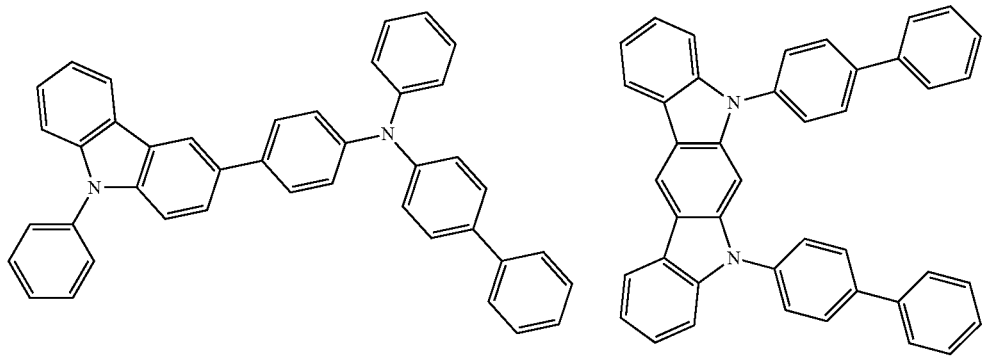
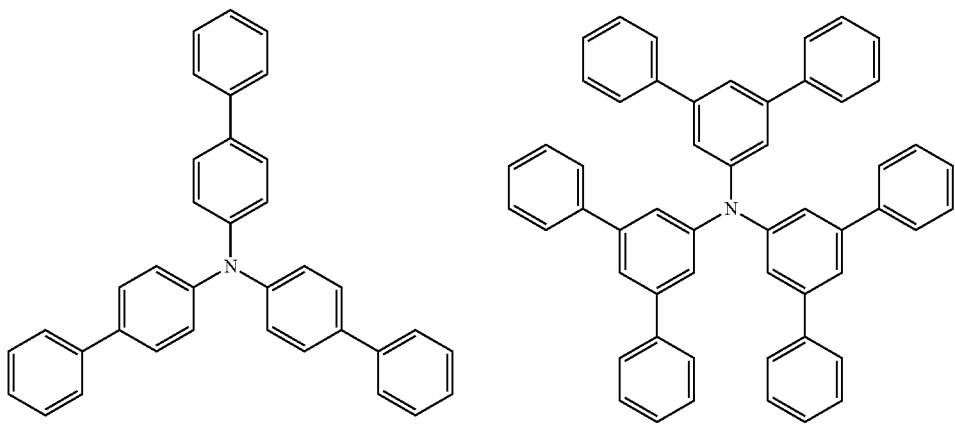
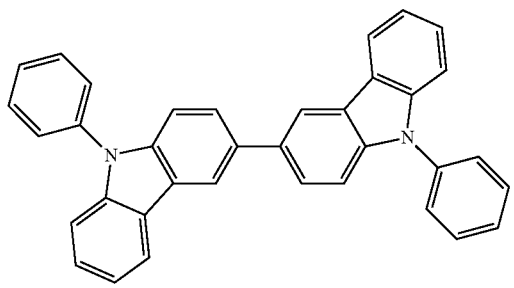
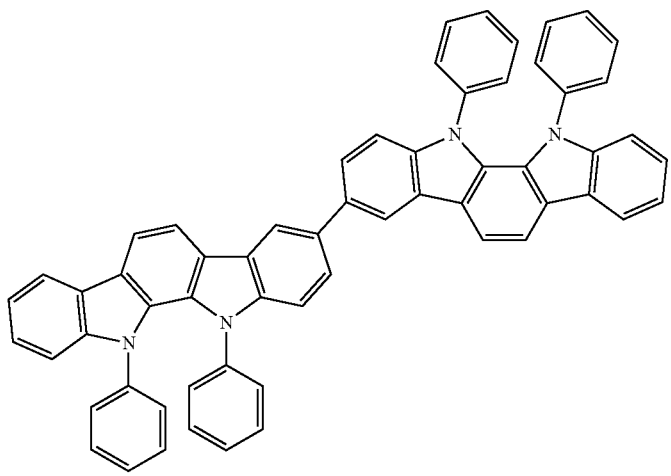

-continued
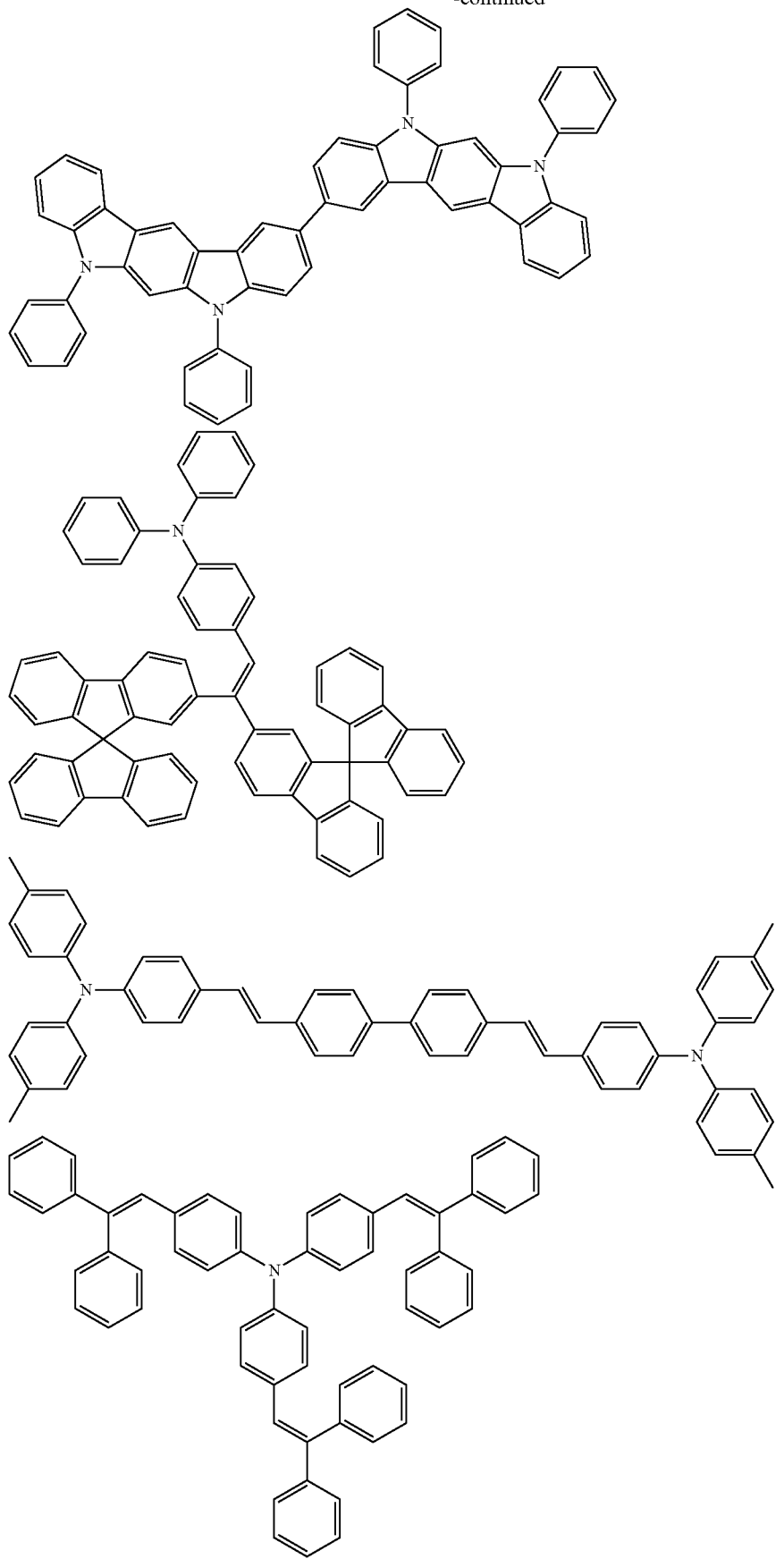

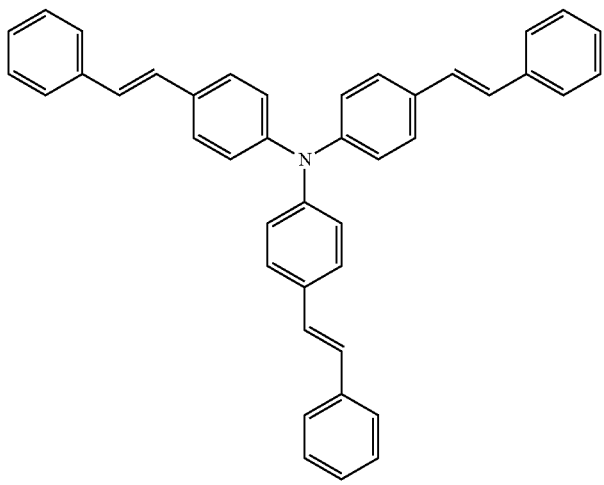
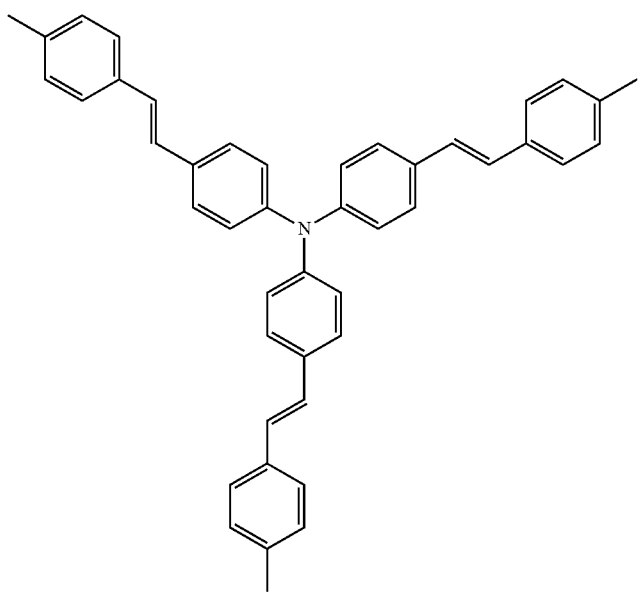
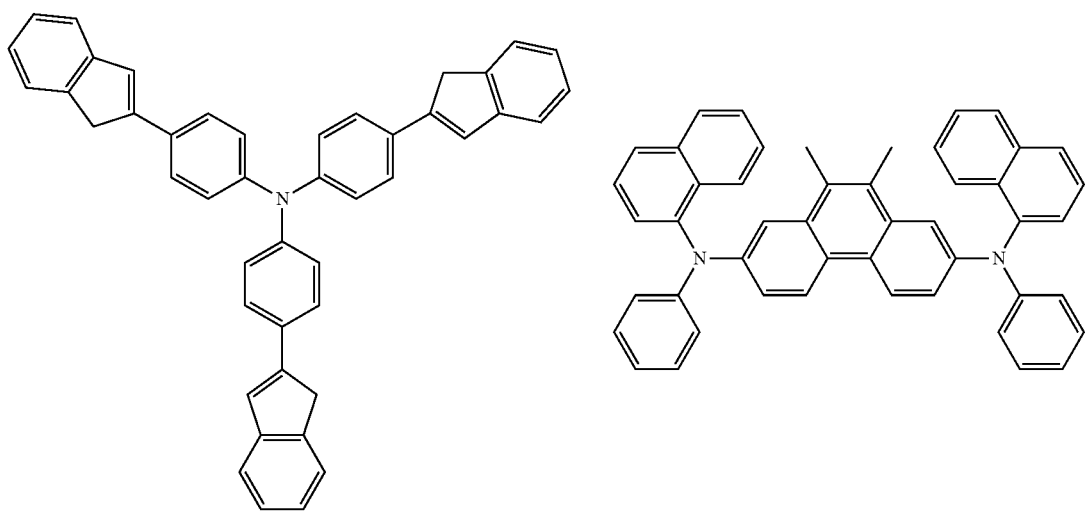

-continued
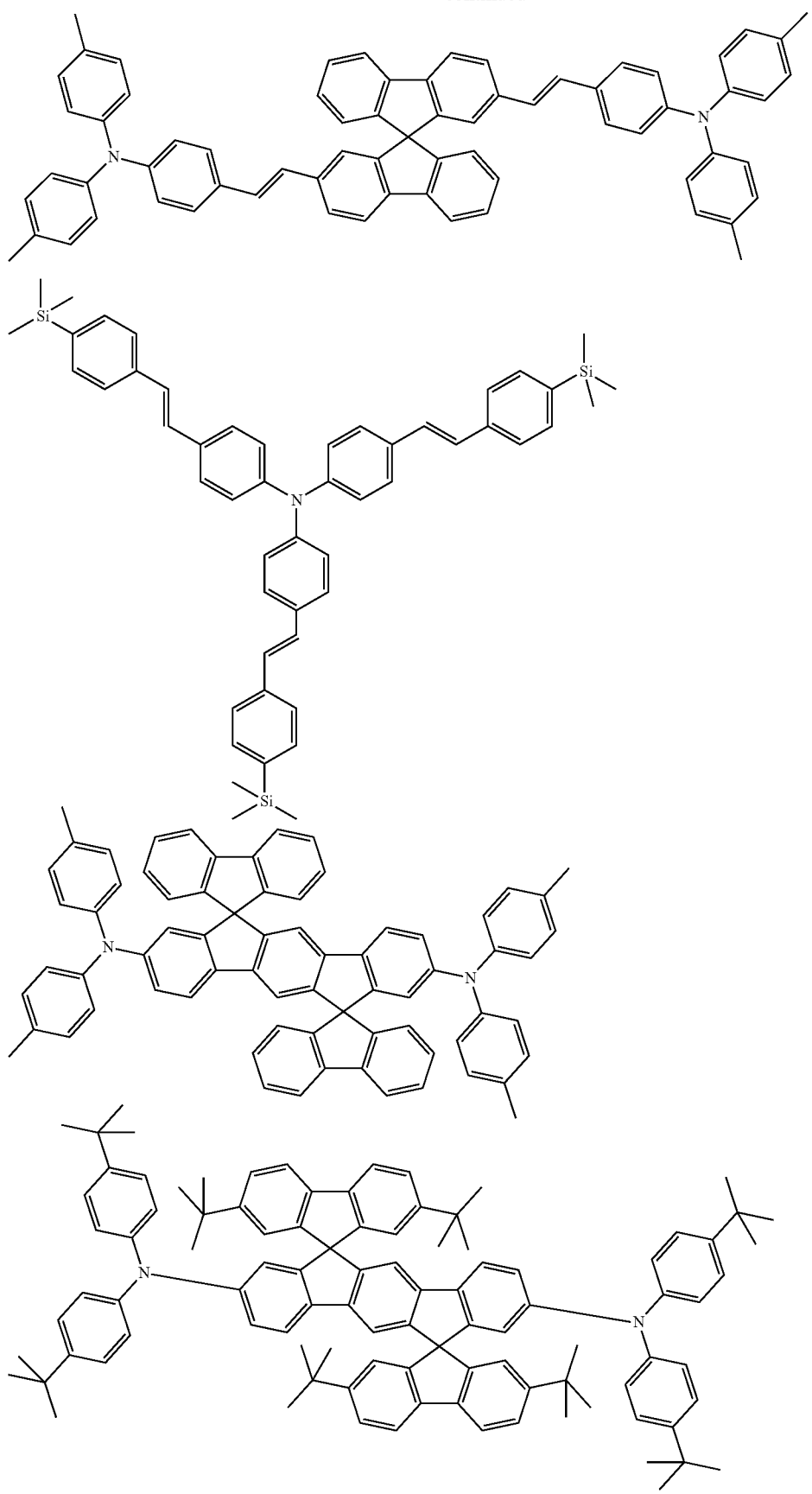

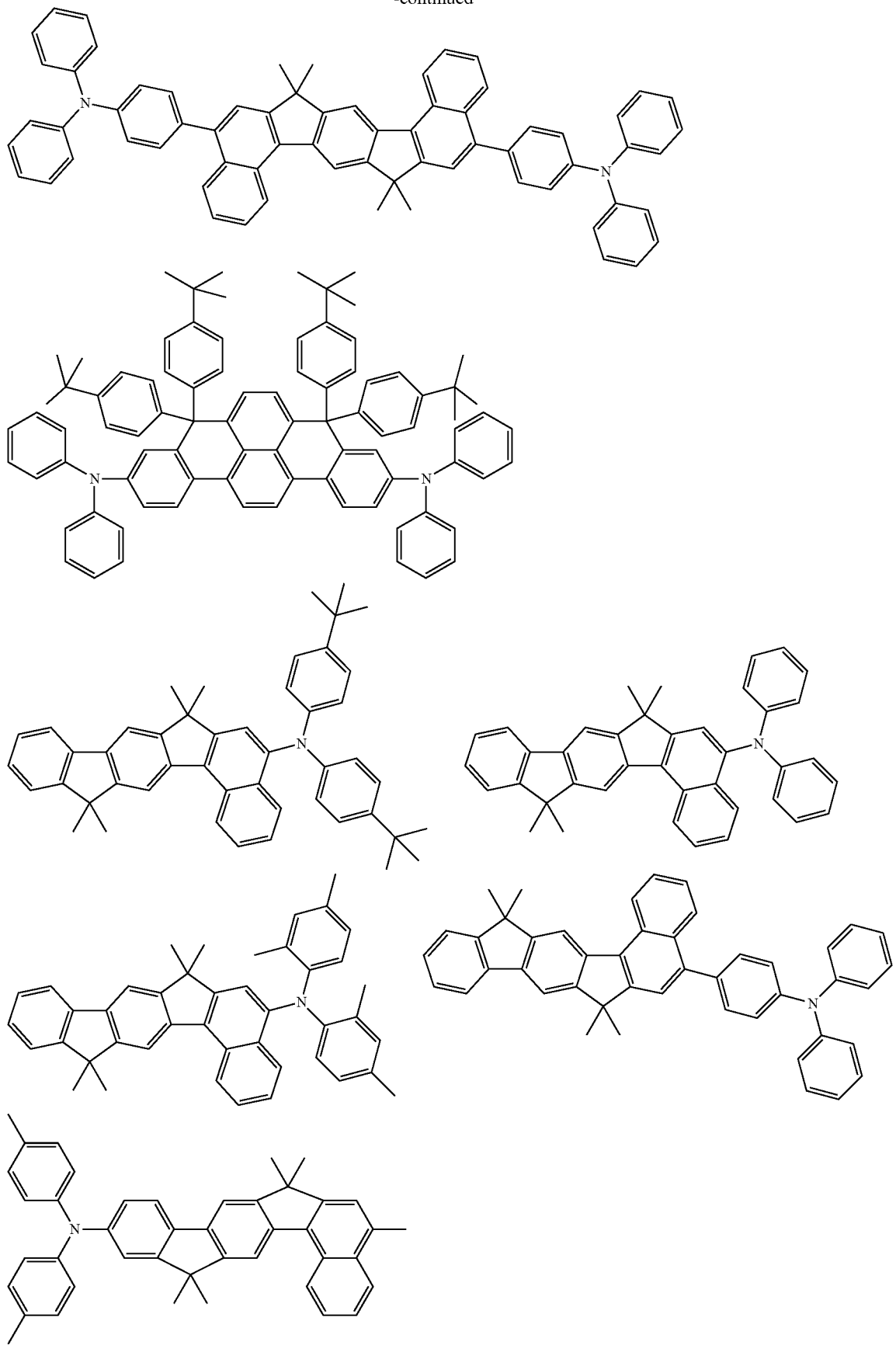

-continued
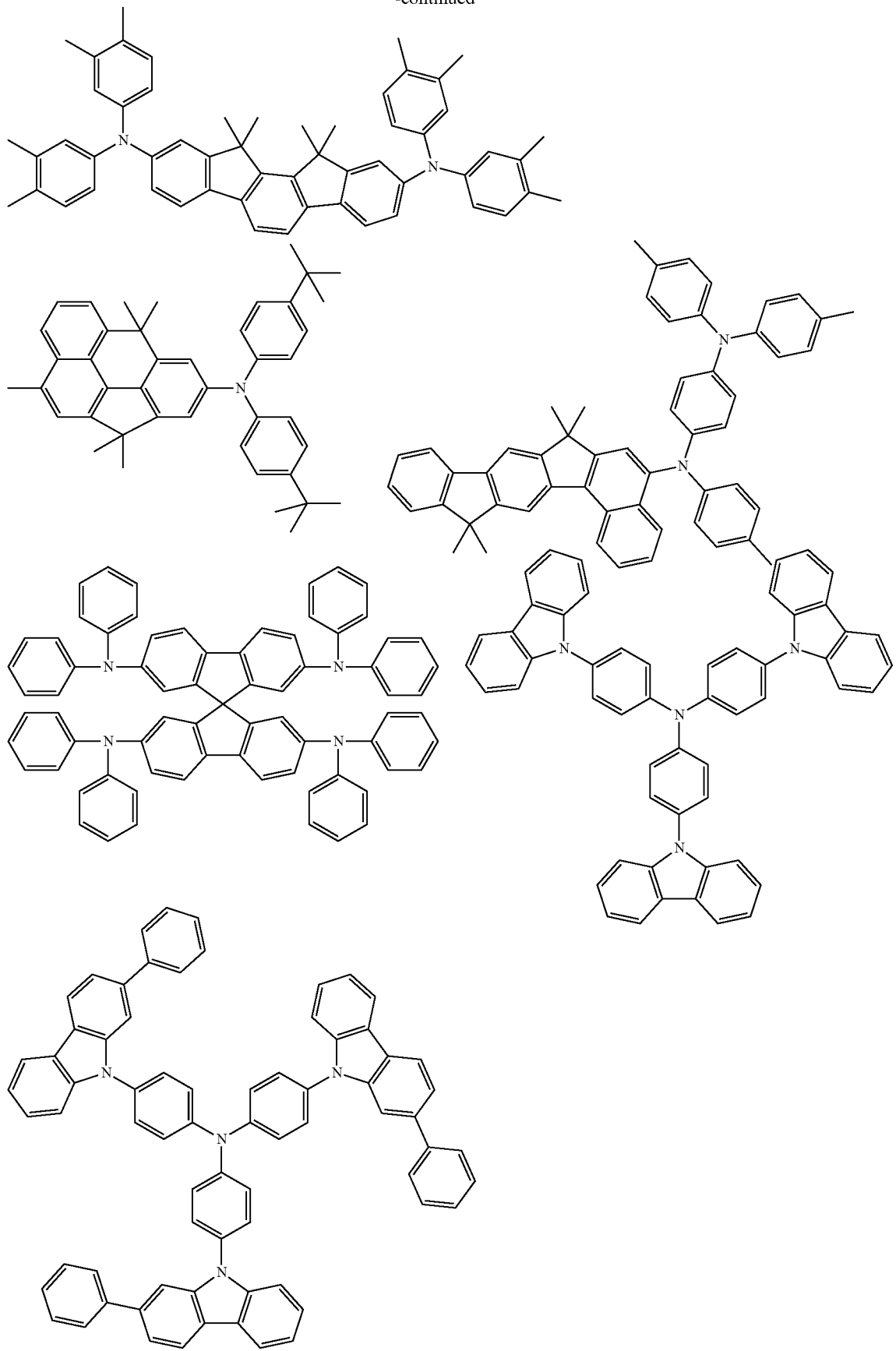

-continued
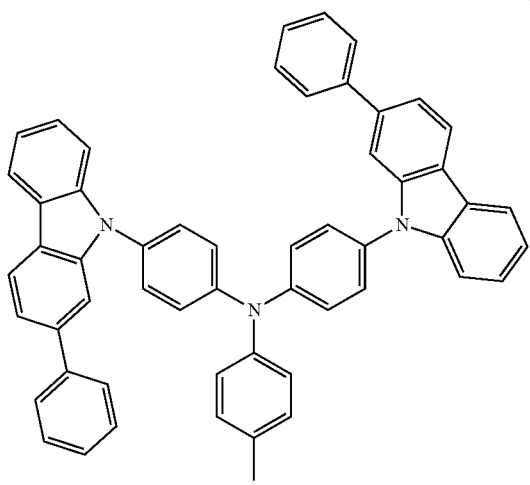
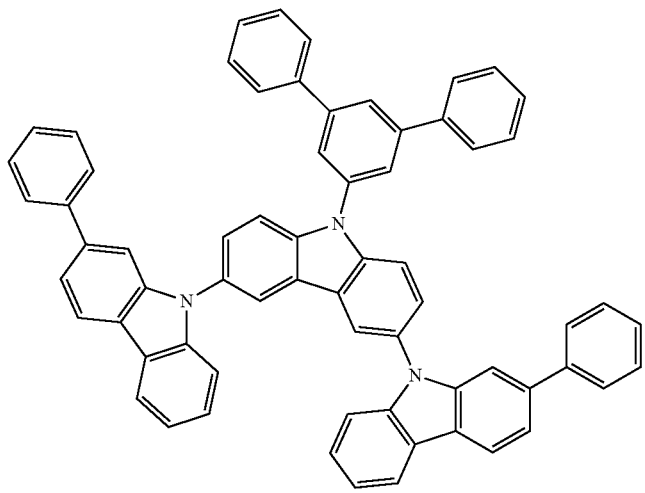
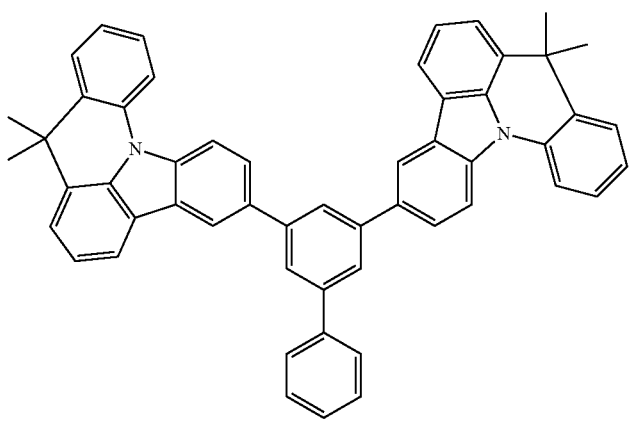
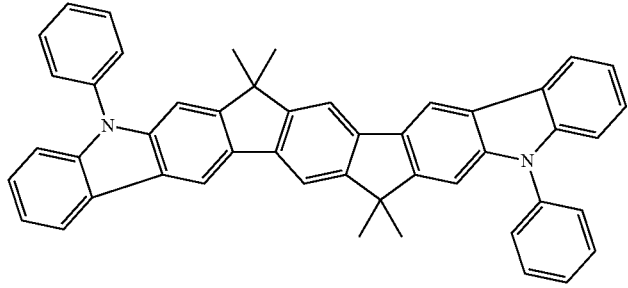
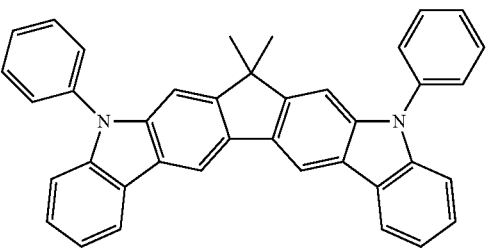

-continued
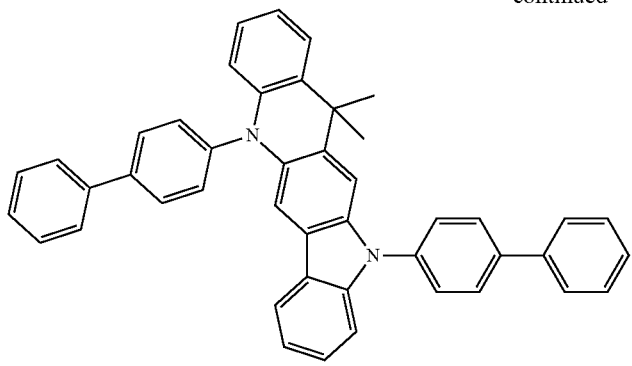
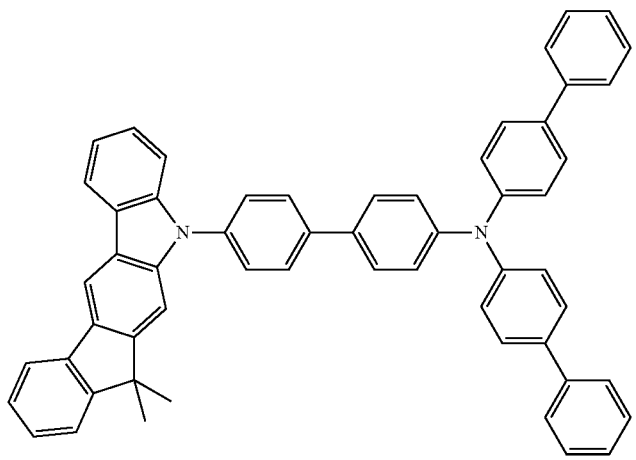
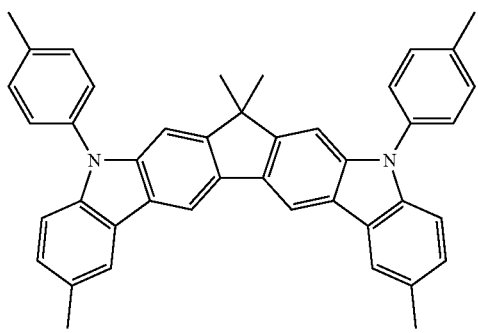
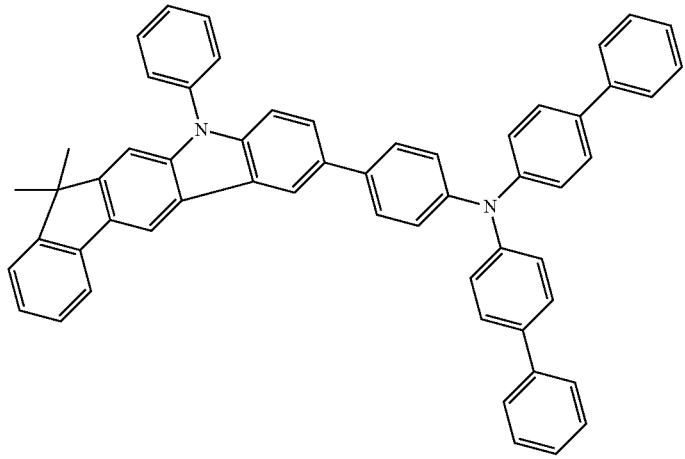

-continued
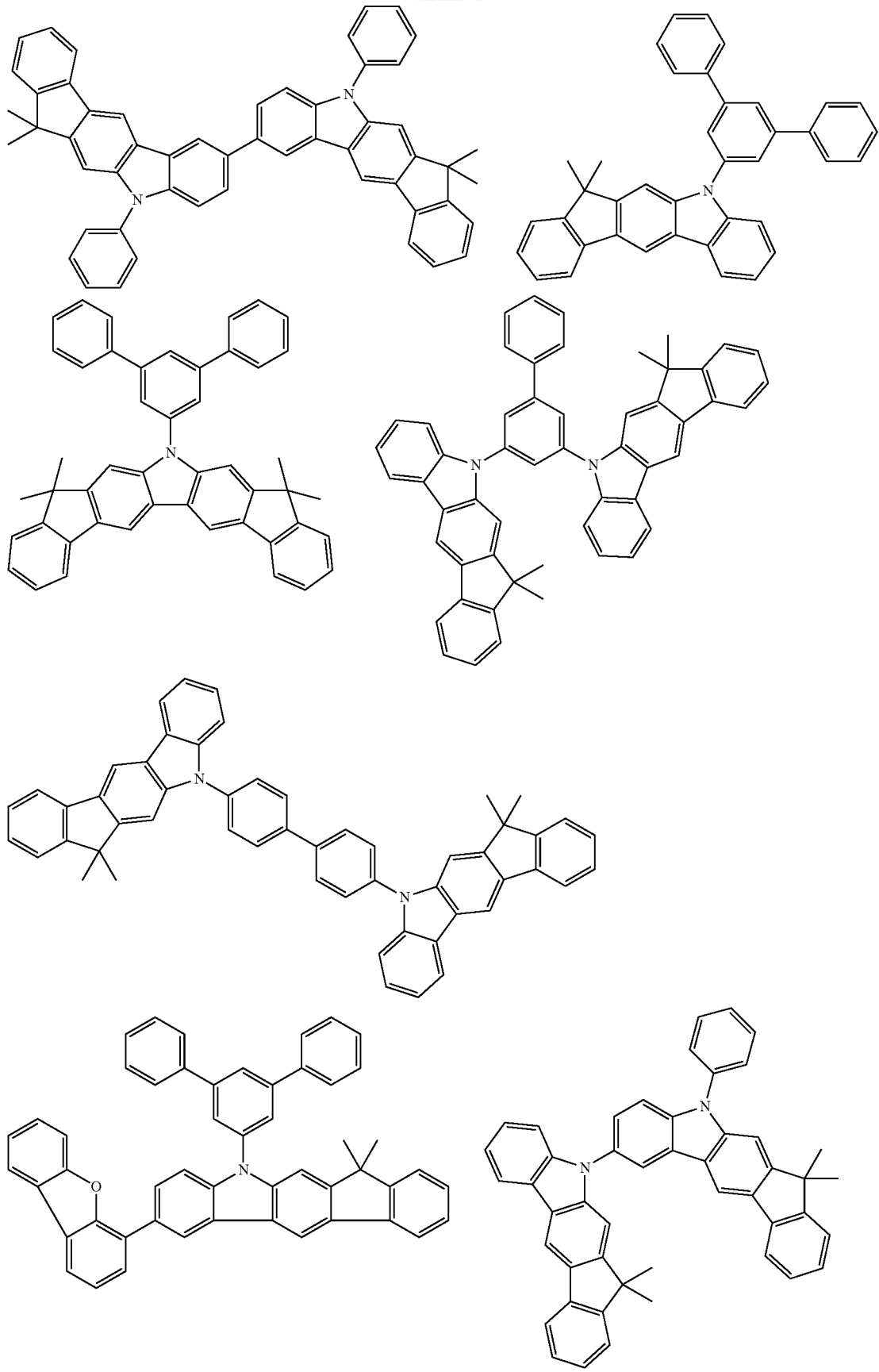

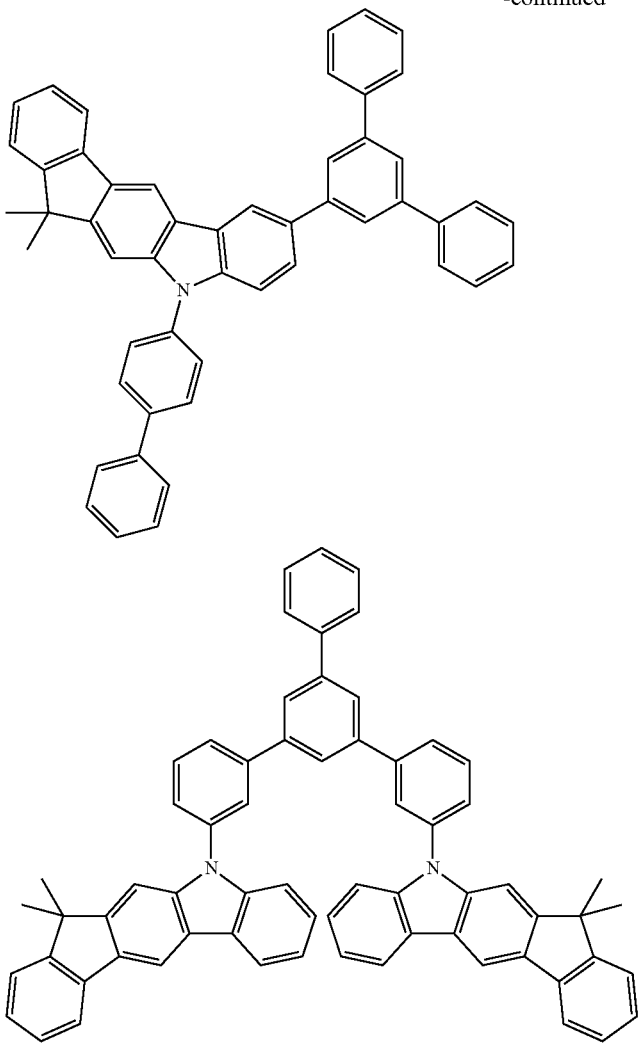

The materials as can preferably be used as material HTM-2 are described below.

Suitable as material HTM-2 are in principle the same basic structures of the formulae (1) to (11) and (13) to (15) as indicated above for material HTM-1. It is readily possible for the person skilled in the art to select suitable material combinations of HTM-1 and HTM-2 by determining the HOMO position of the materials and then selecting materials which have the above-mentioned condition for the relative HOMO values. The HOMO of the materials can be influenced by the choice of the basic structure and the substituents.

Apart from the compounds mentioned above, preferred compounds here are furthermore also those in which $Ar^1$ stands for heteroaromatic groups, for example for 2-, 3- or 4-pyridyl, each of which may be substituted by one or more radicals $R^1$.

Suitable as compound HTM-2 are, in particular, carbazole derivatives and carbazole derivatives containing condensed-on groups, such as indenocarbazole derivatives or indolo-carbazole derivatives, as are dimers of these structures. Also suitable are furthermore compounds of the formula (15) in which all indices m stand for 0, and dimers of these compounds.

Further suitable compounds which can be employed as HTM-2 are diazasilole and tetraazasilole derivatives, in particular having aromatic substituents, as described, for example, in WO 2010/054729. Preferably suitable as HTM-2 are furthermore diazaphosphole derivatives, as disclosed, for example, in WO 2010/054730. Furthermore suitable as HTM-2 are diazaborole derivatives, as disclosed, for example, in WO 2006/117052.

Suitable substituents on the diaza- and tetraazasilole derivatives, diazaphosphole derivatives and diazaborole derivatives are aromatic and heteroaromatic ring systems, in particular also those which are linked to two nitrogen atoms of the diaza- and tetraazasilole, diazaphosphole or diazaborole, or also alkyl groups.

Furthermore suitable are compounds which contain no groups which are involved in charge transport. In particular, these compounds are pure hydrocarbons, especially aromatic hydrocarbons, which may also be substituted by non-aromatic groups. These compounds preferably contain no condensed aryl groups larger than naphthalene, particularly preferably no condensed aryl groups at all. A condensed aryl group here is taken to mean a group in which two or more phenyl groups are fused to one another directly through a common edge. For example, a fluorene group is therefore not a condensed aryl group in the sense of the present invention.
Examples of suitable materials HTM-2, apart from the structure examples mentioned above for HTM-1, are the following structures.
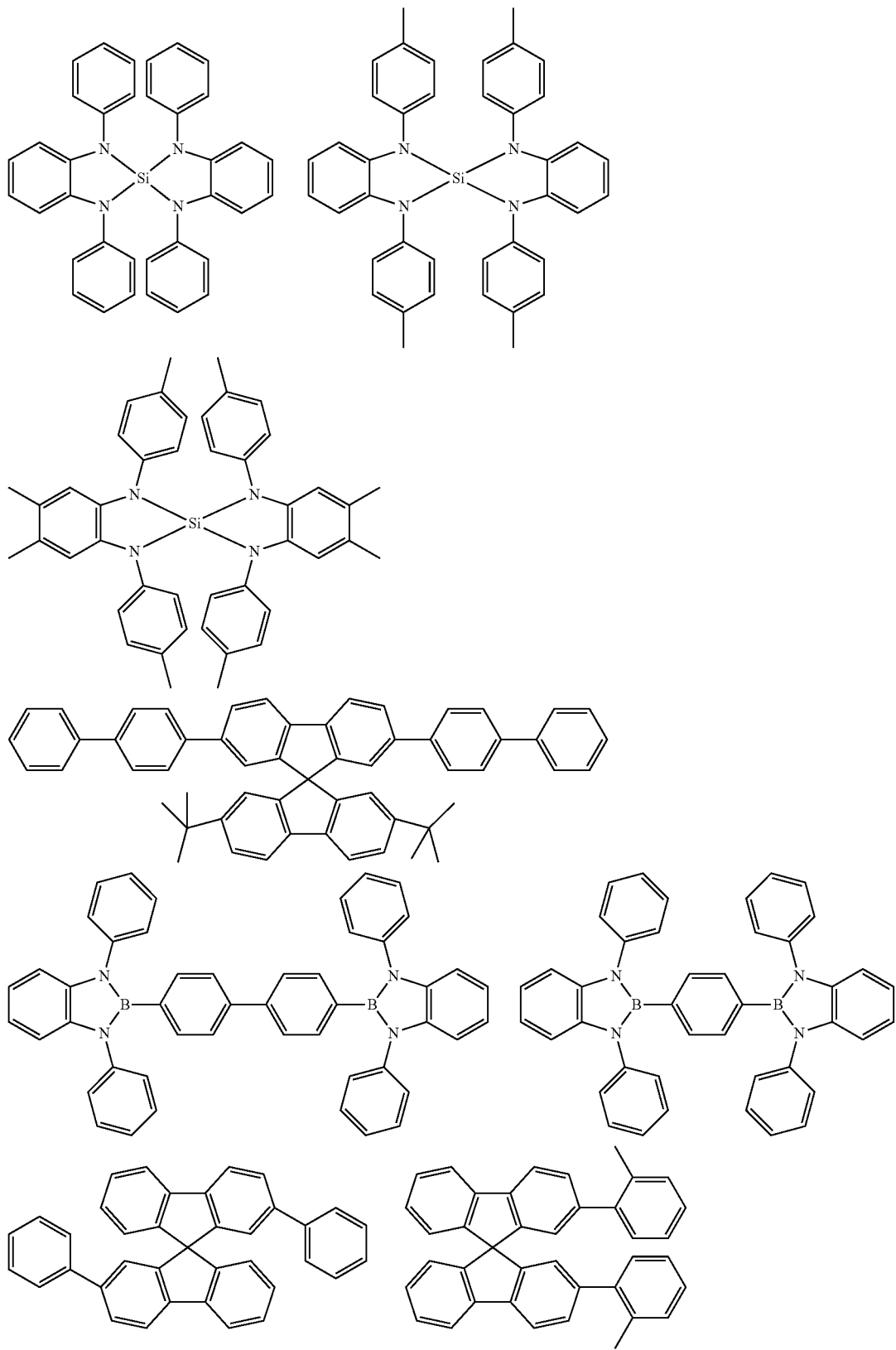

-continued
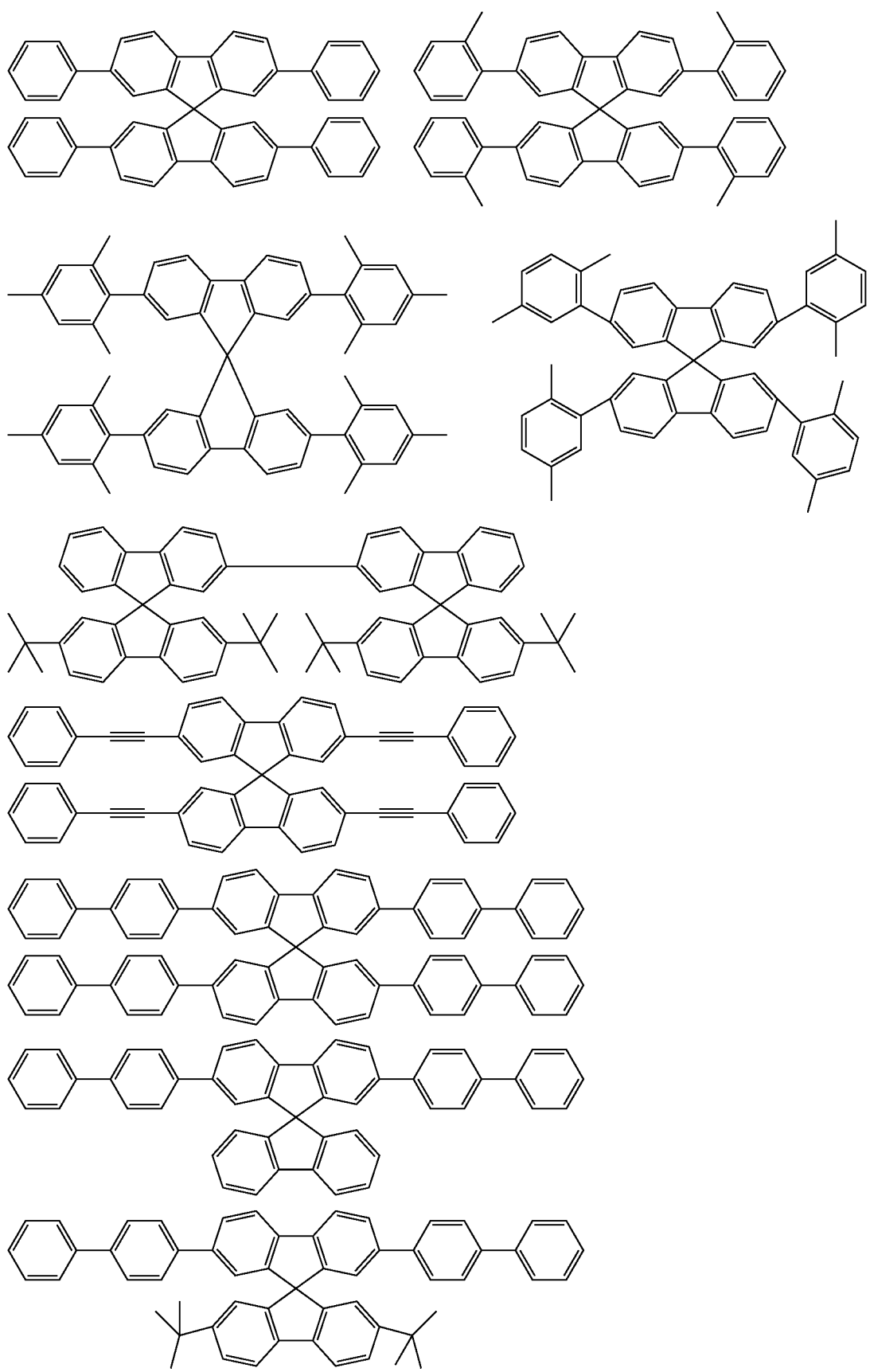

-continued
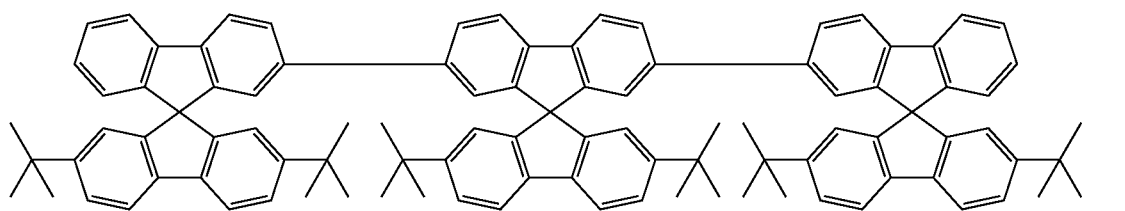
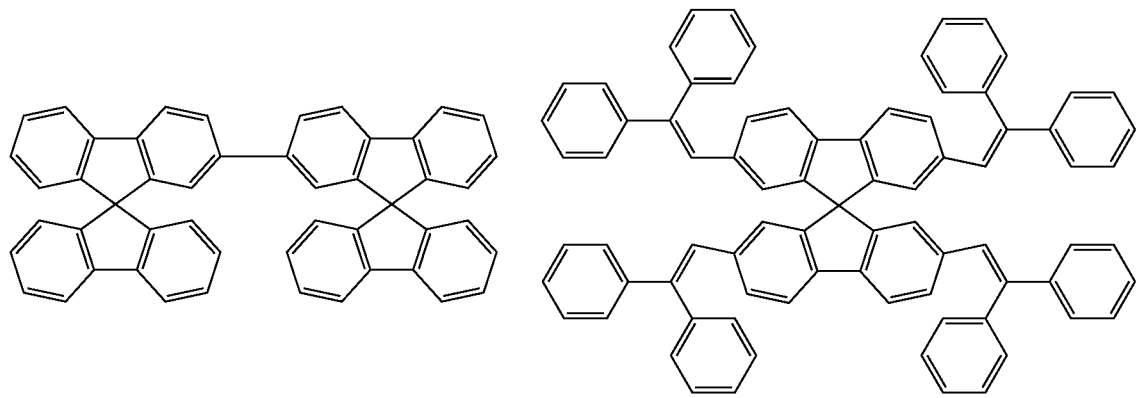
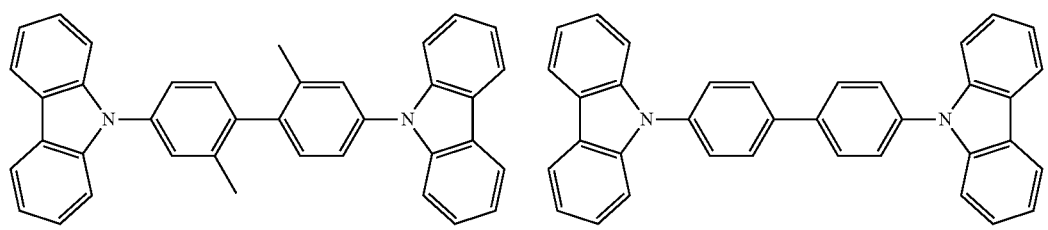
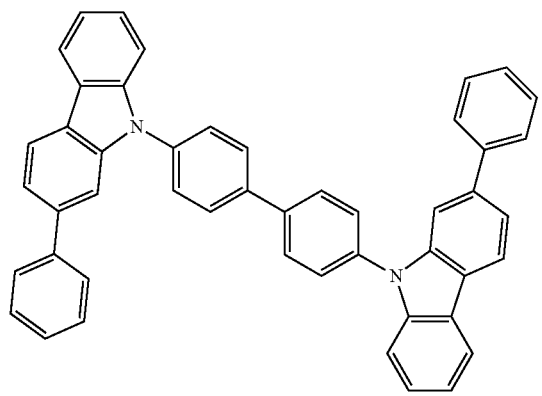
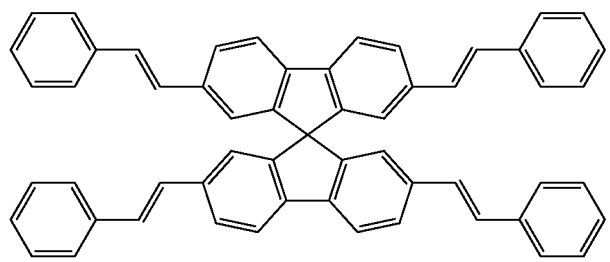

-continued
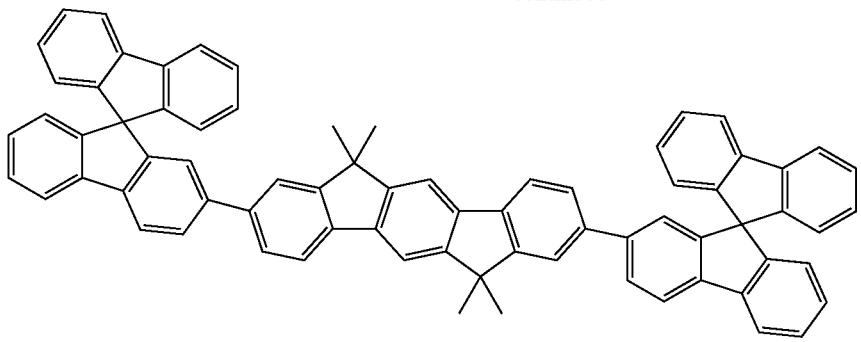
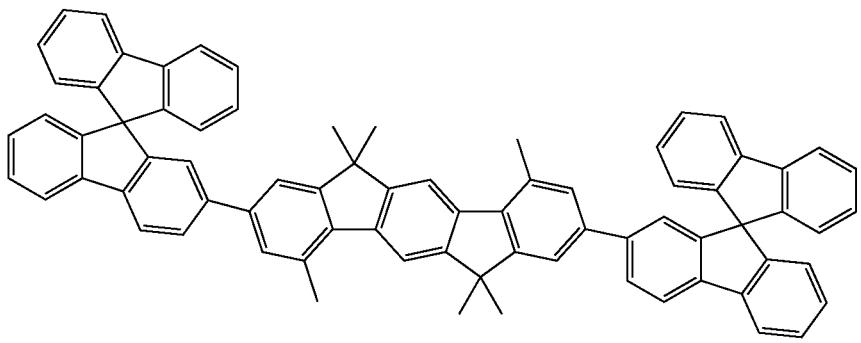
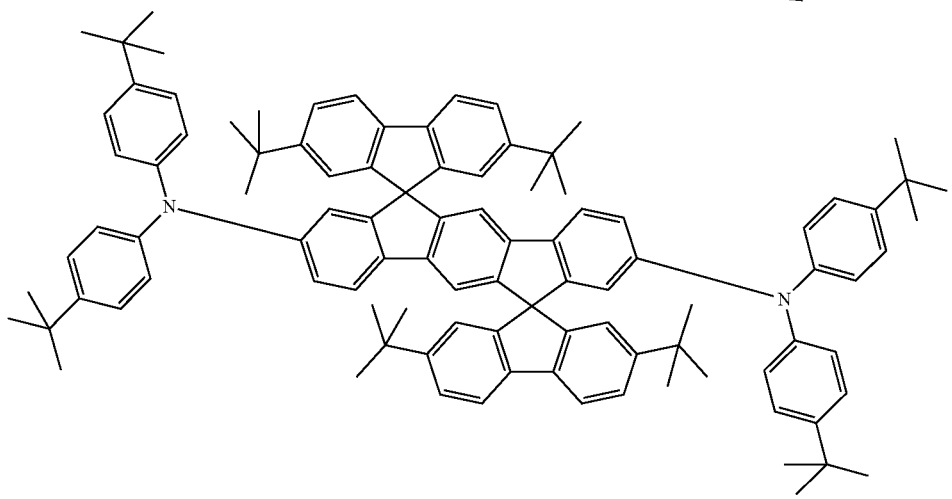
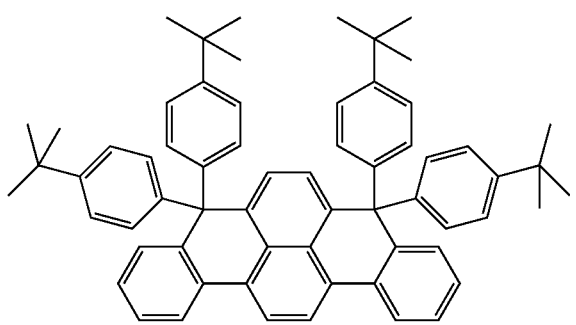
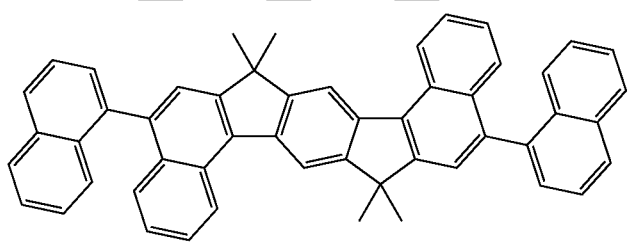

-continued
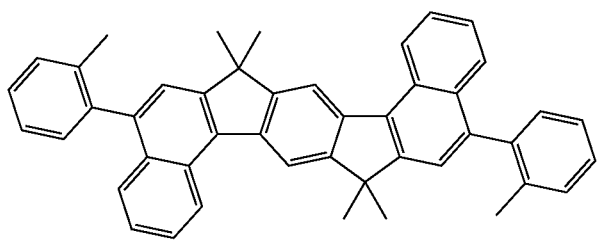
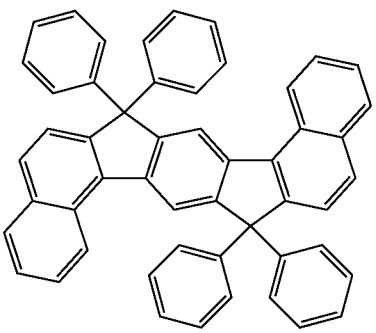
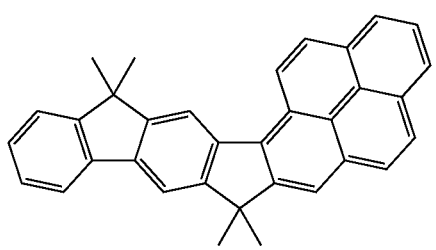
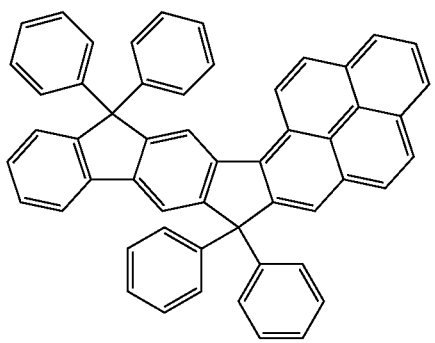
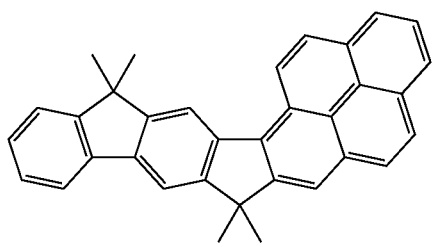
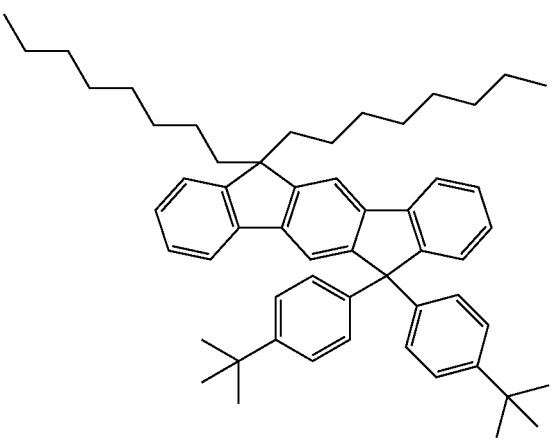
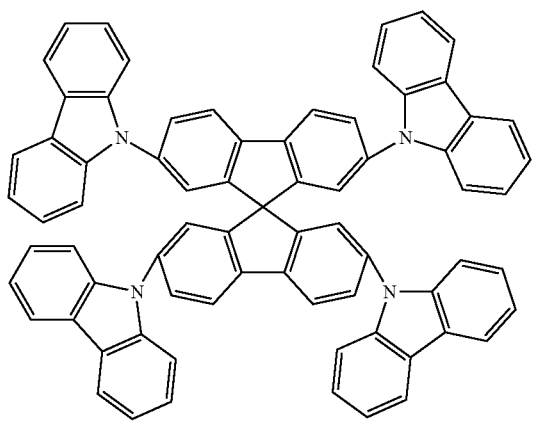
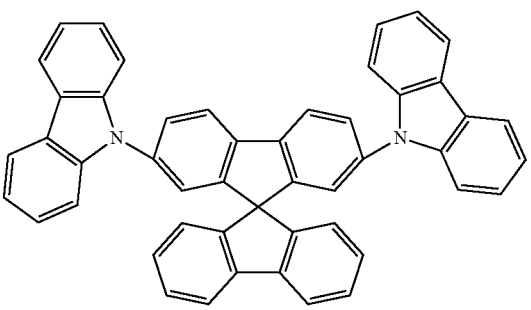

-continued
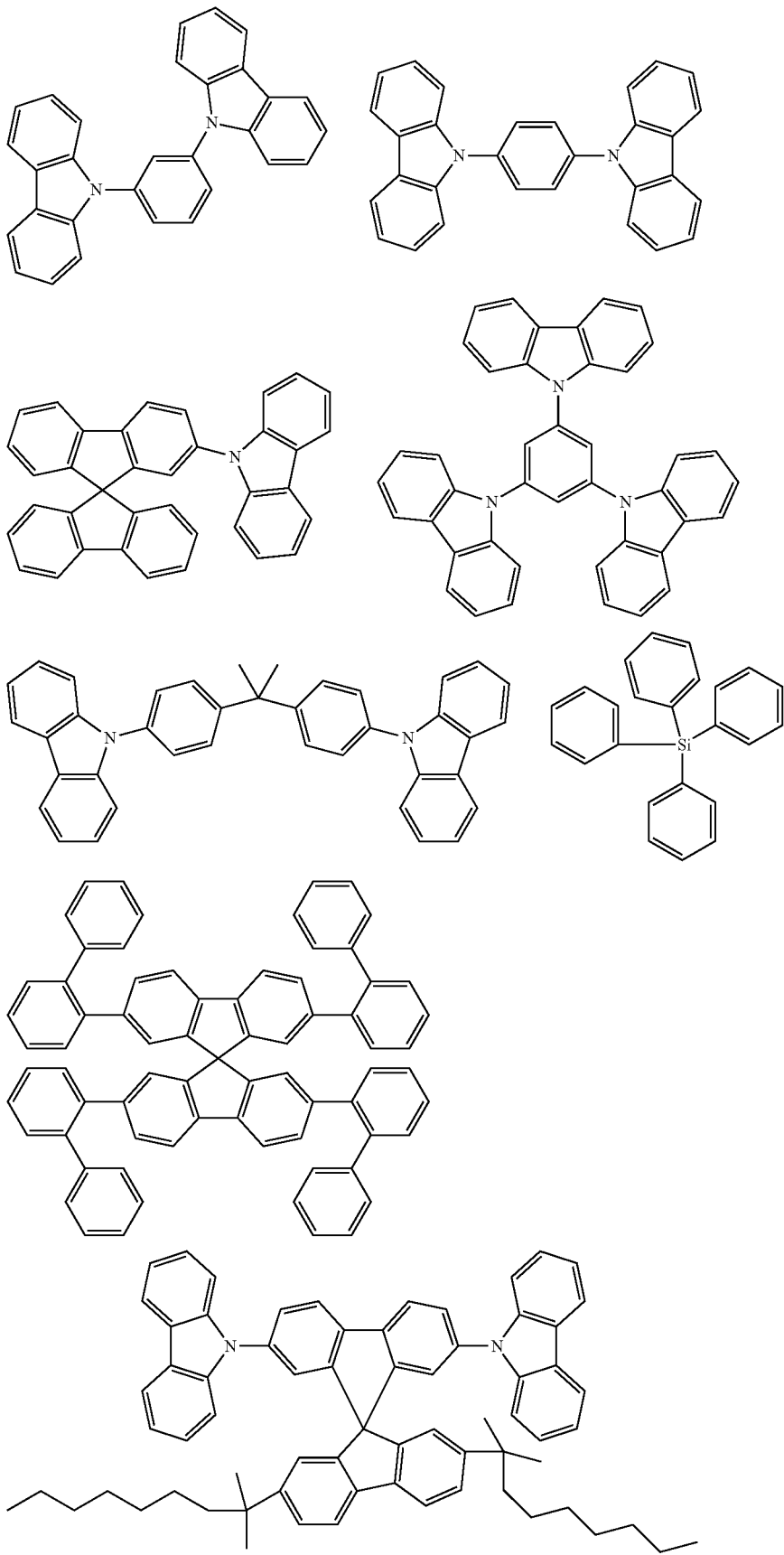

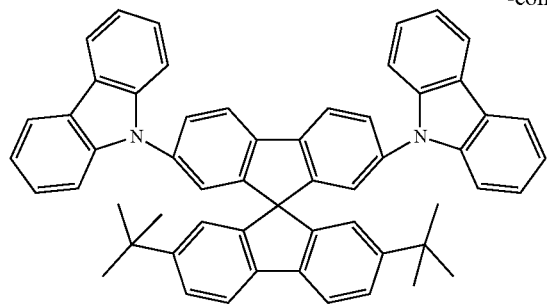
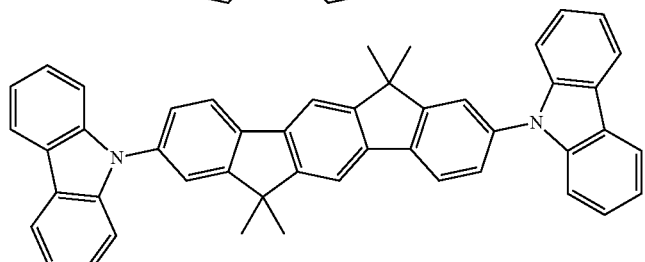
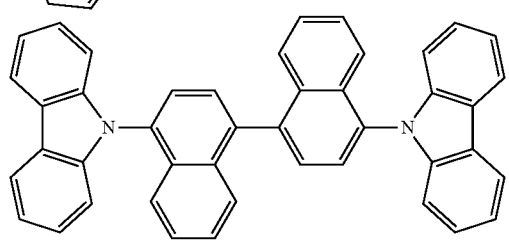
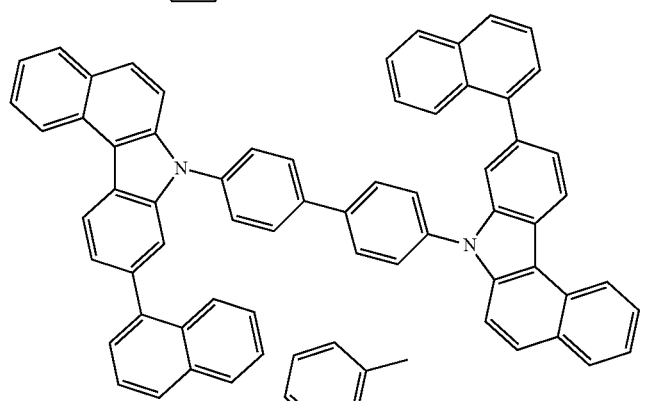
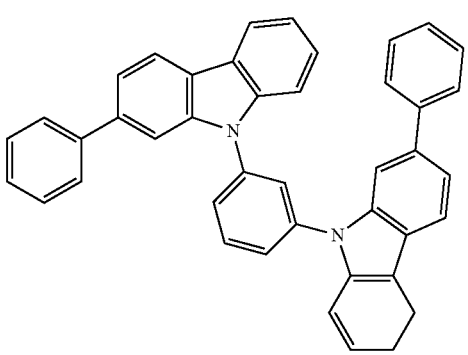
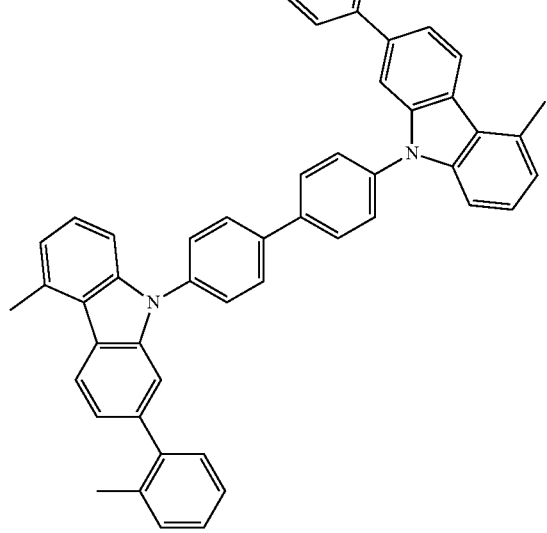

85 86
-continued
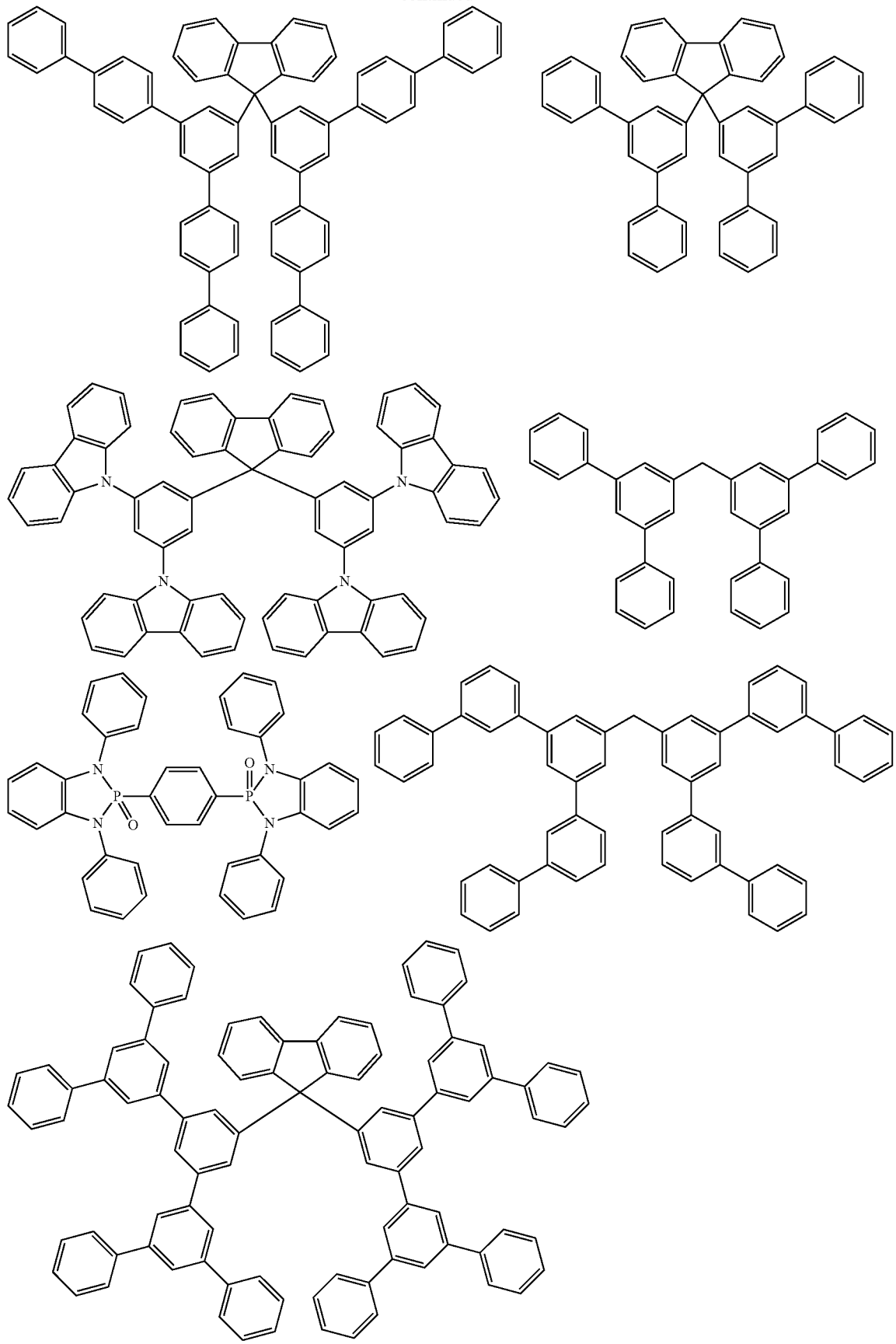

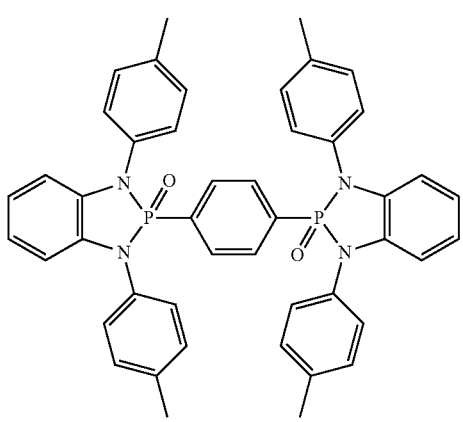
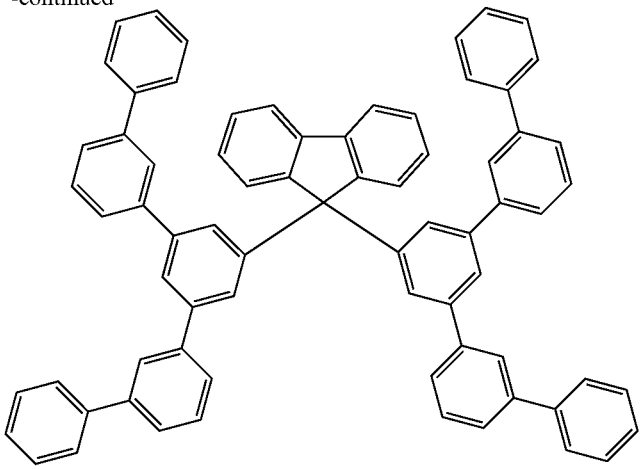
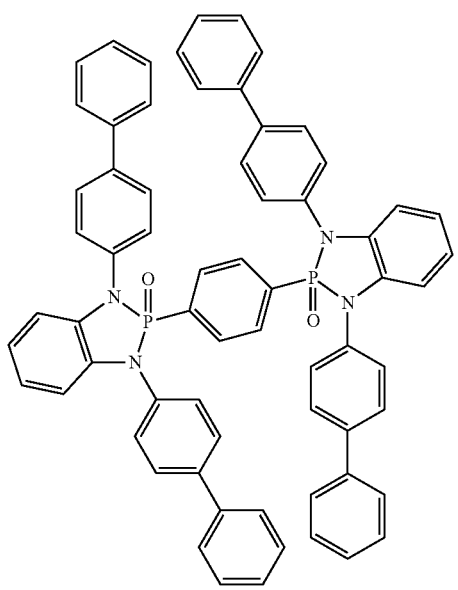
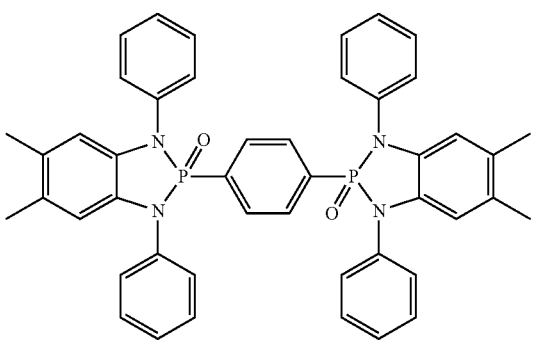
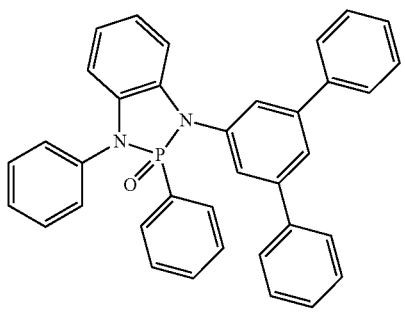
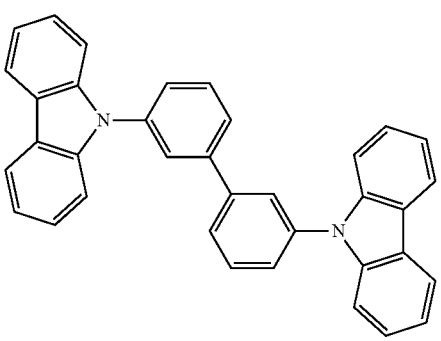

The preferred embodiments of the emitting layer and of the other layers of the OLED are indicated below.

In general, all materials as are used in accordance with the prior art can be used in the emitting layer or emitting layers.

Preferred embodiments of the phosphorescent compound which is present in a phosphorescent emitting layer are indicated below.

Suitable phosphorescent compounds are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (16) to (19),

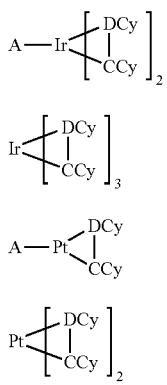

formula (16)

formula (17)

formula (18)

formula (19)

where R¹ has the same meaning as described above for formula (1), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents R¹; the groups DCy and CCy are connected to one another via a covalent bond;

CCy is, identically or differently on each occurrence, a cyclic group which contains a carbon atom via which the cyclic group is bonded to the metal and which may in turn carry one or more substituents R¹;

A is, identically or differently on each occurrence, a monoanionic, bidentate-chelating ligand, preferably a diketonate ligand.

A bridge may also be present between the groups DCy and CCy through the formation of ring systems between a plurality of radicals R¹. Furthermore, a bridge may also be present between two or three ligands CCy-DCy or between one or two ligands CCy-DCy and the ligand A through the formation of ring systems between a plurality of radicals R¹, so that the ligand system is polydentate or polypodal.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973, WO 2009/146770, WO 2010/031485, WO 2010/086089, WO 2010/099852 and the unpublished application DE 102009041414.2. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit with which emission colour.

Suitable matrix materials for the phosphorescent compound are various materials as are used in accordance with the prior art as matrix materials for phosphorescent compounds. Suitable matrix materials for the phosphorescent emitter are aromatic ketones, aromatic phosphine oxides or aromatic sulfoxides or sulfones, for example in accordance with WO 2004/013080, WO 2004/093207, WO 2006/005627 or WO 2010/006680, triarylamines, carbazole derivatives, for example CBP (N,N-biscarbazolylbiphenyl), mCBP or the carbazole derivatives disclosed in WO 2005/039246, US 2005/0069729, JP 2004/288381, EP 1205527 or WO 2008/086851, indolocarbazole derivatives, for example in accordance with WO 2007/063754 or WO 2008/056746, azacarbazole derivatives, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2007/063754, WO 2008/056746, WO 2010/015306 or in accordance with the unpublished applications DE 102009053382.6 or DE 102009053645.0, zinc complexes, for example in accordance with EP 652273 or WO 09/062,578, diazasilole or tetraazasilole derivatives, for example in accordance with WO 2010/054729, the diazaphosphole derivatives, for example in accordance with WO 2010/054730, indenocarbazole derivatives, for example in accordance with the unpublished applications DE 102009023155.2 and DE 102009031021.5, bridged triarylamine derivatives, for example in accordance with WO 2007/031165 or the unpublished applications DE 102009048791.3 and DE 102009053836.4, or the bridged compounds, in particular benzofuranyldibenzofuran derivatives in accordance with WO 2009/148015.

It may also have advantages to use a mixture of a hole-conducting and an electron-conducting matrix material in the phosphorescent emitting layer. Suitable for this purpose are mixtures of the above-mentioned materials.

It may furthermore have advantages to use a mixture of an electron-conducting matrix material and a further matrix material which has neither electron-conducting nor hole-conducting properties in the phosphorescent emitter layer. This enables the efficiency and lifetime of the organic electroluminescent device to be increased (see, for example, WO 2010/108579).

It may furthermore have advantages to use a mixture of two or more phosphorescent emitters and a further matrix material in the emitting layer (see, for example, WO 2010/069442).

If the emitting layer is a fluorescent layer, this is preferably a layer which comprises a blue- or green-, in particular blue-fluorescent dopant and a matrix material.

Suitable blue- and green-fluorescent dopants are selected, for example, from the group of the monostyrylamines, the distyrylamines, the tristyrylamines, the tetrastyrylamines, the styrylphosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted.

Corresponding phosphines and ethers are defined analogously to the amines. For the purposes of this invention, an arylamine or aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic pyrenamines, aromatic pyrenediamines, aromatic chrysenamines or aromatic chrysenediamines. An aromatic anthracenamine is taken to mean a compound in which a diarylamino group is bonded directly to an anthracene group, preferably in the 9-position or in the 2-position. Aromatic pyrenamines, pyrenediamines, chrysenamines and chrysenediamines are defined analogously thereto, where the diarylamino groups on the pyrene are preferably bonded in the 1-position or in the 1,6-position. Further preferred dopants are selected from indenofluorenamines or indenofluorenediamines, for example in accordance with WO 2006/108497 or WO 2006/122630, benzoindenofluorenamines or benzoindenofluorenediamines, for example in accordance with WO 2008/006449, and dibenzoindenofluorenamines or dibenzoindenofluorenediamines, for example in accordance with WO 2007/140847. Examples of dopants from the class of the styrylamines are substituted or unsubstituted tristilbenamines or the dopants described in WO 2006/000388, WO 2006/058737, WO 2006/000389, WO 2007/065549 and WO 2007/115610. Furthermore suitable are the hydrocarbons disclosed in WO 2010/012328.

Suitable host materials (matrix materials) for the fluorescent dopants, in particular for the above-mentioned dopants, are selected, for example, from the classes of the oligoarylenes (for example 2, 2',7,7'-tetraphenylspirobifluorene in accordance with EP 676461 or dinaphthylanthracene), in particular the oligoarylenes containing condensed aromatic groups, in particular anthracene derivatives, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052), the benzanthracene derivatives (for example benz[a]anthracene derivatives in accordance with WO 2008/145239 or in accordance with the unpublished application DE 102009034625.2) and the benzophenanthrene derivatives (for example benzo[c]phenanthrene derivatives in accordance with WO 2010/083869). Particularly preferred host materials are selected from the classes of the oligoarylenes, containing phenyl, naphthalene, anthracene, benzanthracene, in particular benz[a]anthracene, benzophenanthrene, in particular benzo[c]phenanthrene, and/or pyrene, or atropisomers of these compounds. For the purposes of this invention, an oligoarylene is intended to be taken to mean a compound in which at least three aryl or arylene groups are bonded to one another.

Apart from cathode, anode, the emitting layer and the hole-transport layer according to the invention comprising HTM-1 and HTM-2, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, two or more emitting layers may be present, which thus generate white emission. The use of three or more emitting layers may also be preferred. Furthermore, interlayers may be present between a plurality of emitting layers. Furthermore, these additional layers, for example the charge-transport layers, may also be doped. The doping of the layers may be advantageous for improved charge transport. However, it should be pointed out that each of these layers does not necessarily have to be present, and the choice of the layers is always dependent on the compounds used.

The use of layers of this type is known to the person skilled in the art, and he will be able, without inventive step, to use all materials in accordance with the prior art which are known for layers of this type for this purpose.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali metal or alkaline-earth metal and silver, particularly preferably an alloy comprising Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). Organic alkali metal or alkaline-earth metal complexes, such as, for example, lithium quinolinate (LiQ), are likewise suitable. The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. At least one of the electrodes here must be transparent or partially transparent in order to facilitate the coupling-out of light. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

It is generally possible to employ all further materials as employed in accordance with the prior art in organic electroluminescent devices, also in combination with the hole-transport layer according to the invention.

Suitable charge-transport materials, as can be used in the hole-injection or hole-transport layer or in the electron-transport layer of the organic electroluminescent device according to the invention, are, for example, the compounds disclosed in Y. Shirota et al., Chem. Rev. 2007, 107(4), 953-1010, or other materials as employed in accordance with the prior art in these layers.

Examples of preferred hole-transport materials which can be used in a hole-transport or hole-injection layer in the electroluminescent device according to the invention are indenofluorenamines and derivatives (for example in accordance with WO 2006/122630 or WO 2006/100896), the amine derivatives disclosed in EP 1661888, hexaazatriphenylene derivatives (for example in accordance with WO 2001/049806), amine derivatives containing condensed aromatic ring systems (for example in accordance with U.S. Pat. No. 5,061,569), the amine derivatives disclosed in WO 95/09147, monobenzoindenofluorenamines (for example in accordance with WO 2008/006449) or dibenzoindenofluorenamines (for example in accordance with WO 2007/140847). Hole-transport and hole-injection materials which are furthermore suitable are derivatives of the compounds depicted above, as disclosed in JP 2001/226331, EP 676461, EP 650955, WO 2001/049806, U.S. Pat. No. 4,780,536, WO 98/30071, EP 891121, EP 1661888, JP 2006/253445, EP 650955, WO 2006/073054 and U.S. Pat. No. 5,061,569.

Suitable hole-transport or hole-injection materials are furthermore all materials mentioned above for HTM-1.

Materials which can be used for the electron-transport layer are all materials as used in accordance with the prior art as electron-transport materials in the electron-transport layer. Particularly suitable are aluminium complexes, for example $Alq_3$, zirconium complexes, for example $Zrq_4$, benzimidazole derivatives, triazine derivatives or aromatic ketones. Suitable materials are, for example, the materials listed in the following table. Other suitable materials are derivatives of the compounds depicted above, as disclosed in JP 2000/053957, WO 2003/060956, WO 2004/028217, WO 2004/080975 and WO 2010/072300.

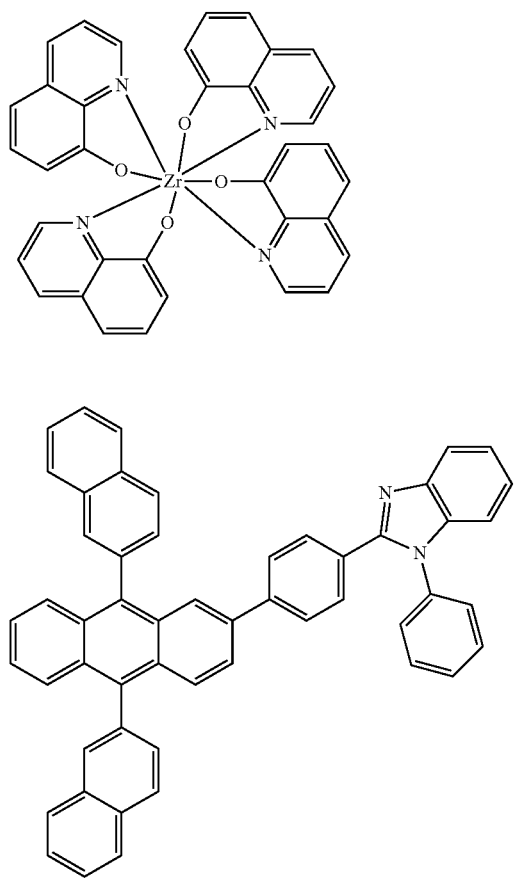

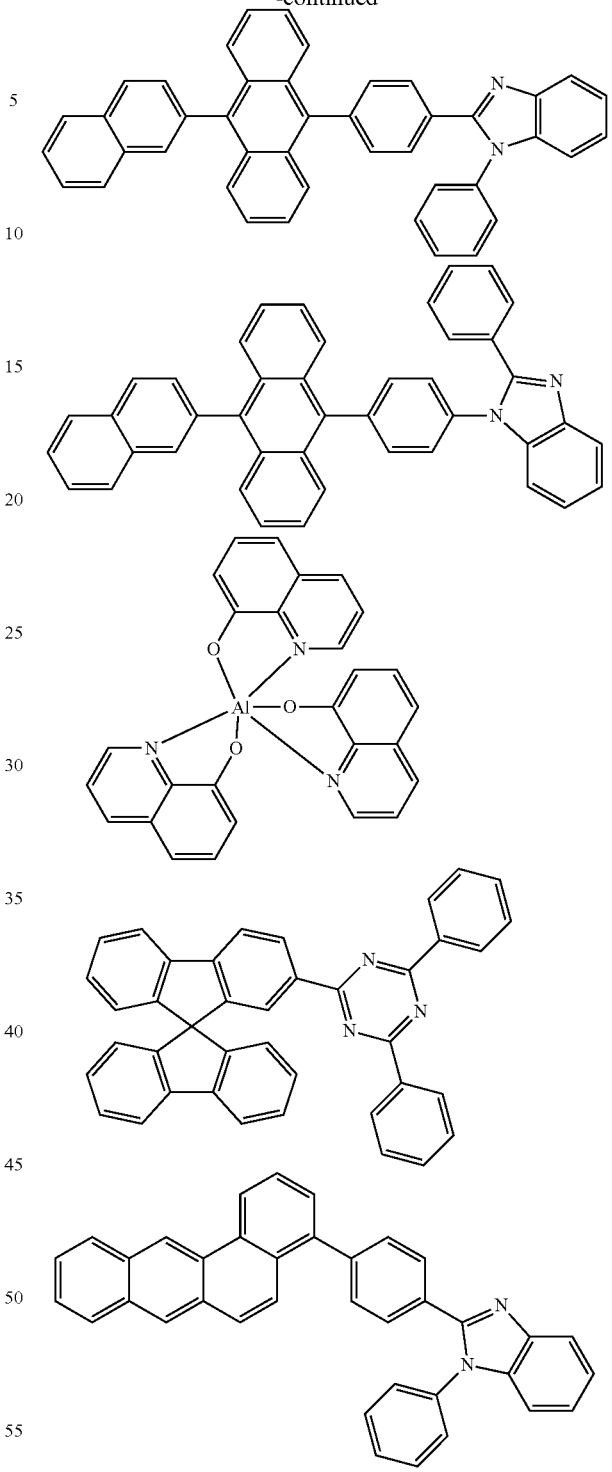

It is furthermore possible for the electron-transport layer to be doped. Suitable dopants are alkali metals or alkali-metal compounds, such as, for example, LiQ (lithium quinolinate). In a preferred embodiment of the invention, the electron-transport layer is doped, in particular, when the electron-transport material is a benzimidazole derivative or a triazine derivative. The preferred dopant is then LiQ.

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced by applying one or more layers from solution and applying one or more other layers by vapour deposition.

These processes are generally known to the person skilled in the art and can be applied by him without inventive step to the organic electroluminescent devices according to the invention.

The organic electroluminescent device according to the invention has one or more of the following surprising advantages over the prior art:
1. The organic electroluminescent device according to the invention has improved efficiency.
2. The organic electroluminescent device according to the invention at the same time has an improved lifetime.
3. The organic electroluminescent device according to the invention has reduced roll-off, i.e. a reduced reduction in the efficiency at high luminous density.
4. Many triarylamine derivatives, which are used as pure layer, have processing problems, such as, for example, crystallisation of the material on the shadow mask. This problem is reduced or eliminated through the use of a mixture of HTM-1 and HTM-2, so that the organic electroluminescent device according to the invention can be produced with lower technical complexity than electroluminescent devices which, instead of the layer according to the invention, comprise a pure layer of a triarylamine derivative.

The organic electroluminescent device according to the invention can be used for various applications, for example for mono- or polychromatic displays, for lighting applications, for medical applications, for example in phototherapy, or for organic lasers (O-lasers).

The invention is described in greater detail by the following examples, without wishing to restrict it thereby. The person skilled in the art will be able, without being inventive, to carry out the invention throughout the range disclosed and thus produce further organic electroluminescent devices according to the invention.

EXAMPLES

Production of OLEDs

OLEDs according to the invention and OLEDs in accordance with the prior art are produced by a general process in accordance with WO 2004/058911, which is adapted to the circumstances described here (layer-thickness variation, materials used).

The data for various OLEDs are presented in Examples V1-E34 below (see Tables 1 and 2). Glass plates coated with structured ITO (indium tin oxide) in a thickness of 150 nm are coated with 20 nm of PEDOT (poly(3,4-ethylenedioxy-2,5-thiophene), applied by spin coating from water; purchased from H. C. Starck, Goslar, Germany) for improved processing.

These coated glass plates form the substrates to which the OLEDs are applied. The OLEDs have in principle the following layer structure: substrate/hole-injection layer (HIL)/optional interlayer (IL)/hole-transport layer (HTL)/emission layer (EML)/optional hole-blocking layer (HBL)/electron-transport layer (ETL)/optional electron-injection layer (EIL) and finally a cathode. The cathode is formed by an aluminium layer with a thickness of 100 nm. The hole-transport layer here can consist of two individual layers HTL1 and HTL2. The precise structure of the OLEDs is shown in Table 1. The materials used for the production of the OLEDs are shown in Table 3.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. Information such as ST1:TEG1 (85%:15%) means that material ST1 is present in the layer in a proportion by volume of 85% and TEG1 is present in the layer in a proportion by volume of 15%. Analogously, the electron-transport layer may also consist of a mixture of two materials. In particular, the hole-transport layers according to the invention consist of a mixture of two materials.

The OLEDs are characterised by standard methods. For this purpose, the electroluminescence spectra, the current efficiency (measured in cd/A), the power efficiency (measured in lm/WV) and the external quantum efficiency (EQE, measured in percent) as a function of the luminous density, calculated from current/voltage/luminous density characteristic lines (IUL characteristic lines), and the lifetime are determined.

The parameter S is a measure of the strength of the "roll-off", i.e. of the drop in efficiency towards higher luminous densities. It is defined as the current efficiency at 5000 cd/m$^2$ divided by the current efficiency at 500 cd/m$^2$.

The lifetime LT is defined as the time after which the luminous density drops from the initial luminous density L0 to a certain proportion L1 on operation with constant current. A specification of L0=4000 cd/m$^2$ and L1=80% in Table 2 means that the lifetime indicated in column LT corresponds to the time after which the initial luminous density of the corresponding OLED drops from 4000 cd/m$^2$ to 3200 cd/m$^2$. The values for the lifetime can be converted into a figure for other initial luminous densities with the aid of conversion formulae known to the person skilled in the art. The lifetime for an initial luminous density of 1000 cd/m$^2$ is the usual specification here.

The data for the various OLEDs are summarised in Table 2. Examples V1-V13 are comparative examples in accordance with the prior art, examples E1-E34 show data for OLEDs according to the invention. Examples N1-N3 show examples which are not in accordance with the invention, which serve for comparison with the examples according to the invention and illustrate the advantages thereof.

Determination of the HOMO/LUMO Positions and the Triplet Level

The HOMO and LUMO positions and the triplet level of the materials are determined via quantum-chemical calculations. To this end, the "Gaussian-03W" software package (Gaussian Inc.) is used. In order to calculate organic substances without metals (denoted by method "org." in Table 4), firstly a geometry optimisation is carried out using the "ground state/semiempirical/default spin/AM1/charge 0/spin singlet" method. This is followed by an energy calculation on the basis of the optimised geometry. The "TDSFC/DFT/default spin/B3PW91" method with the "6-31G(d)" base set is used here (charge 0, spin singlet). For organometallic compounds (denoted by method "M-org." in Table 4), the geometry is optimised via the "ground state/Hartree-Fock/default spin/LanL2MB/charge 0/spin singlet" method. The energy calculation is carried out analogously to the organic substances as described above, with the difference that the "LanL2DZ" base set is used for the metal atom and the "6-31G(d)" base set is used for the ligands. The energy calculation gives the HOMO HEh or LUMO LEh in Hartree units. The HOMO and LUMO values calibrated with reference to cyclic voltammetry measurements are determined therefrom in electron volts as follows:

$HOMO(eV) = ((HEh*27.212) - 0.9899)/1.1206$ $LUMO(eV) = ((LEh*27.212) - 2.0041)/1.385$

For the purposes of this application, these values are to be regarded as HOMO and LUMO respectively of the materials. As an example, an HOMO of −0.17519 Hartrees and an LUMO of −0.04192 Hartrees are obtained from the calculation for substance A1, which corresponds to a calibrated HOMO of −5.14 eV and a calibrated LUMO of −2.27 eV.

The triplet level TL is defined as the energy of the triplet state having the lowest energy, which arises from the quantum-chemical calculation.

Table 4 shows the HOMO and LUMO values and the triplet levels TL of the various materials.

Description of the Improvement in the "Roll-Off" Behaviour

Figure 3:
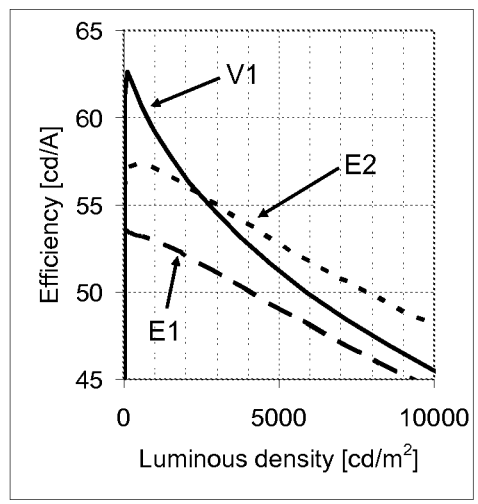
FIGS. 3 and 4 show the dependence of the efficiency on the luminous density for the OLEDs of Examples V1 and E1-E4.
Figure 4:
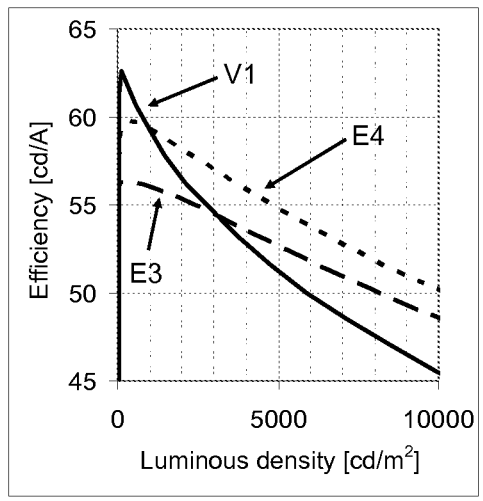

FIGS. 3 and 4 show the dependence of the efficiency on the luminous density for the OLEDs of Examples V1 and E1-E4. The drop towards higher luminous densities ("roll-off") is typical of OLEDs of all types, but in particular of OLEDs comprising phosphorescent dopants. It is evident that the use of a hole-transport layer according to the invention enables the shape of the efficiency curve to be significantly influenced positively, i.e. the curve is significantly flatter than in the case of the use of a hole-transport layer in accordance with the prior art. This applies both to a layer consisting of A1 and C1 in addition to a layer of A1 with a thickness of 70 nm (Examples E3 and E4), and also in the case of replacement of the entire layer A1 by a layer consisting of A1 and C1 (Examples E1 and E2). The improvement in the "roll-off" is evident from an increase in the parameter S, which improves from 0.84 (Example V1) to 0.92 (Examples E1, E2, E3) or 0.94 (Example E4). Although the efficiency is higher at very low luminous densities in the case of OLEDs in accordance with the prior art, this is compensated by the improved efficiency at high luminous densities in OLEDs according to the invention, since the OLED in a display is typically operated over the entire luminous density range and the highest power consumption takes place at high luminous densities.

Relevance of the HOMO/LUMO Positions

If materials which do not conform to the HOMO/LUMO conditions according to the invention are used in the hole-transport layer, an impairment or at least no significant improvement compared with the prior art is obtained. For example, although a very slight improvement in the roll-off can be achieved with compound TEG1 in combination with A2, a significantly increased operating voltage, worse efficiency and a lifetime which is reduced by 60% are obtained (Examples V5, N2). Although a good voltage can be achieved with IC1 as second component, the efficiency is, however, reduced and the lifetime is virtually halved (Examples V5, N3). Similar effects are evident on use of the combination A1/A4, where, although a slightly improved efficiency is obtained, a significantly increased operating voltage and a reduced lifetime are also obtained (Examples V1, V9, N11). It should be pointed out that the slightly different dopant concentration in Examples V1 and V9 (15% compared with 12%) only has a negligible influence on the data for the OLEDs.

By contrast, examples according to the invention with the same materials (A1, A2 and A4) exhibit significant improvements (Examples

| V1 | HTM1 | HIL1 | — | A1 | IC1:TEG1 | — | ST1:LiQ | — |
|---|---|---|---|---|---|---|---|---|
| | 70 nm | 5 nm | | 90 nm | (85%:15%) 30 nm | | (50%:50%) 40 nm | |

-V7, V9, V13, E1-E9, E12-E16, E19-E23, E26, E27-E32, E34).

Description of Selected Examples

Some of the examples are explained in greater detail below in order to illustrate the advantages of the hole-transport layers according to the invention. However, it should be pointed out that this only represents a selection of the data shown in Table 2. As revealed by the table, significant improvements compared with the prior art are also achieved on use of the hole-transport layers according to the invention which are not described in greater detail, in some cases in all parameters, but in some cases only an improvement of roll-off or efficiency or lifetime or processability can be observed. However, even the improvement in one of the said parameters represents a significant advance, since various applications require optimisation with respect to different parameters.

It has already been described above that hole-transport layers according to the invention improve the roll-off. However, a significant improvement in the lifetime and/or efficiency can also be achieved in addition in some cases. For example, the use of a 50%:50% mixture of A3 and C6 produces a virtually 15% increased efficiency in addition to the improvement of S from 0.88 to 0.93. Since the voltage only increases very slightly, a significantly improved power efficiency is also obtained thereby. In addition, the lifetime increases very clearly by about 60% (Examples V8, E17).

Improvements can also be observed in OLEDs comprising fluorescent emitters: Thus, the external quantum efficiency increases from 6.3% to 7.6% through the use of a mixture of A1 and C1 compared with a hole-transport layer comprising pure A1, while the lifetime improves slightly from 180 h to 195 h (Examples V13, E28). The CIE x/y colour coordinates of the OLEDs from these examples are 0.14/0.16, which corresponds to a deepblue colour.

Figure 5:
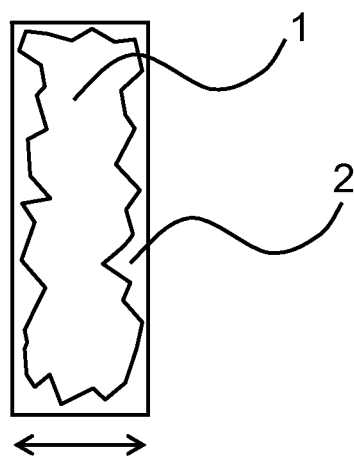
FIG. 5a shows the formation of an edge comprising material A2 on a slot with a width of 200 μm in a shadow mask after vapour-deposition of a layer with a thickness of 3.7 μm.
FIG. 5b shows the edge after vapour-deposition of a layer with a thickness of 3.7 μm comprising a 50%:50% mixture of A2 and C7.
Figure 5:
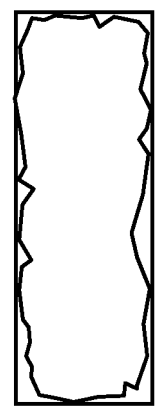

The use of the pure hydrocarbon C7 in combination with A2 (Examples V6, E26, E27) demonstrates a further advantage of hole-transport layers according to the invention. While pure hole-transport materials in some cases tend towards crystallisation on the shadow mask, which is required during the production of coloured displays, this effect is significantly reduced on use of a hole-transport layer according to the invention (see FIGS. 5 a and b). "1" here denotes the opening of the shadow mask ("slot") and "2" denotes the edge comprising material A2. FIG. 5a shows the formation of an edge comprising material A2 on a slot with a width of 200 μm in a shadow mask after vapour-deposition of a layer with a thickness of 3.7 μm. FIG. 5b shows the edge after vapour-deposition of a layer with a thickness of 3.7 μm comprising a 50%:50% mixture of A2 and C7. After vapour-deposition of 3.7 μm of the pure substance A2, a significant edge is evident on a slot with a width of 200 μm. It can be seen. After vapour-deposition of the same layer thickness of a mixed layer comprising C7 and A2, this effect is significantly more weakly pronounced.

TABLE 1

| Ex. | HTL thickness | IL thickness | HTL1 thickness | HTL2 thickness | EML thickness | HBL thickness | ETL thickness | EIL thickness |
|---|---|---|---|---|---|---|---|---|
| V1 | HTM1 70 nm | HIL1 5 nm | — | A1 90 nm | IC1:TEG1 (85%:15%) 30 nm | — | ST1:LiQ (50%:50%) 40 nm | — |
| V2 | HTM1 70 nm | HIL1 5 nm | — | A1 90 nm | IC1:TEG1 (88%:12%) 30 nm | ST1 10 nm | ST1:LiQ (50%:50%) 30 nm | — |
| V3 | HTM1 70 nm | HIL1 5 nm | — | A1 90 nm | ST1:TEG1 (85%:15%) 30 nm | — | ST1:LiQ (50%:50%) 40 nm | — |
| V4 | HTM1 70 nm | HIL1 5 nm | — | A1 90 nm | IC2:TEG1 (85%:15%) 30 nm | — | ST1:LiQ (50%:50%) 40 nm | — |
| V5 | HTM1 70 nm | HIL1 5 nm | — | A2 90 nm | IC1:TEG1 (90%:10%) 30 nm | — | ST1:LiQ (50%:50%) 40 nm | — |
| V6 | HTM1 70 nm | HIL1 5 nm | — | A2 90 nm | IC1:TEG1 (90%:10%) 30 nm | ST1 10 nm | ST1:LiQ (50%:50%) 40 nm | — |
| V7 | HTM1 70 nm | HIL1 5 nm | — | A2 90 nm | IC2:TEG1 (90%:10%) 30 nm | — | ST1:LiQ (50%:50%) 40 nm | — |
| V8 | HTM1 70 nm | HIL1 5 nm | — | A3 90 nm | IC1:TEG1 (88%:12%) 30 nm | ST1 10 nm | ST1:LiQ (50%:50%) 30 nm | — |
| V9 | HTM1 70 nm | HIL1 5 nm | NPB 50 nm | A4 40 nm | IC1:TEG1 (88%:12%) 30 nm | — | ST1:LiQ (50%:50%) 30 nm | — |
| V10 | HTM1 20 nm | — | — | NPB 20 nm | ST1:TER1 (85%:15%) 30 nm | — | Alq$_3$ 20 nm | LiF 1 nm |
| V11 | HTM1 20 nm | — | — | NPB 20 nm | ST1:TER2 (85%:15%) 30 nm | — | Alq$_3$ 20 nm | LiF 1 nm |
| V12 | HTM1 70 nm | HIL1 5 nm | — | A5 90 nm | IC1:TEG1 (85%:15%) 30 nm | — | ST1:LiQ (50%:50%) 40 nm | — |
| V13 | HTM1 140 nm | HIL1 5 nm | — | A1 20 nm | M1:D1 (95%:5%) 20 nm | — | ST2:LiQ (50%:50%) 30 nm | — |
| N1 | HTM1 70 nm | HIL1 5 nm | NPB 50 nm | A1:A4 (60%:40%) 90 nm | IC1:TEG1 (88%:12%) 30 nm | — | ST1:LiQ (50%:50%) 30 nm | — |
| N2 | HTM1 70 nm | HIL1 5 nm | A2 50 nm | A2:TEG1 (80%:40%) 50 nm | IC1:TEG1 (90%:10%) 30 nm | — | ST1:LiQ (50%:50%) 30 nm | — |
| N3 | HTM1 70 nm | HIL1 5 nm | A2 50 nm | A2:IC1 (80%:30%) 50 nm | IC1:TEG1 (90%:10%) 30 nm | — | ST1:LiQ (50%:50%) 30 nm | — |
| E1 | HTM1 70 nm | HIL1 5 nm | — | A1:C1 (45%:55%) 90 nm | IC1:TEG1 (85%:15%) 30 nm | — | ST1:LiQ (50%:50%) 40 nm | — |
| E2 | HTM1 70 nm | HIL1 5 nm | — | A1:C1 (55%:45%) 90 nm | IC1:TEG1 (85%:15%) 30 nm | — | ST1:LiQ (50%:50%) 40 nm | — |
| E3 | HTM1 70 nm | HIL1 5 nm | A1 70 nm | A1:C1 (45%:55%) 20 nm | IC1:TEG1 (85%:15%) 30 nm | — | ST1:LiQ (50%:50%)40 nm | — |
| E4 | HTM1 70 nm | HIL1 5 nm | A1 70 nm | A1:C1 (55%:45%) 20 nm | IC1:TEG1 (85%:15%) 30 nm | — | ST1:LiQ (50%:50%)40 nm | — |
| E5 | HTM1 70 nm | HIL1 5 nm | A1 70 nm | A1:C1 (55%:45%) 20 nm | ST1:TEG1 (85%:15%) 30 nm | — | ST1:LiQ (50%:50%) 40 nm | — |
| E6 | HTM1 70 nm | HIL1 5 nm | A1 70 nm | A1:C1 (55%:45%) 20 nm | IC2:TEG1 (85%:15%) 30 nm | — | ST1:LiQ (50%:50%) 40 nm | — |
| E7 | HTM1 70 nm | HIL1 5 nm | — | A1:C2 (45%:55%) 90 nm | IC1:TEG1 (85%:15%) 30 nm | — | ST1:LiQ (50%:50%) 40 nm | — |
| E8 | HTM1 70 nm | HIL1 5 nm | — | A1:C3 (50%:50%) 90 nm | IC1:TEG1 (85%:15%) 30 nm | — | ST1:LiQ (50%:50%) 40 nm | — |
| E9 | HTM1 70 nm | HIL1 5 nm | A1 70 nm | A1:C4 (45%:55%) 20 nm | IC1:TEG1 (85%:15%) 30 nm | — | ST1:LiQ (50%:50%) 40 nm | — |
| E10 | HTM1 70 nm | HIL1 5 nm | A1 70 nm | A1:C8 (55%:45%) 20 nm | IC1:TEG1 (85%:15%) 30 nm | — | ST1:LiQ (50%:50%)40 nm | — |
| E11 | HTM1 20 nm | — | — | NPB:C1 (40%:60%) 20 nm | ST1:TER1 (85%:15%) 30 nm | — | Alq$_3$ 20 nm | LiF 1 nm |
| E12 | HTM1 70 nm | HIL1 5 nm | — | A2:C1 (50%:50%) 90 nm | IC1:TEG1 (90%:10%) 30 nm | — | ST1:LiQ (50%:50%) 40 nm | — |
| E13 | HTM1 70 nm | HIL1 5 nm | — | A2:C1 (60%:40%) 90 nm | IC1:TEG1 (90%:10%) 30 nm | — | ST1:LiQ (50%:50%) 40 nm | — |
| E14 | HTM1 70 nm | HIL1 5 nm | — | A2:C1 (70%:30%) 90 nm | IC1:TEG1 (90%:10%) 30 nm | — | ST1:LiQ (50%:50%) 40 nm | — |

TABLE 1-continued

| Ex. | HTL thickness | IL thickness | HTL1 thickness | HTL2 thickness | EML thickness | HBL thickness | ETL thickness | EIL thickness |
|---|---|---|---|---|---|---|---|---|
| E15 | HTM1 70 nm | HIL1 5 nm | — | A2:C4 (70%:30%) 90 nm | IC1:TEG1 (90%:10%) 30 nm | — | ST1:LiQ (50%:50%) 40 nm | — |
| E16 | HTM1 70 nm | HIL1 5 nm | — | A2:C1 (70%:30%) 90 nm | IC2:TEG1 (90%:10%) 30 nm | — | ST1:LiQ (50%:50%) 40 nm | — |
| E17 | HTM1 70 nm | HIL1 5 nm | A3 40 nm | A3:C6 (50%:50%) 50 nm | IC1:TEG1 (88%:12%) 30 nm | ST1 10 nm | ST1:LiQ (50%:50%) 30 nm | — |
| E18 | HTM1 70 nm | HIL1 5 nm | — | A3:C6 (50%:50%) 90 nm | IC1:TEG1 (88%:12%) 30 nm | ST1 10 nm | ST1:LiQ (50%:50%) 30 nm | — |
| E19 | HTM1 70 nm | HIL1 5 nm | A2 40 nm | A2:C1 (60%:40%) 50 nm | IC1:TEG1 (90%:10%) 30 nm | — | ST1:LiQ (50%:50%) 40 nm | — |
| E20 | HTM1 70 nm | HIL1 5 nm | A2 40 nm | A2:C1 (70%:30%) 50 nm | IC1:TEG1 (90%:10%) 30 nm | — | ST1:LiQ (50%:50%) 40 nm | — |
| E21 | HTM1 70 nm | HIL1 5 nm | NPB 50 nm | A4:C4 (45%:55%) 40 nm | IC1:TEG1 (88%:12%) 30 nm | — | ST1:LiQ (50%:50%) 30 nm | — |
| E22 | HTM1 70 nm | HIL1 5 nm | — | A1:C6 (30%:70%) 90 nm | IC1:TEG1 (88%:12%) 30 nm | ST1 10 nm | ST1:LiQ (50%:50%) 30 nm | — |
| E23 | HTM1 70 nm | HIL1 5 nm | — | A1:C6 (50%:50%) 90 nm | IC1:TEG1 (88%:12%) 30 nm | ST1 10 nm | ST1:LiQ (50%:50%) 30 nm | — |
| E24 | HTM1 20 nm | — | — | NPB:C1 (40%:60%) 20 nm | ST1:TER2 (85%:15%) 30 nm | — | Alq$_3$ 20 nm | LiF 1 nm |
| E25 | HTM1 70 nm | HIL1 5 nm | — | A5:C1 (50%:50%) 90 nm | IC1:TEG1 (85%:15%) 30 nm | — | ST1:LiQ (50%:50%) 40 nm | — |
| E26 | HTM1 70 nm | HIL1 5 nm | — | A2:C7 (50%:50%) 90 nm | IC1:TEG1 (90%:10%) 30 nm | ST1 10 nm | ST1:LiQ (50%:50%) 40 nm | — |
| E27 | HTM1 70 nm | HIL1 5 nm | — | A2:C7 (60%:40%) 90 nm | IC1:TEG1 (90%:10%) 30 nm | ST1 10 nm | ST1:LiQ (50%:50%) 40 nm | — |
| E28 | HTM1 140 nm | HIL1 5 nm | — | A1:C1 (70%:30%) 20 nm | M1:D1 (95%:5%) 20 nm | — | ST2:LiQ (50%:50%) 30 nm | — |
| E29 | HTM1 70 nm | HIL1 5 nm | — | A1:C9 (65%:35%) 90 nm | IC1:TEG1 (88%:12%) 30 nm | ST1 10 nm | ST1:LiQ (50%:50%) 30 nm | — |
| E30 | HTM1 70 nm | HIL1 5 nm | — | A1:C10 (70%:30%) 90 nm | IC1:TEG1 (88%:12%) 30 nm | ST1 10 nm | ST1:LiQ (50%:50%) 30 nm | — |
| E31 | HTM1 70 nm | HIL1 5 nm | — | A2:C8 (70%:30%) 90 nm | IC1:TEG1 (90%:10%) 30 nm | ST1 10 nm | ST1:LiQ (50%:50%) 40 nm | — |
| E32 | HTM1 70 nm | HIL1 5 nm | A2 40 nm | A2:C8 (70%:30%) 50 nm | IC1:TEG1 (90%:10%) 30 nm | ST1 10 nm | ST1:LiQ (50%:50%) 40 nm | — |
| E33 | HTM1 70 nm | HIL1 5 nm | — | A1:C11 (45%:55%) 90 nm | IC1:TEG1 (85%:15%) 30 nm | — | ST1:LiQ (50%:50%) 40 nm | — |
| E34 | HTM1 70 nm | HIL1 5 nm | — | A1:C12 (60%:40%) 90 nm | IC1:TEG1 (85%:15%) 30 nm | — | ST1:LiQ (50%:50%) 40 nm | — |

TABLE 2

Data for the OLEDs

| Ex. | Voltage for 1000 cd/m$^2$ | Efficiency at 5000 cd/m$^2$ | EQE at 5000 cd/m$^2$ | L0 cd/m$^2$ | L1 % | LT | S |
|---|---|---|---|---|---|---|---|
| V2 | 3.5 V | 52.6 cd/A | 14.6% | 4000 | 80 | 420 h | 0.84 |
| V2 | 3.5 V | 53.3 cd/A | 14.8% | 4000 | 80 | 430 h | 0.86 |
| V3 | 4.0 V | 48.1 cd/A | 13.3% | 4000 | 80 | 330 h | 0.92 |
| V4 | 3.4 V | 46.7 cd/A | 13.0% | 4000 | 80 | 390 h | 0.85 |
| V5 | 3.6 V | 53.8 cd/A | 14.9% | 4000 | 80 | 520 h | 0.89 |
| V6 | 3.6 V | 54.1 cd/A | 15.0% | 4000 | 80 | 520 h | 0.89 |
| V7 | 3.3 V | 48.7 cd/A | 13.5% | 4000 | 80 | 500 h | 0.88 |
| V8 | 3.6 V | 51.3 cd/A | 14.2% | 4000 | 80 | 440 h | 0.88 |
| V9 | 3.9 V | 54.9 cd/A | 15.3% | 4000 | 80 | 410 h | 0.89 |
| V10 | 5.0 V | 7.4 cd/A | 10.9% | 4000 | 80 | 480 h | 0.98 |
| V11 | 6.5 V | 4.3 cd/A | 5.7% | 4000 | 80 | 530 h | 0.70 |
| V12 | 3.7 V | 49.0 cd/A | 13.7% | 4000 | 80 | 340 h | 0.79 |
| V13 | 4.5 V | 8.0 cd/A | 6.3% | 6000 | 50 | 180 h | 0.74 |
| N1 | 3.9 V | 54.1 cd/A | 15.0% | 4000 | 80 | 310 h | 0.85 |
| N2 | 4.6 V | 48.6 cd/A | 13.5% | 4000 | 80 | 290 h | 0.90 |
| N3 | 3.6 V | 51.9 cd/A | 14.4% | 4000 | 80 | 250 h | 0.91 |
| E1 | 3.9 V | 52.3 cd/A | 14.5% | 4000 | 80 | 620 h | 0.92 |
| E2 | 3.6 V | 56.8 cd/A | 15.9% | 4000 | 80 | 600 h | 0.92 |
| E3 | 3.5 V | 54.4 cd/A | 15.3% | 4000 | 80 | 650 h | 0.92 |
| E4 | 3.5 V | 56.0 cd/A | 15.5% | 4000 | 80 | 610 h | 0.94 |
| E5 | 4.0 V | 50.0 cd/A | 13.9% | 4000 | 80 | 430 h | 0.95 |
| E6 | 3.4 V | 49.0 cd/A | 13.8% | 4000 | 80 | 600 h | 0.93 |
| E7 | 3.6 V | 55.7 cd/A | 15.5% | 4000 | 80 | 570 h | 0.93 |
| E8 | 3.7 V | 53.2 cd/A | 14.8% | 4000 | 80 | 560 h | 0.90 |
| E9 | 3.5 V | 54.7 cd/A | 15.4% | 4000 | 80 | 660 h | 0.92 |
| E10 | 3.5 V | 53.2 cd/A | 14.8% | 4000 | 80 | 510 h | 0.93 |
| E11 | 5.0 V | 7.7 cd/A | 11.4% | 4000 | 80 | 700 h | 0.98 |
| E12 | 4.1 V | 51.3 cd/A | 14.3% | 4000 | 80 | 630 h | 0.99 |
| E13 | 3.9 V | 54.2 cd/A | 15.1% | 4000 | 80 | 650 h | 0.97 |
| E14 | 3.8 V | 55.7 cd/A | 15.5% | 4000 | 80 | 660 h | 0.95 |
| E15 | 4.3 V | 59.2 cd/A | 16.4% | 4000 | 80 | 710 h | 0.92 |
| E16 | 3.5 V | 51.2 cd/A | 14.1% | 4000 | 80 | 640 h | 0.93 |
| E17 | 3.7 V | 58.2 cd/A | 16.1% | 4000 | 80 | 700 h | 0.93 |
| E18 | 3.9 V | 57.3 cd/A | 15.9% | 4000 | 80 | 680 h | 0.94 |
| E19 | 3.7 V | 55.0 cd/A | 15.3% | 4000 | 80 | 630 h | 0.98 |
| E20 | 3.6 V | 55.3 cd/A | 15.4% | 4000 | 80 | 670 h | 0.96 |
| E21 | 3.8 V | 56.7 cd/A | 15.8% | 4000 | 80 | 530 h | 0.97 |
| E22 | 3.9 V | 60.8 cd/A | 16.9% | 4000 | 80 | 700 h | 0.93 |
| E23 | 3.6 V | 58.7 cd/A | 16.3% | 4000 | 80 | 720 h | 0.92 |
| E24 | 5.6 V | 6.0 cd/A | 8.0% | 4000 | 80 | 640 h | 0.86 |
| E25 | 3.8 V | 58.1 cd/A | 16.2% | 4000 | 80 | 570 h | 0.91 |
| E26 | 3.7 V | 58.8 cd/A | 16.3% | 4000 | 80 | 620 h | 0.90 |
| E27 | 3.8 V | 54.4 cd/A | 15.2% | 4000 | 80 | 490 h | 0.89 |
| E28 | 4.4 V | 9.7 cd/A | 7.6% | 6000 | 50 | 195 h | 1.21 |
| E29 | 3.7 V | 53.7 cd/A | 14.9% | 4000 | 80 | 570 h | 0.91 |
| E30 | 3.6 V | 52.0 cd/A | 14.4% | 4000 | 80 | 530 h | 0.93 |

TABLE 2-continued
Data for the OLEDs
| Ex. | Voltage for 1000 cd/m² | Efficiency at 5000 cd/m² | EQE at 5000 cd/m² | L0 cd/m² | L1 % | LT | S |
|---|---|---|---|---|---|---|---|
| E31 | 3.8 V | 57.1 cd/A | 15.9% | 4000 | 80 | 510 h | 0.91 |
| E32 | 3.7 V | 58.8 cd/A | 16.3% | 4000 | 80 | 530 h | 0.92 |
| E33 | 3.6 V | 51.4 cd/A | 14.2% | 4000 | 80 | 620 h | 0.91 |
| E34 | 3.7 V | 54.3 cd/A | 15.1% | 4000 | 80 | 580 h | 0.89 |
TABLE 3
Structural formulae of the materials used
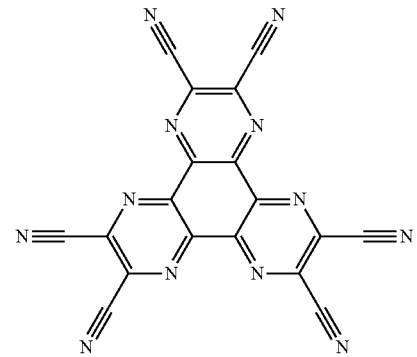 [SMILES: N#Cc1nc2c3nc(C#N)c(C#N)nc3c3nc(C#N)c(C#N)nc3c2nc1C#N]
HIL1
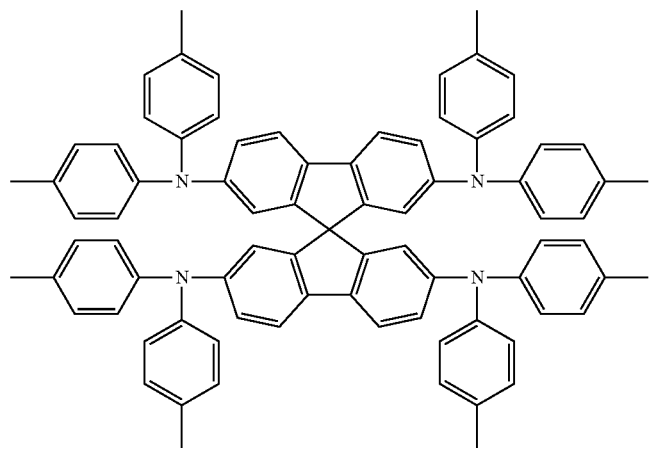
HTM1
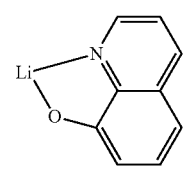
LiQ
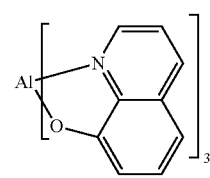
Alq$_3$ TABLE 3-continued
Structural formulae of the materials used
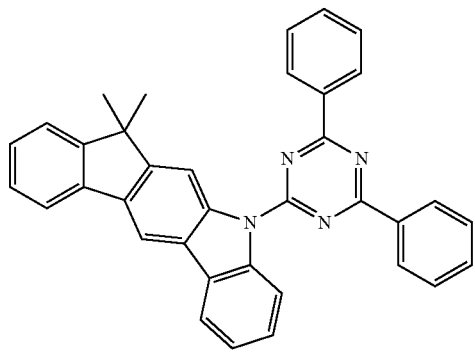 [SMILES: CC1(C)c2ccccc2-c2cc3c4ccccc4n(-c4nc(-c5ccccc5)nc(-c5ccccc5)n4)c3cc21]
IC1
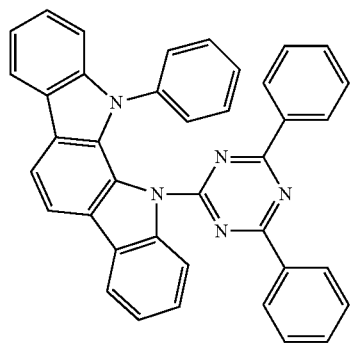 [SMILES: c1ccc(-c2nc(-c3ccccc3)nc(-n3c4ccccc4c4ccc5c6ccccc6n(-c6ccccc6)c5c43)n2)cc1]
IC2
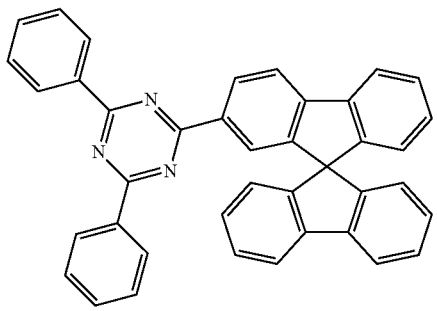 [SMILES: c1ccc(-c2nc(-c3ccccc3)nc(-c3ccc4c(c3)C3(c5ccccc5-c5ccccc53)c3ccccc3-4)n2)cc1]
ST1
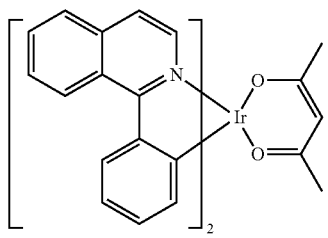
TER1

TABLE 3-continued
Structural formulae of the materials used
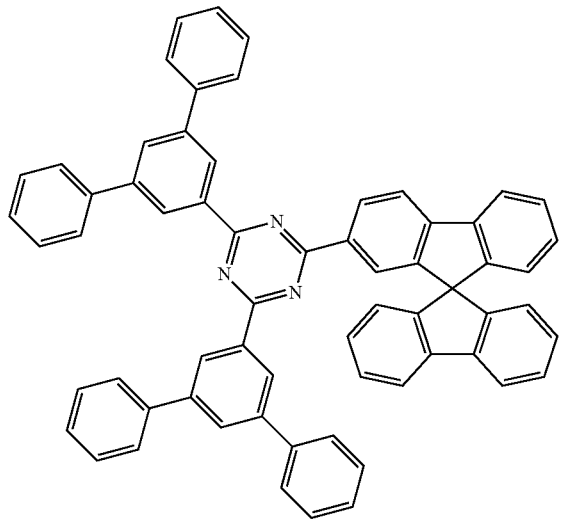 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
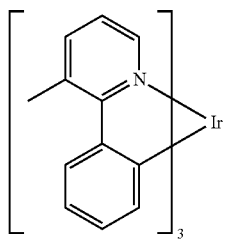
TEG1
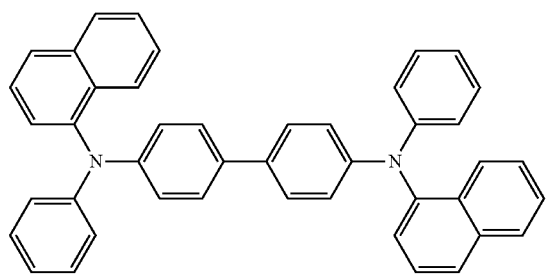 [SMILES: c1ccc(N(c2ccc(-c3ccc(N(c4ccccc4)c4cccc5ccccc45)cc3)cc2)c2cccc3ccccc23)cc1]
NPB
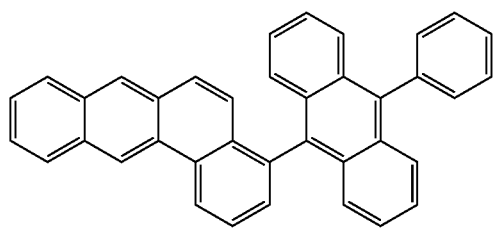 [SMILES: c1ccc(-c2c3ccccc3c(-c3cccc4c3ccc3cc5ccccc5cc34)c3ccccc23)cc1]
M1

TABLE 3-continued
Structural formulae of the materials used
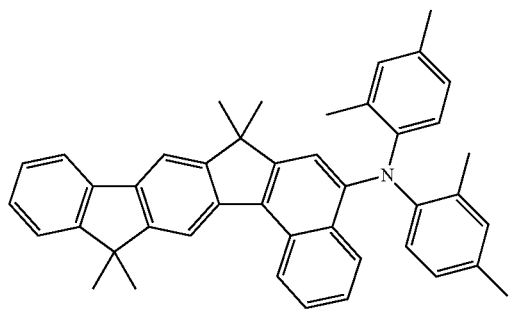 [SMILES: Cc1ccc(N(c2ccc(C)cc2C)c2cc3c(c4ccccc24)-c2cc4c(cc2C3(C)C)-c2ccccc2C4(C)C)c(C)c1]
D1
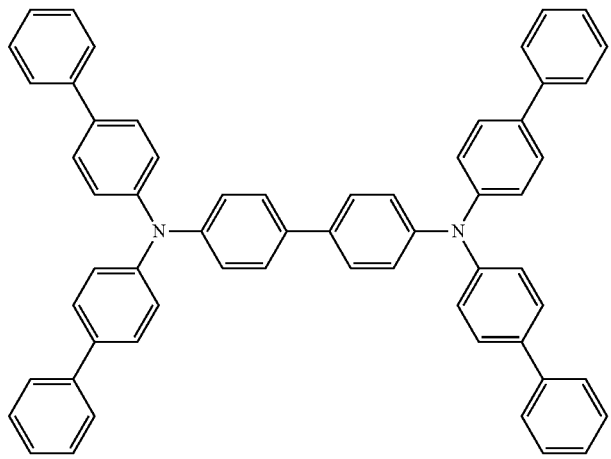 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
A1
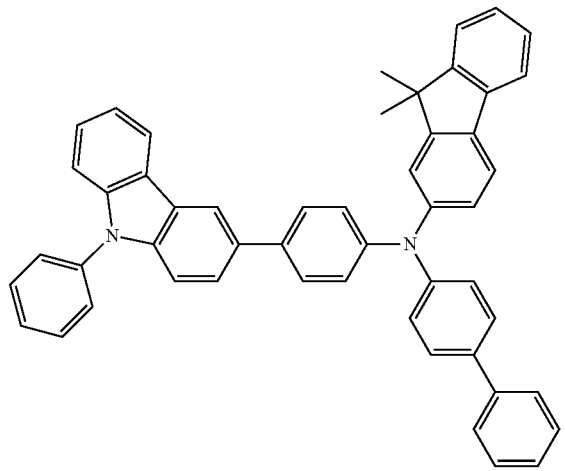 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
A2

TABLE 3-continued
Structural formulae of the materials used
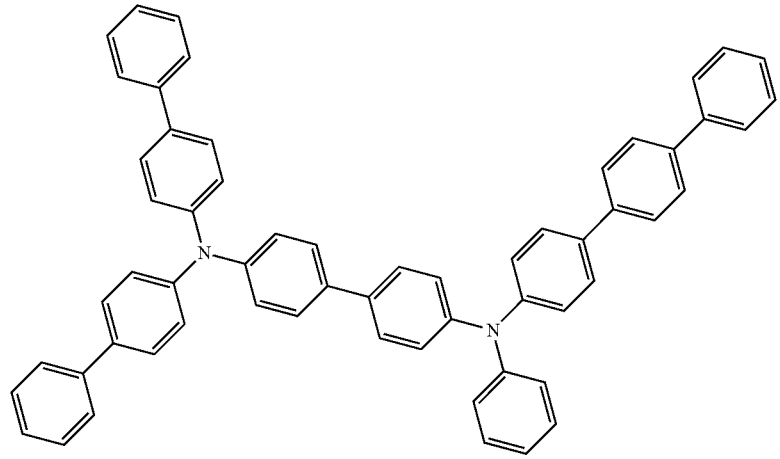 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
A3
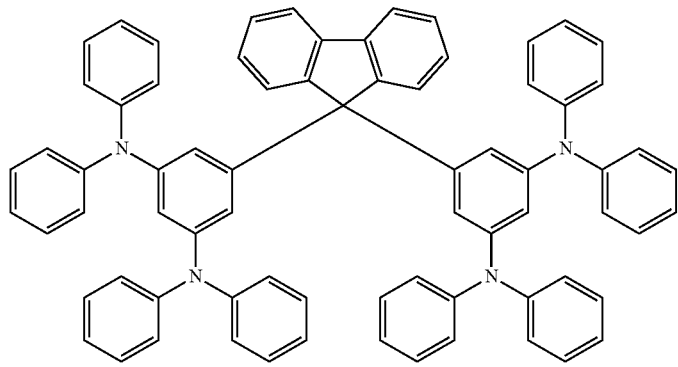 [SMILES: c1ccc(N(c2ccccc2)c2cc(N(c3ccccc3)c3ccccc3)cc(C3(c4cc(N(c5ccccc5)c5ccccc5)cc(N(c5ccccc5)c5ccccc5)c4)c4ccccc4-c4ccccc43)c2)cc1]
A4
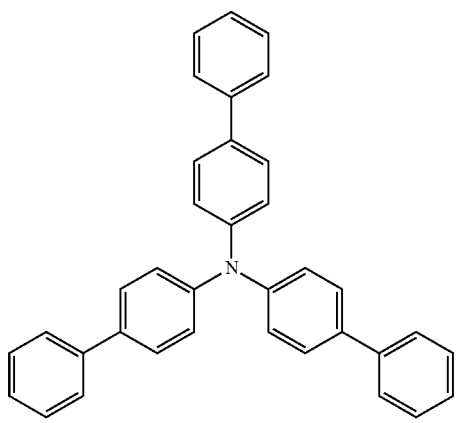 [SMILES: c1ccc(-c2ccc(N(c3ccc(-c4ccccc4)cc3)c3ccc(-c4ccccc4)cc3)cc2)cc1]
A5

TABLE 3-continued
Structural formulae of the materials used
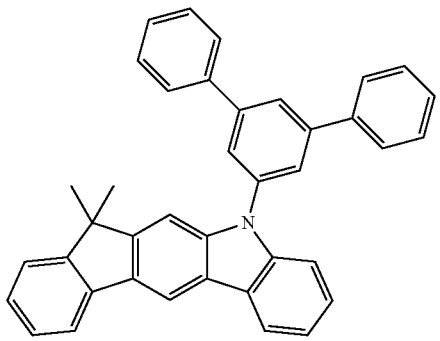 [SMILES: CC1(C)c2ccccc2-c2cc3c4ccccc4n(-c4cc(-c5ccccc5)cc(-c5ccccc5)c4)c3cc21]
C1
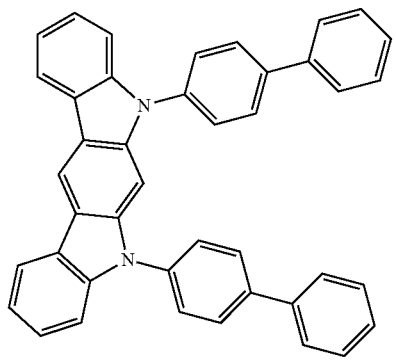 [SMILES: c1ccc(-c2ccc(-n3c4ccccc4c4cc5c6ccccc6n(-c6ccc(-c7ccccc7)cc6)c5cc43)cc2)cc1]
C2
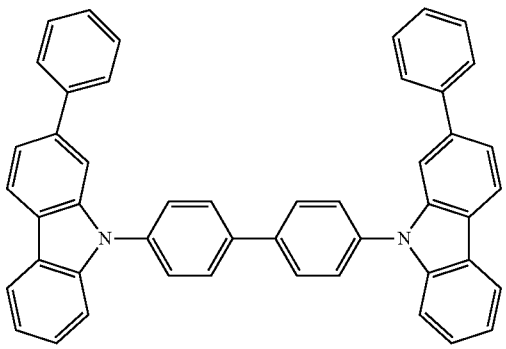 [SMILES: c1ccc(-c2ccc3c4ccccc4n(-c4ccc(-c5ccc(-n6c7ccccc7c7ccc(-c8ccccc8)cc76)cc5)cc4)c3c2)cc1]
C3
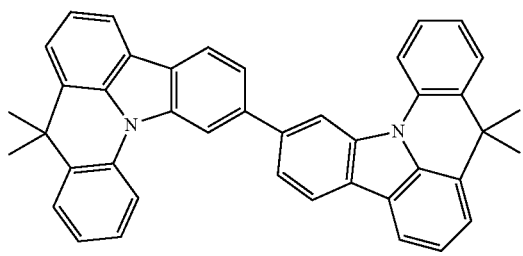
C4

TABLE 3-continued
Structural formulae of the materials used
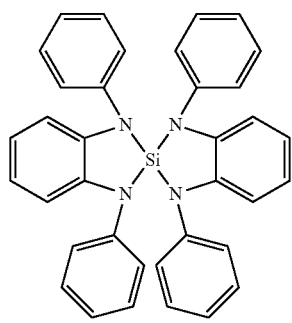 [SMILES: c1ccc(N2c3ccccc3N(c3ccccc3)[Si]23N(c2ccccc2)c2ccccc2N3c2ccccc2)cc1]
C6
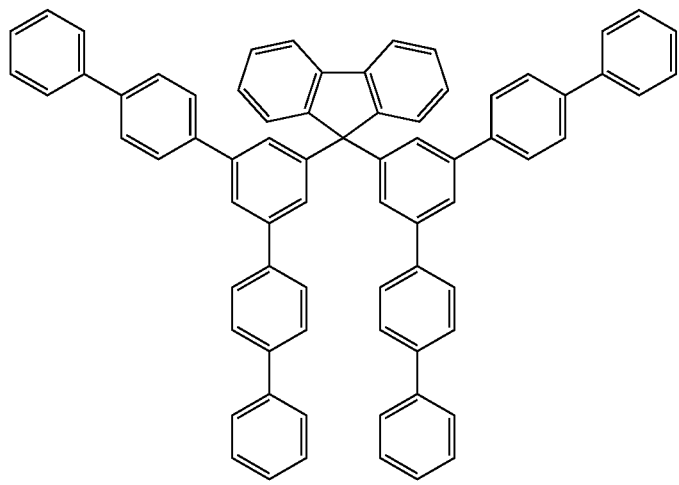 [SMILES: c1ccc(-c2ccc(-c3cc(-c4ccc(-c5ccccc5)cc4)cc(C4(c5cc(-c6ccc(-c7ccccc7)cc6)cc(-c6ccc(-c7ccccc7)cc6)c5)c5ccccc5-c5ccccc54)c3)cc2)cc1]
C7
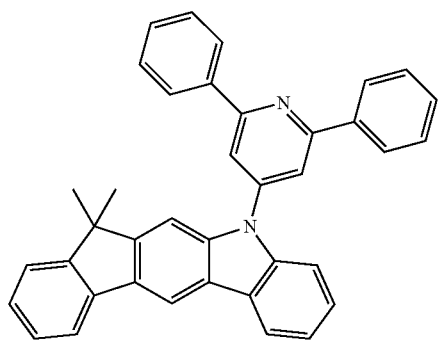 [SMILES: CC1(C)c2ccccc2-c2cc3c4ccccc4n(-c4cc(-c5ccccc5)nc(-c5ccccc5)c4)c3cc21]
C8

TABLE 3-continued
Structural formulae of the materials used
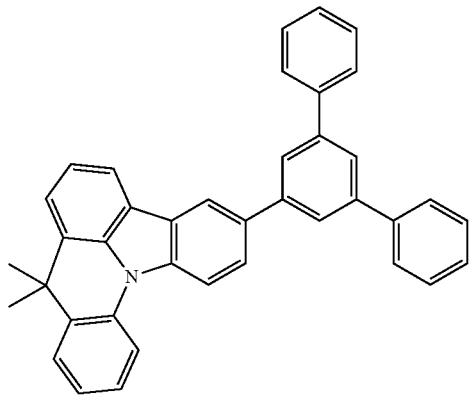 [SMILES: CC1(C)c2ccccc2-n2c3ccc(-c4cc(-c5ccccc5)cc(-c5ccccc5)c4)cc3c3cccc1c32]
C9
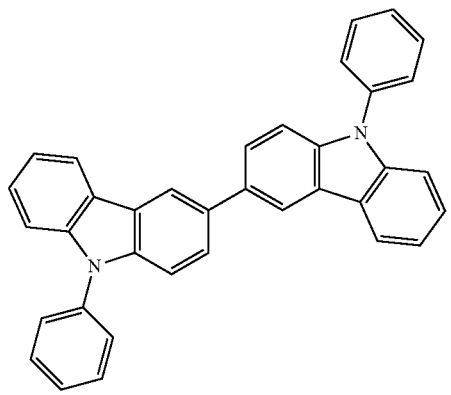 [SMILES: c1ccc(-n2c3ccccc3c3cc(-c4ccc5c(c4)c4ccccc4n5-c4ccccc4)ccc32)cc1]
C10
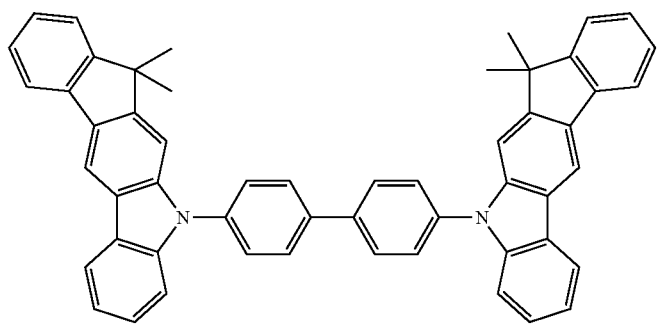 [SMILES: CC1(C)c2ccccc2-c2cc3c4ccccc4n(-c4ccc(-c5ccc(-n6c7ccccc7c7cc8c(cc76)C(C)(C)c6ccccc6-8)cc5)cc4)c3cc21]
C11

TABLE 3-continued

Structural formulae of the materials used

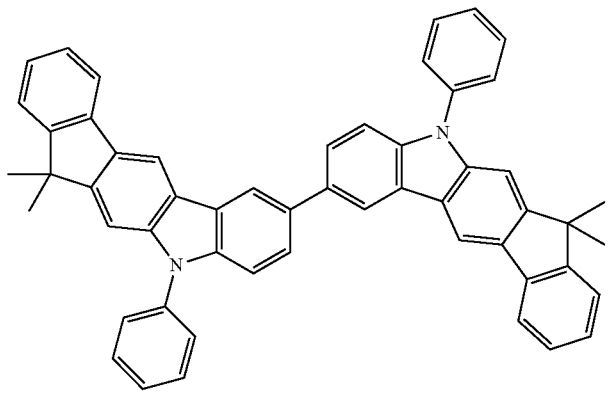

C12

TABLE 4

HOMO/LUMO values and triplet levels of the materials

| Material | HOMO (eV) | LUMO (eV) | TL (eV) | Method |
| --- | --- | --- | --- | --- |
| NPB | −5.16 | −2.28 | 2.45 | org. |
| A1 | −5.14 | −2.27 | 2.52 | org. |
| A2 | −5.12 | −2.20 | 2.52 | org. |
| A3 | −5.13 | −2.29 | 2.52 | org. |
| A4 | −5.17 | −2.16 | 2.80 | org. |
| A5 | −5.26 | −2.17 | 2.67 | org. |
| TEG1 | −5.21 | −2.26 | 2.68 | M-org. |
| TER1 | −5.30 | −2.68 | 2.23 | M-org |
| IC1 | −5.79 | −2.83 | 2.69 | org. |
| IC2 | −5.84 | −2.78 | 2.76 | org. |
| ST1 | −6.05 | −2.79 | 2.70 | org. |
| C1 | −5.54 | −2.27 | 2.82 | org. |
| C2 | −5.45 | −2.23 | 2.79 | org. |
| C3 | −5.68 | −2.39 | 2.84 | org. |
| C4 | −5.37 | −2.14 | 2.90 | org. |
| C6 | −5.43 | −1.81 | 3.25 | org. |
| C7 | −5.98 | −2.33 | 2.88 | org. |
| C8 | −5.71 | −2.42 | 2.81 | org. |
| C9 | −5.56 | −2.17 | 2.90 | org. |
| C10 | −5.44 | −2.06 | 2.94 | org. |
| C11 | −5.53 | −2.43 | 2.75 | org. |
| C12 | −5.37 | −2.11 | 2.79 | org. |

The invention claimed is:

1. An organic electroluminescent device comprising anode, cathode, at least one emitting layer and at least one hole-transport layer, which is arranged between the anode and the emitting layer, where the hole-transport layer comprises a mixture of a material HTM-1 and a material HTM-2, wherein the HOMO of HTM-1 is at least 0.15 eV higher than the HOMO of HTM-2; with the proviso that neither material HTM-1 nor material HTM-2 is a metal complex and that the materials in the emitting layer and in the hole-transport layer are not all identical, wherein HTM-1 is selected from compounds of the formulae (1) to (11) and (13) to (15),

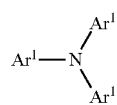

formula (1)

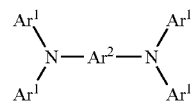

formula (2)

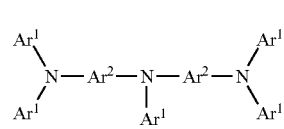

formula (3)

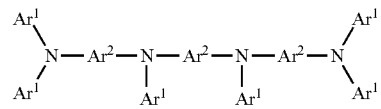

formula (4)

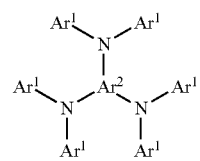

formula (5)

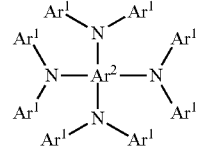

formula (6)

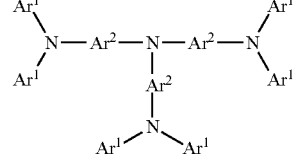

formula (7)

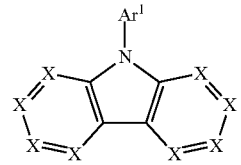

formula (8)

-continued

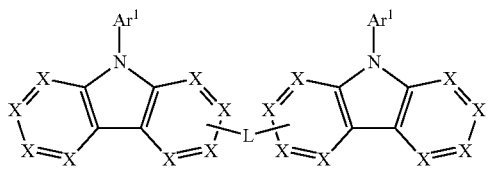
formula (9)

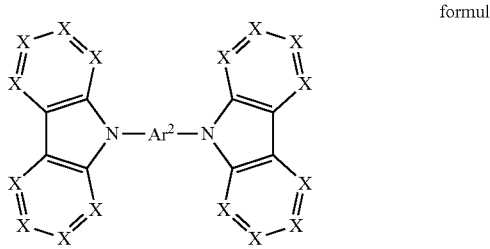
formula (10)

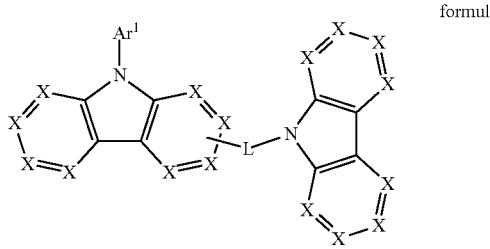
formula (11)

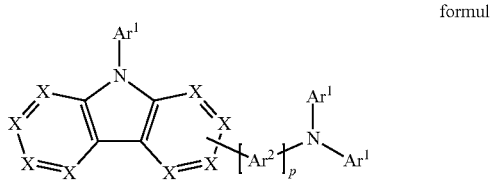
formula (13)

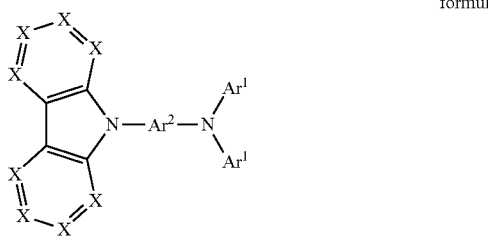
formula (14)

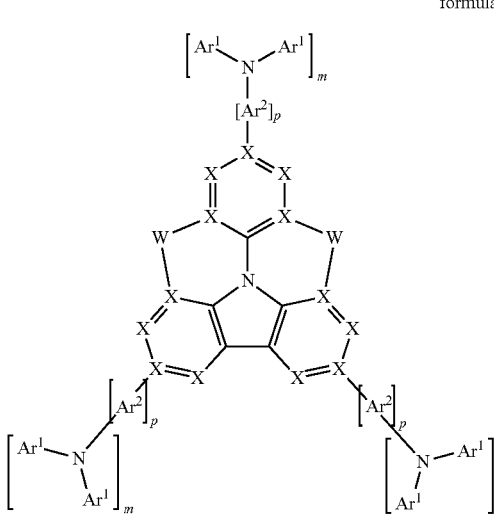
formula (15)

where the following applies to the symbols and indices used:

$Ar^1$ is on each occurrence, identically or differently, a monovalent aromatic or heteroaromatic ring system having 5 to 60 aromatic ring atoms, which is optionally substituted by one or more radicals $R^1$; two groups $Ar^1$ here which are bonded to the same nitrogen atom, and/or a group $Ar^2$ and a group $Ar^1$ which are bonded to the same nitrogen atom is optionally linked to one another by a single bond or a bridge selected from the group consisting of $B(R^1)$, $C(R^1)_2$, $Si(R^1)_2$, C=O, C=NR$^1$, C=C(R$^1$)$_2$, O, S, S=O, SO$_2$, N(R$^1$), P(R$^1$) and P(=O)R$^1$;

$Ar^2$ is on each occurrence, identically or differently, a divalent, trivalent or tetravalent aromatic or heteroaromatic ring system having 5 to 60 aromatic ring atoms, which is optionally substituted by one or more radicals $R^1$;

$R^1$ is on each occurrence, identically or differently, H, D, F, Cl, Br, I, CHO, C(=O)Ar$^3$, P(=O)(Ar$^3$)$_2$, S(=O)Ar$^3$, S(=O)$_2$Ar$^3$, CR$^2$=CR$^2$Ar$^3$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by D, F, Cl, Br, I, CN or NO$_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which is optionally substituted by one or more radicals $R^2$, or a combination of these systems; two or more adjacent substituents $R^1$ here may also form a mono- or polycyclic, aliphatic or aromatic ring system with one another;

$Ar^3$ is on each occurrence, identically or differently, an aromatic or heteroaromatic ring system having 5 to 40 aromatic ring atoms, which is optionally substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms is optionally replaced by D or F; two or more adjacent substituents $R^2$ here may also form a mono- or polycyclic, aliphatic or aromatic ring system with one another;

L is a single bond or a divalent group selected from an alkylene group having 1 to 10 C atoms or an alkenylene or alkynylene group having 2 to 10 C atoms, each of which is optionally substituted by one or more radicals $R^1$, an aromatic or heteroaromatic ring system having 5 to 30 aromatic ring atoms, which may in each case be substituted by one or more radicals $R^1$, C=O, O, S or NR$^1$ or a combination of 2, 3, 4 or 5 of these groups;

X is on each occurrence, identically or differently, CR$^1$ or N, with the proviso that a maximum of two symbols X per ring stand for N and that X stands for C if a group L is bonded to this group X;

two adjacent groups X here may also be replaced by a group of the following formula (12):

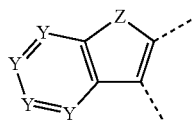

formula (12)

the dashed bonds here indicate the linking of this unit to the carbazole derivative;

Y is on each occurrence, identically or differently, $CR^1$ or N, with the proviso that a maximum of two symbols Y per ring stand for N;

Z is selected on each occurrence, identically or differently, from the group consisting of $C(R^1)_2$, $N(R^1)$, $N(Ar^1)$, O, S, $B(R^1)$, $Si(R^1)_2$, C=O, C=$NR^1$, C=$C(R^1)_2$, S=O, $SO_2$, $CR^1$—$CR^1$, $P(R^1)$ and P(=O)$R^1$;

W is, identically or differently on each occurrence, a single bond, $C(R^1)_2$, $NR^1$, O or S, where a maximum of one group W stands for a single bond; it is furthermore possible for a group W not to be present;

n is, identically or differently on each occurrence, 0 or 1, where at least one index n stands for 1;

m is, identically or differently on each occurrence, 0 or 1, where at least one index m stands for 1;

p is, identically or differently on each occurrence, 0, 1 or 2;

with the proviso that X in formula (15) stands for C if a group $N(Ar^1)_2$, $Ar^2$ or a group W is bonded to this group X, and wherein HTM-2 is selected from the group consisting of carbazole derivatives, carbazole derivatives containing condensed-on groups, compounds of the formula (15) in which all indices m are 0, diazaborole derivatives, and aromatic hydrocarbons optionally substituted by non-aromatic groups.

2. The organic electroluminescent device according to claim 1, wherein the HOMO of HTM-1 is at least 0.25 eV higher than the HOMO of HTM-2.

3. The organic electroluminescent device according to claim 1, wherein the HOMO of HTM-1 is at least 0.3 eV higher than the HOMO of HTM-2.

4. The organic electroluminescent device according to claim 1, wherein the hole-transport layer comprising HTM-1 and HTM-2 consists only of the two materials HTM-1 and HTM-2.

5. The organic electroluminescent device according to claim 1, wherein the mixing ratio of HTM-1 to HTM-2 is between 95:5 and 5:95, in each case based on the volume.

6. The organic electroluminescent device according to claim 1, wherein the mixing ratio of HTM-1 to HTM-2 is between 85:15 and 40:60.

7. The organic electroluminescent device according to claim 1, wherein the hole-transport layer comprising HTM-1 and HTM-2 is directly adjacent to the emitting layer or in that the hole-transport layer comprising HTM-1 and HTM-2 is arranged between two further hole-transport layers.

8. The organic electroluminescent device according to claim 1, wherein the layer thickness of the hole-transport layer comprising HTM-1 and HTM-2 is between 5 and 300 nm.

9. The organic electroluminescent device according to claim 1, wherein the layer thickness of the hole-transport layer comprising HTM-1 and HTM-2 is between 10 and 150 nm.

10. The organic electroluminescent device according to claim 1, wherein the LUMO of HTM-2 is higher than the HOMO of HTM-1, and is at least 0.1 eV higher.

11. The organic electroluminescent device according to claim 1, wherein the LUMO both of HTM-1 and also of HTM-2 are at least 0.2 eV higher than the LUMO of the matrix in the emitting layer, or, in the case of the use of a plurality of matrix materials, than the LUMO of the matrix material having the lowest LUMO.

12. The organic electroluminescent device according to claim 1, wherein the triplet level both of HTM-1 and also of HTM-2 is at most 0.3 eV lower than the triplet level of the emitter in the emitting layer.

13. The organic electroluminescent device according to claim 1, wherein the HOMO of HTM-1 is >−5.4 eV and in that the HOMO of HTM-1 is <−4.8 eV.

14. The organic electroluminescent device according to claim 1, wherein the groups $Ar^1$ are phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 1- or 2-(4-methylnaphthyl), 1- or 2-(4-phenylnaphthyl), 1- or 2-(4-naphthylnaphthyl), 1-, 2- or 3-(4-naphthylphenyl), indenofluorene, indenocarbazole, indolocarbazole, 2- or 3-thienyl or 2-, 3- or 4-pyridyl or combinations of one or more of these groups, where these groups may each also be substituted by one or more radicals $R^1$, and in that the groups $Ar^2$ are o-, m- or p-phenylene, 1,4- or 2,6-naphthylene, 2,2'-, 3,3'- or 4,4'-biphenyl, 2,2"-, 3,3"- or 4,4"-o-terphenyl, 2,2"-, 3,3"- or 4,4"-m-terphenyl, 2,2"-, 3,3"- or 4,4"-p-terphenyl, p-, m,p-, o,p-, m,m-, o,m- or o,o-quaterphenyl, quinquephenyl, sexiphenyl, 2,7-fluorenyl, 2,7- or 2,2'-spiro-9,9'-bifluorenyl or 2,7-(9,10-dihydro)phenanthrenyl, each of which is optionally substituted by one or more radicals $R^1$.

15. The organic electroluminescent device according to claim 1, wherein the emitting layer comprises a phosphorescent compound of one of the formulae (16) to (19),

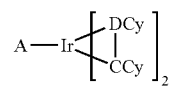

formula (16)

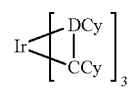

formula (17)

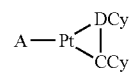

formula (18)

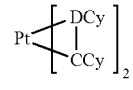

formula (19)

where $R^1$ has the meaning given in claim 1, and the following applies to the other symbols used:

DCy is, identically or differently on each occurrence, a cyclic group which contains at least one donor atom; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate-chelating ligand;

or in that the in that the emitting layer comprises a fluorescent compound selected from the group consisting of monostyrylamines, distyrylamines, tristyrylamines, tetrastyrylamines, styrylphosphines, styryl ethers, arylamines and condensed hydrocarbons.

16. The organic electroluminescent device according to claim 15, wherein

DCy is, identically or differently on each occurrence, a cyclic group which contains at least one donor atom wherein the electron donor is nitrogen, carbon in the form of a carbene or phosphorus, via which the cyclic group is bonded to the metal, and which may in turn carry one or more substituents $R^1$; the groups DCy and CCy are connected to one another via a covalent bond; and A is, identically or differently on each occurrence, a diketonate ligand.

17. A process for the production of the organic electroluminescent device according to claim 1, which comprises coating one or more layers by means of a sublimation process and/or in that one or more layers are coated by means of the OVPD (organic vapour phase deposition) process or with the aid of carrier-gas sublimation and/or in that one or more layers are produced from solution or by means of a printing process.

18. The organic electroluminescent device according to claim 1, wherein the emitting layer comprises, as matrix material for a phosphorescent emitter, a compound which is selected from the group consisting of aromatic ketones, aromatic phosphine oxides, aromatic sulfoxides or sulfones, triarylamines, carbazole derivatives, indolocarbazole derivatives, azacarbazole derivatives, bipolar matrix materials, silanes, azaboroles, boronic esters, triazine derivatives, zinc complexes, diazasilole or tetraazasilole derivatives, diazaphosphole derivatives, indenocarbazole derivatives, bridged triarylamine derivatives and benzofuranyldibenzofuran derivatives, or wherein the emitting layer comprises, as matrix material for a fluorescent emitter, a compound which is selected from the group consisting of oligoarylenes, in particular oligoarylenes containing condensed aromatic groups, oligoarylenevinylenes polypodal metal complexes, hole-conducting compounds, electron-conducting compounds, boronic acid derivatives, anthracene derivatives, benzanthracene derivatives and benzophenanthrene derivatives.

19. The organic electroluminescent device according to claim 1, wherein the HOMO of HTM-1 is >−5.2 eV, and in that the HOMO of HTM-1 is <−4.8 eV and wherein the triplet level both of HTM-1 and also of HTM-2 is at most 0.1 eV lower than the triplet level of the emitter in the emitting layer.

* * * * *